(12) United States Patent
Tsai et al.

(10) Patent No.: US 8,759,865 B2
(45) Date of Patent: Jun. 24, 2014

(54) LIGHT EMITTING DIODE CHIP, LIGHT EMITTING DIODE PACKAGE STRUCTURE, AND METHOD FOR FORMING THE SAME

(75) Inventors: Yao-Jun Tsai, Zhongli (TW); Chen-Peng Hsu, Hsinchu (TW); Kuo-Feng Lin, Sanchong (TW); Hsun-Chih Liu, Shulin (TW); Ji-Feng Chen, Taipei (TW); Hung-Lieh Hu, Hsinchu (TW); Chien-Jen Sun, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/806,703

(22) PCT Filed: Aug. 3, 2011

(86) PCT No.: PCT/CN2011/077974
§ 371 (c)(1),
(2), (4) Date: Dec. 21, 2012

(87) PCT Pub. No.: WO2012/016525
PCT Pub. Date: Feb. 9, 2012

(65) Prior Publication Data
US 2013/0087823 A1 Apr. 11, 2013

(30) Foreign Application Priority Data
Aug. 3, 2010 (WO) .............. PCT/CN2010/075684

(51) Int. Cl.
*H01L 33/20* (2010.01)
*H01L 33/38* (2010.01)
*H01L 33/48* (2010.01)
*H01L 33/10* (2010.01)
*H01L 33/62* (2010.01)
*H01L 33/00* (2010.01)

(52) U.S. Cl.
CPC .............. *H01L 33/62* (2013.01); *H01L 33/20* (2013.01); *H01L 33/0079* (2013.01); *H01L 33/38* (2013.01); *H01L 33/0095* (2013.01); *H01L 33/48* (2013.01); *H01L 2224/16225* (2013.01); *H01L 33/10* (2013.01)
USPC ........................................................ 257/98

(58) Field of Classification Search
USPC ............................................... 257/79, 88, 98
See application file for complete search history.

(56) References Cited

U.S. PATENT DOCUMENTS

| 5,003,357 A | 3/1991 | Kim et al. |
|---|---|---|
| 7,018,859 B2 | 3/2006 | Liao et al. |

(Continued)

FOREIGN PATENT DOCUMENTS

| CN | 1612367 A | 5/2005 |
|---|---|---|
| CN | 101222014 A | 7/2008 |

(Continued)

OTHER PUBLICATIONS

Taiwanese Notice of Allowance, dated Nov. 28, 2013, for Taiwanese Application No. 099147230.

(Continued)

*Primary Examiner* — Thao P Le
(74) *Attorney, Agent, or Firm* — Birch, Stewart, Kolasch & Birch, LLP

(57) ABSTRACT

A light emitting diode chip, a light emitting diode package structure and a method for forming the same are provided. The light emitting diode chip includes a bonding layer, which has a plurality of voids, or a minimum horizontal distance between a surrounding boundary of the light emitting diode chip and the bonding layer is larger than 0. The light emitting diode chip, the light emitting diode package structure and the method may improve the product yields and enhance the light emitting efficiency.

45 Claims, 101 Drawing Sheets

(56) References Cited

U.S. PATENT DOCUMENTS

| | | |
|---|---|---|
| 7,256,483 B2 | 8/2007 | Epler et al. |
| 7,274,040 B2 * | 9/2007 | Sun .................................. 257/79 |
| 7,329,905 B2 * | 2/2008 | Ibbetson et al. ................ 257/98 |
| 7,432,119 B2 | 10/2008 | Doan |
| 7,518,158 B2 | 4/2009 | Keller et al. |
| 7,521,724 B2 | 4/2009 | Chen et al. |
| 7,582,496 B2 | 9/2009 | Lee et al. |
| 7,586,200 B2 | 9/2009 | Wang |
| 7,598,530 B2 | 10/2009 | Chu |
| 7,638,808 B2 | 12/2009 | Owen et al. |
| 7,642,734 B2 | 1/2010 | De Anna |
| 7,728,325 B2 * | 6/2010 | Jung et al. ........................ 257/40 |
| 7,902,761 B2 | 3/2011 | Ang et al. |
| 7,989,812 B2 * | 8/2011 | Yamazaki et al. ............... 257/72 |
| 2002/0070386 A1 | 6/2002 | Krames et al. |
| 2004/0089861 A1 | 5/2004 | Chen et al. |
| 2005/0087755 A1 | 4/2005 | Kim et al. |
| 2006/0192223 A1 | 8/2006 | Lee et al. |
| 2006/0246687 A1 | 11/2006 | Kaiser et al. |
| 2007/0045648 A1 | 3/2007 | Lin |
| 2007/0181887 A1 * | 8/2007 | Kijima et al. .................... 257/79 |
| 2007/0228397 A1 | 10/2007 | Taninaka et al. |
| 2008/0035948 A1 | 2/2008 | Shin et al. |
| 2009/0001401 A1 | 1/2009 | Park et al. |
| 2009/0108281 A1 | 4/2009 | Keller et al. |
| 2009/0215210 A1 | 8/2009 | Fan et al. |
| 2009/0278139 A1 | 11/2009 | Fjelstad |
| 2011/0248239 A1 | 10/2011 | Murai |
| 2012/0034714 A1 | 2/2012 | Tsai et al. |

FOREIGN PATENT DOCUMENTS

| | | |
|---|---|---|
| CN | 101237015 A | 8/2008 |
| CN | 101388426 A | 3/2009 |
| EP | 0 797 258 A2 | 9/1997 |
| JP | 2004-165590 A | 6/2004 |
| JP | 2006-332383 A | 12/2006 |
| JP | 2007-273898 A | 10/2007 |
| JP | 2008-177563 A | 7/2008 |
| JP | 2010-147446 A | 7/2010 |
| TW | 200408142 A | 5/2004 |
| TW | I255055 B | 5/2006 |
| TW | I282635 B | 6/2007 |
| TW | 200725929 A | 7/2007 |
| TW | 200924221 A | 6/2009 |
| TW | I326500 B | 6/2010 |
| WO | WO 2005/013382 A1 | 2/2005 |

OTHER PUBLICATIONS

TW Office Action dated Oct. 23, 2013; pp. 1-12.

* cited by examiner

LIGHT EMITTING DIODE CHIP, LIGHT EMITTING DIODE PACKAGE STRUCTURE, AND METHOD FOR FORMING THE SAME

CROSS REFERENCE TO RELATED APPLICATIONS

This application is based upon and claims the benefit of priority from PCT/CN2010/075684, filed on Aug. 3, 2010, the entire contents of which are incorporated herein by reference.

TECHNICAL FIELD

The present disclosure relates to a diode chip and package structure employing the same, and in particular relates to a light emitting diode chip (LED) and LED package structure.

BACKGROUND

Conventional process for fabricating a thin film light emitting diode (TF-LED) roughly contains two phases. The first phase is to grow epi layers on a growth substrate and thus forming the epi wafer. The growth substrate can either be made of sapphire or silicon carbide. The number of epi layer can be designed according to the need. The second phase is to bond the epi wafer to a support substrate (such as a sub-mount or a packaging substrate), to remove the growth substrate, and to perform further semiconductor processes such as etching, photolithographing, development and phosphor coating. During the fabricating process of TF-LED, it's difficult to measure the photoelectric properties, such as the characteristics of current-voltage or spectrum of the epi wafer. Accordingly, said photoelectric properties of TF-LED are inspected and measured after the completion of two-phase process of TF-LED.

In the above process, particularly in the second phase of making a TF-LED, the semiconductor process is performed onto the entire epi-layer bonded with the support substrate. The photoelectric properties interim are hardly to be inspected, leading to a poor yield rate of TF-LED to 50% or even worse. More specifically, only 50% or fewer chips, though bonded with the support substrate, could meet the predetermined photoelectric properties. This means that all the chips, whether they meet the pre-determined photoelectric properties or not, have to undertake the subsequent fabrication process. For the chips that fail to meet the required photoelectric properties, the bonding with the carrier substrate appears to be unnecessary and a waste. Noted that LEDs to meet the required bins standard is often the challenge to most of the manufacturers when competing among one another. Therefore, promoting the yield rate of LEDs and cost-down is always the important issue to each LED maker.

Light emitting diodes (LEDs) have high brightness, low volume, low power consumption and long operating lifespan and as such, are used in a variety of display products. The luminescent principle of LEDs is as follows. A voltage is applied to a diode to drive an electron and a hole combination. The combination releases light from the diode. A conventional thin GaN LED product is manufactured by bonding an epi wafer to a carrier substrate (such as a sub-mount substrate or a package substrate)

FIG. 1 is a sectional view illustrating a conventional semi-product LED epi wafer mounted on a carrier substrate 212. Referring to FIG. 1, the LED structure 210 includes a carrier substrate 212 and an epi wafer 214 mounted through a connecting layer 216 of the carrier substrate 212. The epi wafer 214 includes a growth substrate 218, and semiconductor layers 220 sequentially stacked on the growth substrate 218.

There are several problems associated with the conventional semiproduct LED package described above. First, the thickness of the connecting layer 216 between the carrier substrate 212 and the epi wafer 214 must be within a specific range, since a connecting layer 216 that is too thin, results in poor electric connection and adhesion to the carrier substrate 212. Further, in order for bonding, heat and pressure are applied to bond the epi wafer 214 to the carrier substrate 212. At this time, if the bonding material of a connecting layer 216 that is too thick, the heat applied would make the connecting layer 216 to protrude laterally and may cause a short circuit 223 of the semiconductor layers 220, as shown in FIG. 2. Such a short circuit 223, may cause the LED chip to lose its functional abilities. Second, due to the high temperature required for bonding, the semiprodcut LED epi wafer 210 suffers from residual stress after cooling. In the subsequent process of laser lift-off (LLO), dimensional restrictions of laser beams will make the semiconductor layers 220 to crack may occur after removal of the whole growth substrate 218. Third, since a support substrate (not shown) is preferably waived, the epi wafer is directly bonded to preformed circuits or traces in carrier substrate 212 for electric connection. The growth substrate 218 with semiconductor layers 220 blocks the sight of these traces or circuit. Therefore, misalignment occurs between the epi wafer 214 and the carrier substrate 212.

In other aspect, conventional method for manufacturing a thin film light emitting diode (LED) would bond a complete wafer, which will be diced to form a plurality of LEDs afterwards, on a substrate by heating the substrate and the wafer thereon. If the wafer has a non-uniform surface, the wafer is prone to fracture on the process of bonding. Besides, the conventional bonding temperature is about 400° C. and is regarded as a high temperature that would influence the quality of the wafer. Therefore, after the substrate and the wafer are bonded together and cooled down to a room temperature, a non-uniform stress distribution would occur to the wafer, weakening the structure of the wafer, and further affecting the sequential manufacturing process of LEDs.

At present, a conventional thin film LED normally has the problem of limited light emitting efficiency due to the deposition of metal electrode. For example, the metal electrode is directly disposed on the light emitting surface of the thin film LED. Thus, for a 12-mil LED, one-third light emitting area is usually lost due to the metal electrode. And for a 40-mil LED, one-ninth light emitting area is wasted. Besides, the electric current on the connection portion between the LED and the metal electrode is normally the highest, and is likely to cause energy loss.

The quality of light emitting device, such as the light-emitting diode (LED), is also very dependent on the luminance uniformity. After the LED dies have been fabricated in accomplishment, many LED dies are attached on a carrier or substrate for packaging. In packaging process, the florescent material or generally called wavelength conversion material is coated over the LED dies to produce the light, such as white light.

In the case of massive production, the process of die attachment process usually cannot be ideally controlled. As a result, the LED dies are usually not aligned to the ideal position. For example, some LED dies may be twisted by a certain angle and the location may be shifted from a designed location. Further, a mask layer for filling the florescent material on the LED die may also have fabrication errors and/or be in missalignment, for example. As a result, the florescent material would be non-uniformly coated over the LED dies, causing difference between the LED dies resulting in different luminosity in use. In addition, each LED die itself may further have non-uniform luminance in different illuminating angles. When the LED dies are composed into a light source, the luminance of the light source would be non-uniform as well. How to improve the uniformity of luminance of LED units in fabrication is an issue to be further developed.

Therefore, it is desirable to devise a novel light emitting diode package that improves upon the aforementioned problems.

SUMMARY

The disclosure provides a light emitting diode chip, including: a growth substrate having a first boundary; a stack structure depositing on the growth substrate, wherein the stack structure comprises a first semiconductor layer, a light emitting layer, and a second semiconductor layer formed sequentially thereon, and the stack structure further having has a second boundary, wherein the light emitting diode chip is characterized by a connecting layer disposed on a top surface of the second semiconductor layer, and a ratio of area between the connecting layer and a top surface of the second semiconductor layer is between 20%~99% an interface between the connecting layer and the second semiconductor layer occupies 20-99% of the top surface of the second semiconductor layer, and a minimum horizontal distance between the first boundary and the second boundary is of more than about 3 μm to prevent cracking when stripping away the growth substrate from the stack structure.

Further, the disclosure also provides a light emitting diode package structure, including: a stack structure having a first semiconductor layer, a light emitting layer, and a second semiconductor layer, wherein the light emitting layer is sandwiched between the first semiconductor layer and the second semiconductor layer; a connecting layer deposed directly on the second semiconductor layer, wherein a first surface of the connecting layer directly contacts to a second surface of the second semiconductor layer; a carrier substrate bonded with the stack structure via the connecting layer, wherein the area of the first surface of the connecting layer is smaller than the area of the second surface of the second semiconductor layer.

Moreover, according to an embodiment of the disclosure, the light emitting diode structure can include a carrier substrate having a first surface and a second surface opposite the first surface; a stack structure comprising a first semiconductor layer, an light emitting layer, and a second semiconductor layer disposed on the first surface; a first electrode disposed apart from the stack structure on the first surface; a passivation layer covering side walls of the light emitting layer; and an electrically conductive thin film layer for connecting the first electrode to the stack structure, wherein the electrically conductive thin film layer covers the stacked structure.

According to another embodiment of the disclosure, the light emitting diode structure can include a carrier substrate having a first electrical trace and a second electrical trace formed thereon, a stack structure bonded on the carrier substrate, wherein the stack structure, with a thickness of less than 20 μm, comprises a first semiconductor layer, a light emitting layer, and a second semiconductor layer, and the stack structure is further electrically connected with the first electrical trace and having a thickness that is less than 20 μm; a first stud bump having a thickness of more than 15 μm and being electrically connected to the second electrical trace; an encapsulant being deposed on the carrier substrate, wherein the encapsulant encircles the stack structure and the stud bump, leaving a first opening to expose a top surface of the stack structure and a second opening to expose a top surface of the stud bump; a wavelength conversion layer filling in the first opening and covering the top surface of the stack; wherein a top surface of the wavelength conversion layer is substantially parallel to the top surface of the stack structure.

The disclosure also provides a method of forming a light emitting diode structure, including the steps of: forming a first electrode on a carrier substrate having a first surface and a second surface; providing a stack structure and bonding the stack structure on the first surface of the carrier substrate, wherein the stack structure is freestood from the first electrode; forming a passivation layer on the first electrode, the stack structure and a space between the first electrode and the stack structure; removing a part of the passivation layer over the first electrode and a part of the passivation layer over the stack structure to expose the first electrode and the stack structure; forming a electrically conductive thin film layer on the first electrode and the stack structure for electrically connecting the first electrode and the stack structure, and dicing the carrier substrate to form a light emitting diode structure.

The method for fabricating a light emitting diode structure can also include providing a light emitting diode chip, wherein the light emitting diode comprises a stacked layer formed on a growth substrate, and a connecting layer formed on the stack structure; bonding the light emitting diode on a carrier substrate via the connecting layer; forming a surrounding layer to encircle the light emitting diode; removing the growth substrate; and removing the surrounding layer after the removing of the growth substrate.

Further, the method for fabricating a light emitting diode structure can include providing a light emitting diode chip comprising a stack structure formed on a growth substrate; bonding a light emitting diode chip on a carrier substrate; forming a layer to cover a top surface of the growth substrate; forming an encapsulant to encircle side walls of the stack structure and the growth substrate; removing the layer to form a cavity; and filling a wavelength conversion layer into the cavity.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION

In order to solve the problems of prior arts, the disclosure provides a light emitting diode chip, and a light emitting diode package structure employing the same, having increased yield, reduced production costs, and increased throughput.

Figure 1:
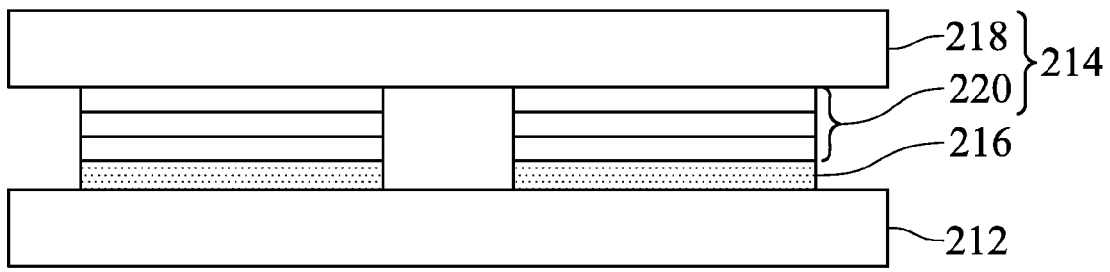
FIG. 1 is a cross-section of a conventional light emitting diode package structure.
Figure 2:
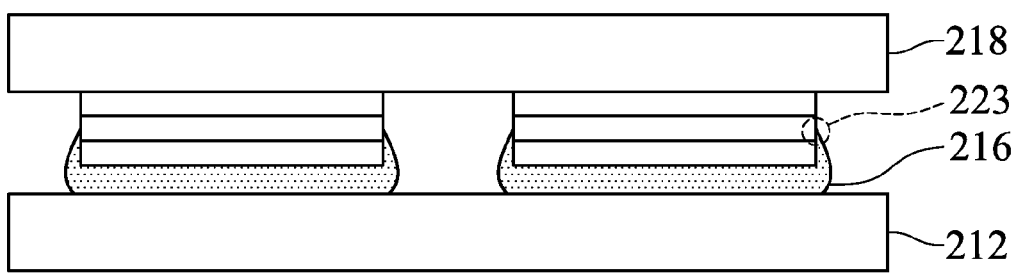
FIG. 2 is a cross-section of a conventional light emitting diode package structure with an electric short circuit.
Figure 3:
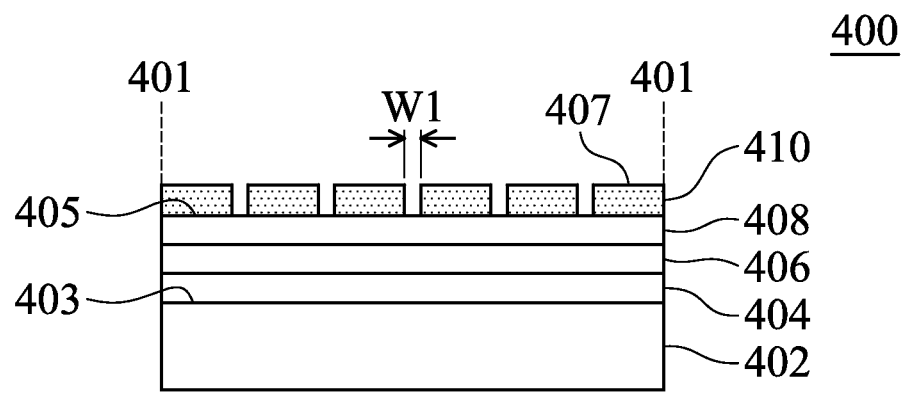
FIGS. 3-17 are cross-sections of light emitting diode chips according to embodiments of the disclosure.
Figure 4:
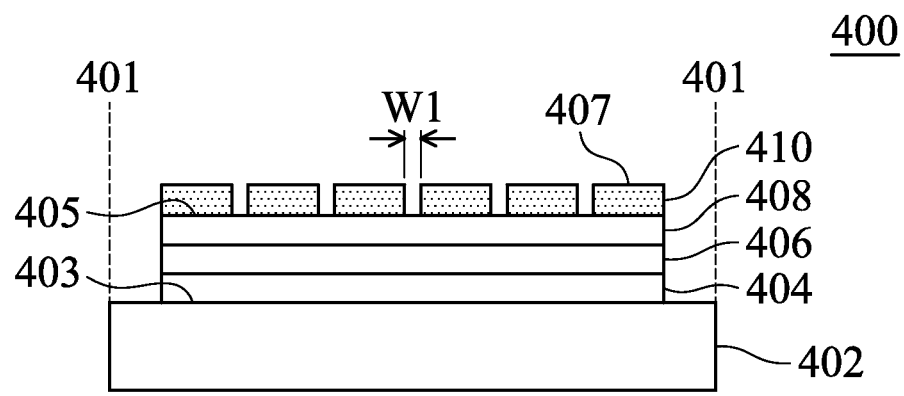

According to an embodiment of the disclosure, the light emitting diode chip 400 can have a structure as shown in FIGS. 3 and 4. The light emitting diode chip 400 includes a growth substrate 402 with a surrounding boundary 401. The growth substrate 402 can be a substrate including a complementary metal oxide semiconductor (CMOS) circuit, isolation structure, diode, or capacitor. The accompanying drawings show the substrate 402 in a plain rectangle in order to simplify the illustration. A first semiconductor layer 404 is disposed on a top surface 403 of the substrate 402. A light emitting layer 406 is disposed on the first semiconductor layer 404, and a second semiconductor layer 408 is disposed on the light emitting layer 406. It should be noted that the light emitting diode chip 400 includes a connecting layer 410 disposed on the top surface 405 of the second semiconductor layer 408. Herein, the connecting layer 410 can have an island structure. Namely, the connecting layer 410 includes a plurality of island-shaped connects, wherein any two adjacent island-shaped connects can have a minimum horizontal distant W1 equal to or larger than 3 μm, preferably larger than about 10 μm.

Further, the ratio between the area of a top surface 407 of the connecting layer 410 and the area of a top surface 403 of the growth substrate 402 is equal to or less than 99%. Alternatively, the ratio between the area of a top surface 407 of the connecting layer 410 and the area of a top surface 405 of the second semiconductor layer 408 is equal to or less than 99%.

After bonding with a support substrate, it does not matter whether the connecting layer has an island structure or a shrunken structure, the contacting area between a bonding layer (including the connecting layer) and the second semiconductor layer 408 is equal to or of less than the area of a bottom surface of the second semiconductor layer 408, wherein the bottom surface of the second semiconductor layer 408 directly contacts the bonding layer. Namely, the ratio between the contacting area and the area of a bottom surface of the second semiconductor layer 408 is equal to or less than 99%.

The growth substrate 402 can be any suitable substrates for growing epitaxial layers thereon, such as an aluminum oxide substrate (sapphire substrate), a silicon Carbide substrate, or a gallium arsenide substrate. The growth substrate 402 can have a thickness of more than 150 μm. If the growth substrate 402 is a silicon Carbide substrate or a gallium arsenide substrate, the thickness of the substrate can be more than 600 μm. The light emitting layer 406 can be a semiconductor material layer and have a multiple quantum well structure, selected from a group of group III-V semiconductor compounds, group II-VI semiconductor compounds, group IV semiconductor compounds, group IV-IV semiconductor compounds, and combinations thereof, such as AlN, GaN, AlGaN, InGaN, AlInGaN, GaP, GaAsP, GaInP, AlGaInP, or AlGaAs.

The first semiconductor layer 404 and the second semiconductor layer 408 can be an N-type semiconductor layer and a P-type semiconductor layer, respectively, or alternatively a P-type semiconductor layer and an N-type semiconductor layer, respectively. The first semiconductor layer 404 and the second semiconductor layer 408 can be group III-V semiconductor compounds, group II-VI semiconductor compounds, group IV semiconductor compounds, group IV-IV semiconductor compounds, and combinations thereof. For example, if the first semiconductor layer 404 is an N-type GaN semiconductor layer, the second semiconductor layer 408 can be a P-type GaN semiconductor layer and the light emitting layer would be a GaN semiconductor layer. Further, if the first semiconductor layer 404 is a P-type GaN semiconductor layer, the second semiconductor layer 408 can be a P-type GaN semiconductor layer.

The connecting layers 410 can be a conductive material (such as: Pd, Pt, Ni, Au, Ag, or combinations thereof), an Ohmic-contact material, a diffusion barrier layer, a metal bonding layer, a reflective layer, or combinations thereof. The connecting layer 410 can have a thickness between 0.5~10 μm. For Example, the thickness of the connecting layer 410 can be equal to or larger than 1 μm. Generally, the thickness of the connecting layer 410 can be of more than 1 μm, thereby increasing the process tolerance and reliability for when a subsequent laser lift-off process is performed.

Figure 5:
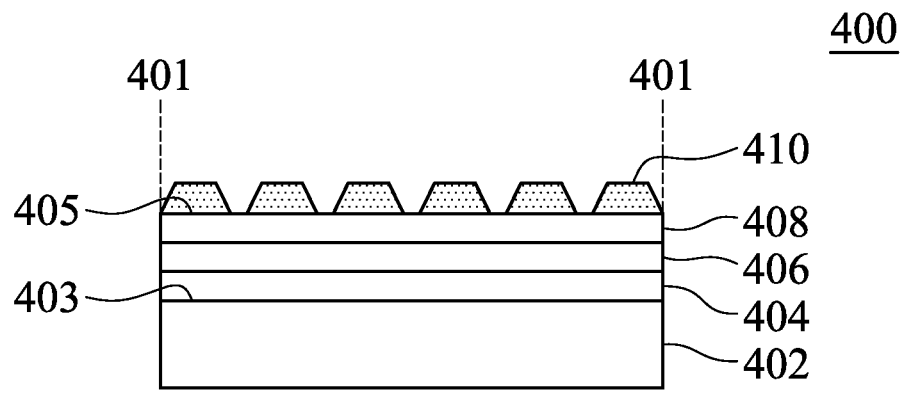
Figure 6:
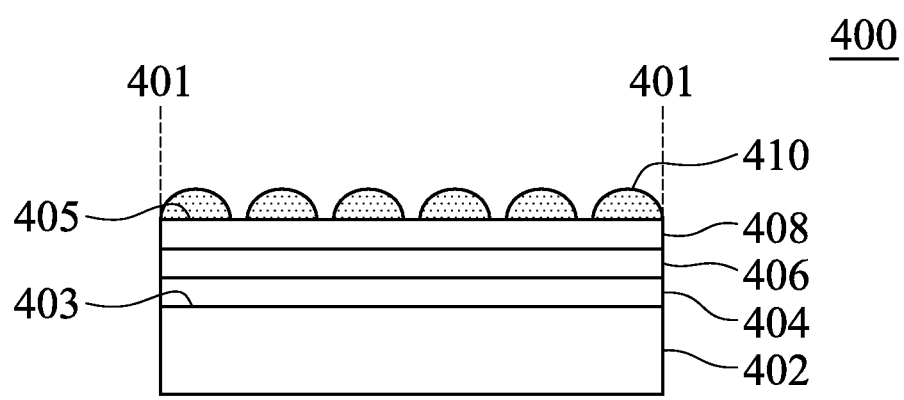

The connecting layer 410 can have an island structure (including a plurality of island-shaped connect). The shape of the island-shaped connect is unlimited, and the island-shaped connect has a cross-section profile in the shape of a rectangle, polygon (please refer to FIG. 5), a semicircle (please refer to FIG. 6), or combinations thereof.

Figure 7:
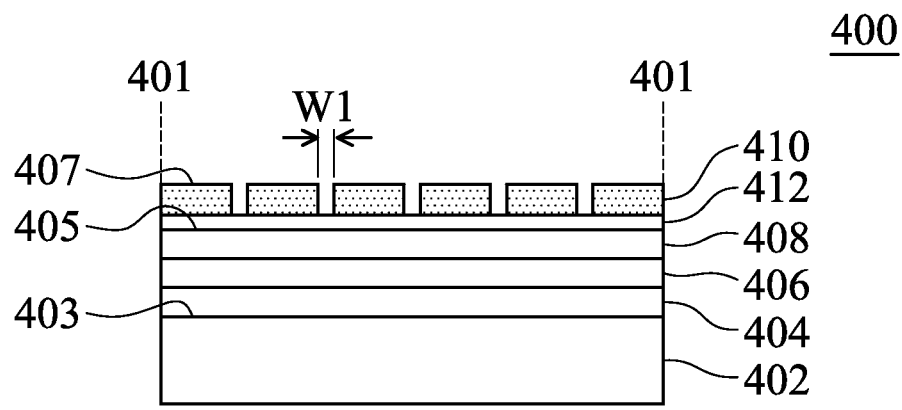
Figure 8:
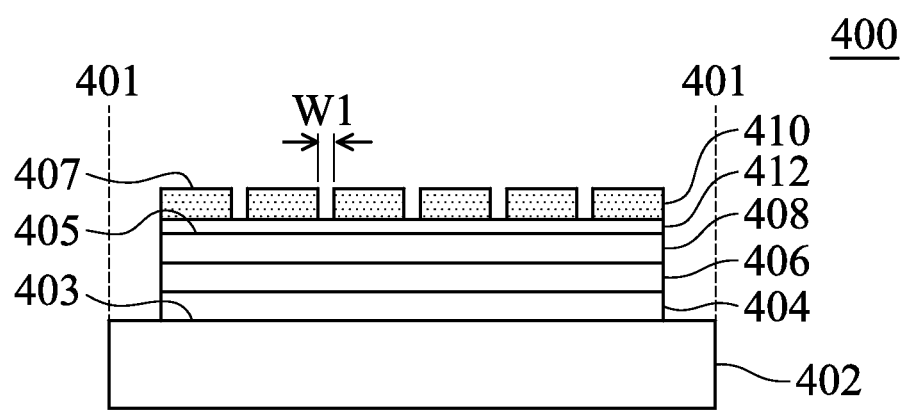

Referring to FIGS. 7 and 8, the light emitting diode chip 400 can further include a reflective layer 412 disposed between the second semiconductor layer 408 and the connecting layers 410, thereby increasing the light extraction efficiency of the device. The reflective layer has reflectivity of more than 70% with the light emitted from the light emitting layer 406.

Since the connecting layer 410 formed on the second semiconductor layer 408 has an island structure, any two adjacent island-shaped connects are separated from each other by a specific distance W1, thereby preventing a bonding layer (including the connecting layer 410) from contacting the light emitting layer 406 or first semiconductor layer 404 and eliminating short circuit defects after a lamination step of a bonding process is performed.

Figure 9:
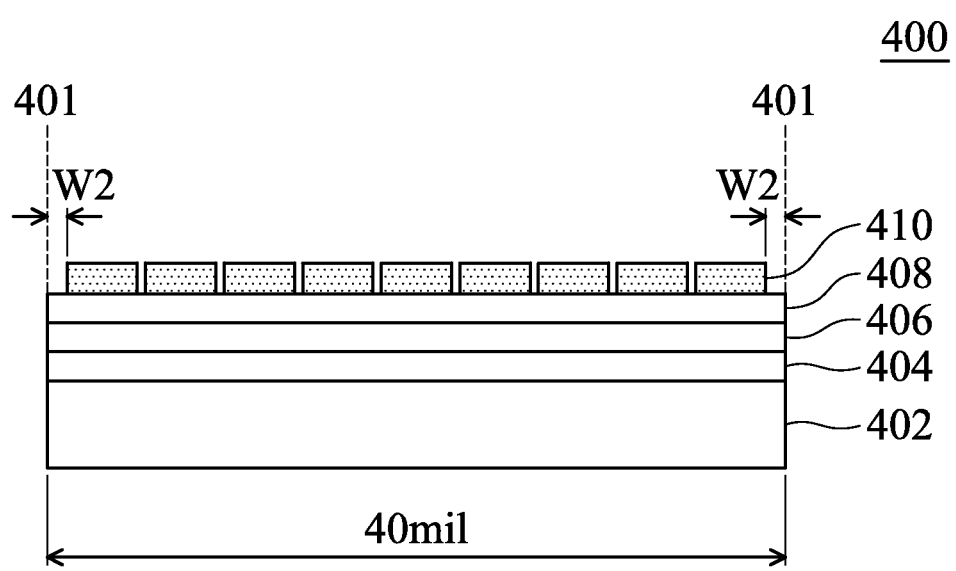
Figure 10:
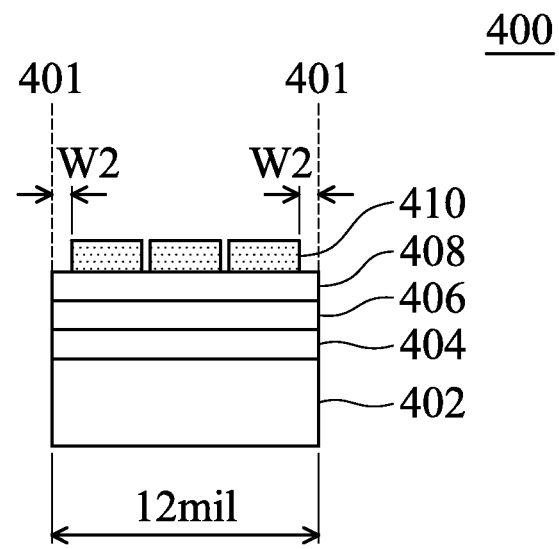

According to another embodiment, in order to further avoid short circuits, the minimum horizontal distant W2 between the surrounding boundary 401 of the growth substrate 402 and the connecting layers 410 is equal to or more than 10 μm, for any growth substrate 402 size. For example, for a growth substrate 402 with a profile width of 40 mil (as shown in FIG. 9), the nearest connecting layer 410 which is against the surrounding boundary 401 is separated from the surrounding boundary 401 by a distance equal to or larger than 10 μm. Further, for a growth substrate 402 with a profile width of 12 mil (as shown in FIG. 10), the nearest connecting layer 410 which is against the surrounding boundary 401 is also separated from the surrounding boundary 401 by a distance equal to or larger than 10 μm.

Figure 11:
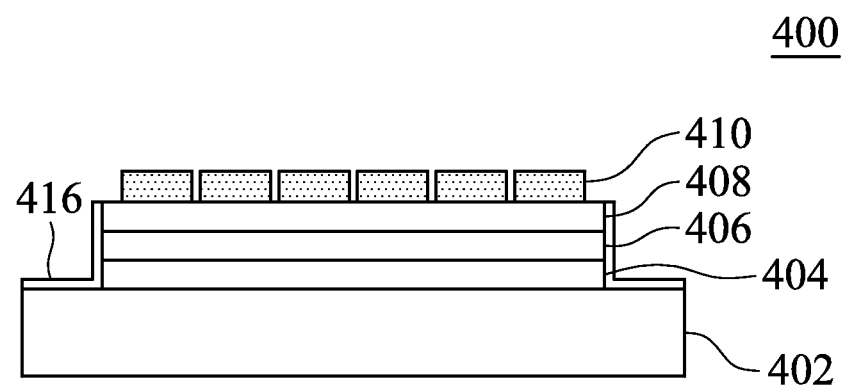

According to other embodiments, the light emitting diode chip 400 can further include a passivation layer 416 disposed on a sidewall of the first semiconductor layer 404, a sidewall of the light emitting layer 406, and a sidewall of the second semiconductor layer 408, as shown in FIG. 11, thereby separating the light emitting layer 406 from a subsequently formed bonding layer. Therefore, the passivation layer 416 can prevent the bonding layer from becoming directly in contact with the light emitting layer 406 or the first semiconductor layer 404.

Figure 12:
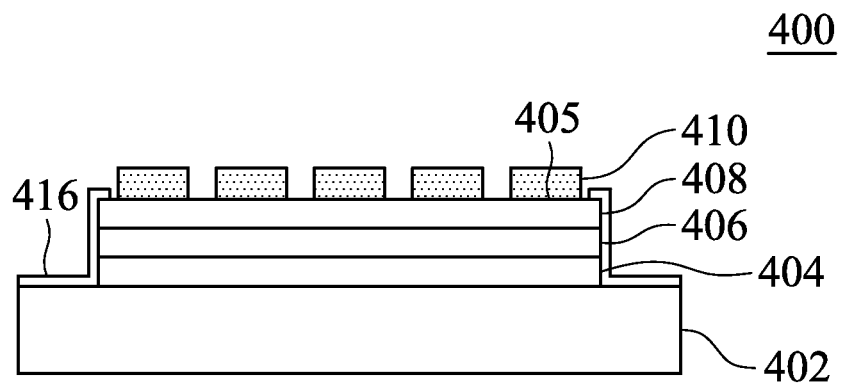
Figure 13:
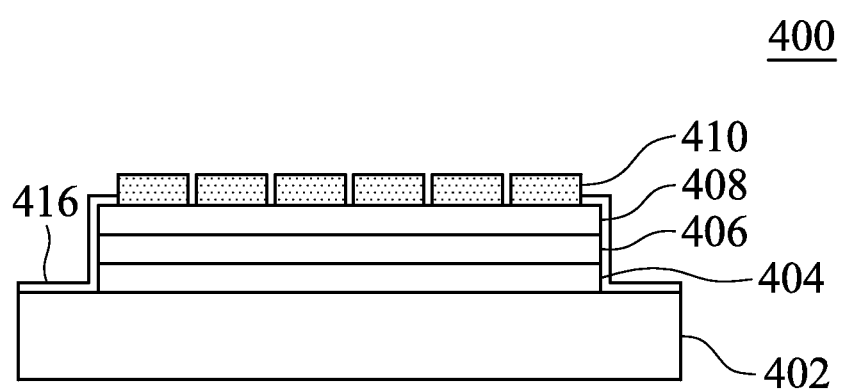
Figure 14:
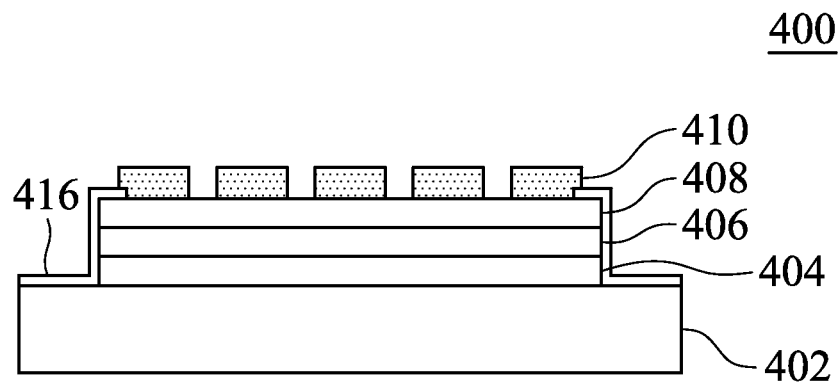
Figure 15:
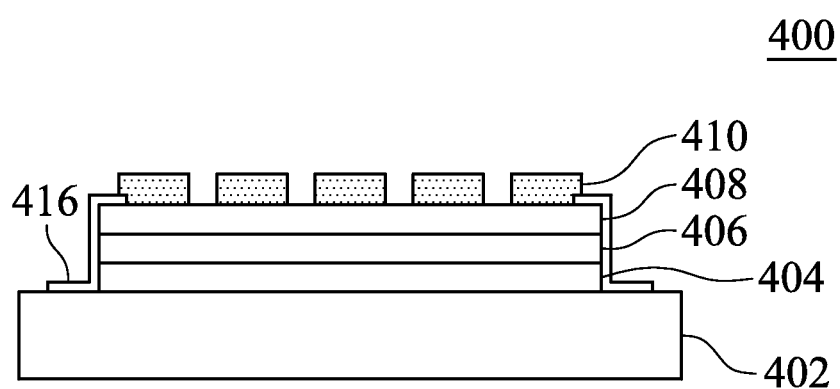

The passivation layer 416 can extend to a top surface 405 of the second semiconductor layer 408, as shown in FIG. 12. Further, the passivation layer 416 can extend to contact with a part of the sidewall of the connecting layer 410, as shown in FIG. 13. Moreover, the passivation layer 416 can be a pattern formed between the connecting layer 410 and the second semiconductor layer 408, as shown in FIGS. 14 and 15.

Figure 95:
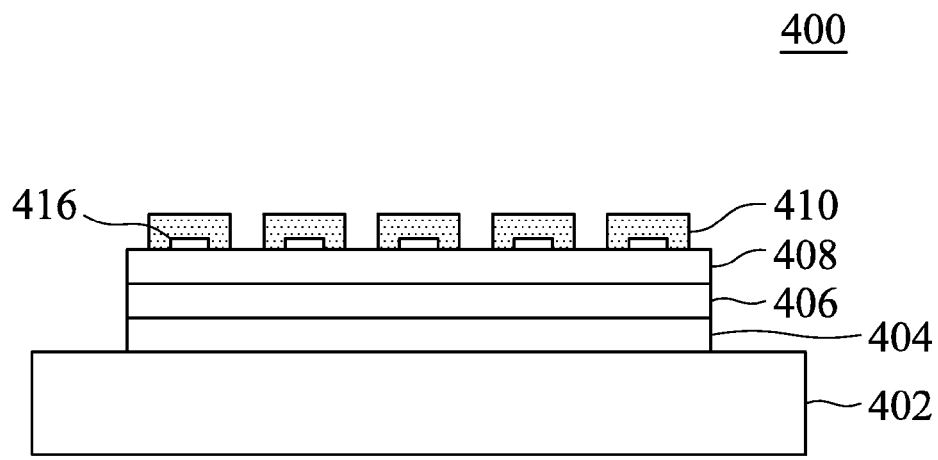
FIG. 95 is a cross-section of light emitting diode chip according to an embodiment of the disclosure.

Since the passivation layer 416 is an insulating film, the connecting layer 410 may be further cover the passivation layer 416. Therefore, the patterned passivation layer 416 may be disposed between the connecting layer 410 and the second semiconductor layer 408, for forming a current-improved structure (increasing current distribution uniformity), as shown in FIG. 95.

Figure 16:
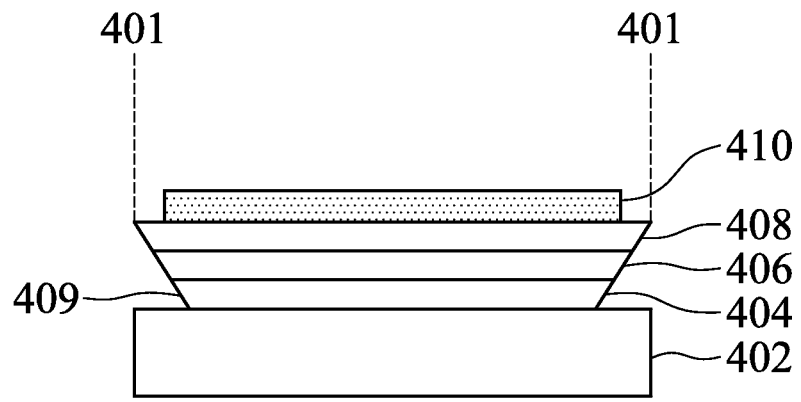
Figure 17:
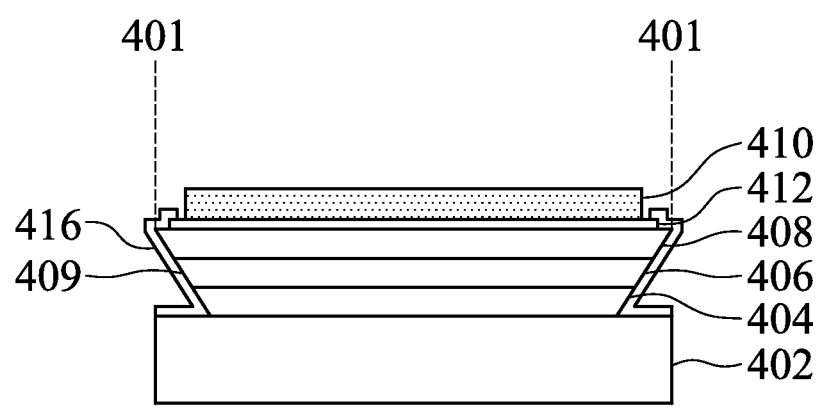

Suitable materials of the passivation layer 24 can be dielectric materials or schottky contact materials, such as silicon oxide, silicon nitride, aluminum nitride, titanium oxide, aluminum oxide, or combinations thereof. According to other embodiments of the disclosure, the light emitting diode chip 400 can have a tapered sidewall 409 tapered toward the growth substrate 402, and the passivation layer 416 can further be formed on the sidewall 409, as shown in FIGS. 16 and 17.

Since the chip can be any suitable shape, the sidewall of the epi layers can be tapered, facilitating electrically connections and avoiding short circuits during the subsequent bonding process. The connecting layer 410 having an island structure and/or the passivation layer 416 formed on the sidewall of the chip can prevent current leakage from occurring during the subsequent bonding process.

In comparison with the conventional wafer-level bonding process, since the disclosure provides a chip which is bonded to a carrier substrate (or a sub-mount), the passivation layer is not damaged by pressure during bonding and the current linkage problem can be prevented. Further, the light emitting diode chip of the disclosure can prevent an overflow issue from occurring due to the unequal bonding pressures during the bonding process.

Figure 18:
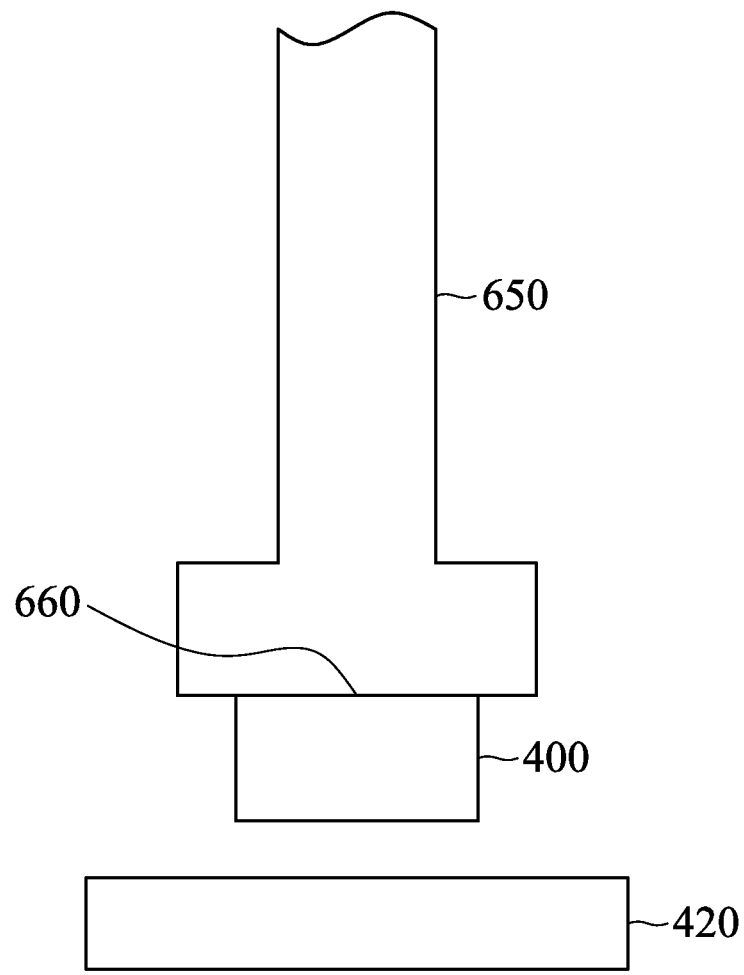
FIG. 18 is a cross-section of a nozzle used to chuck the light emitting diode chip by suction and then place the diode chip on a carrier substrate.
Figure 19:
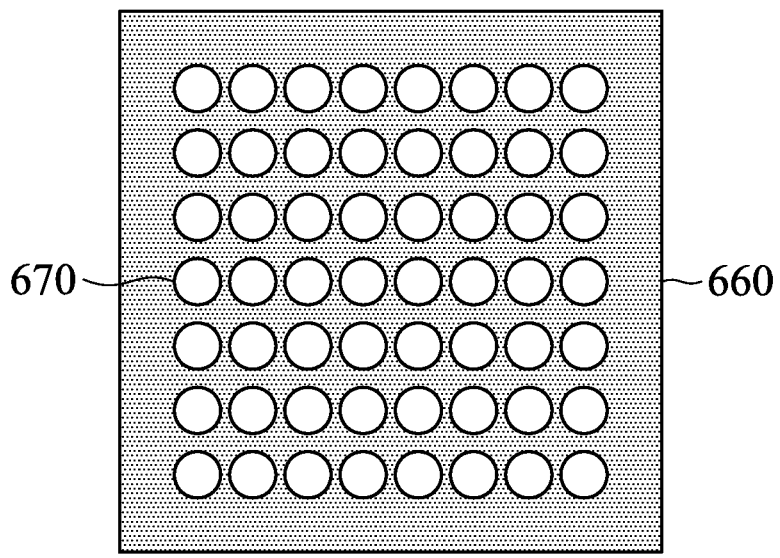
FIG. 19 is a schematic diagram of the absorbent surface of the nozzle shown in FIG. 18.
Figure 20:
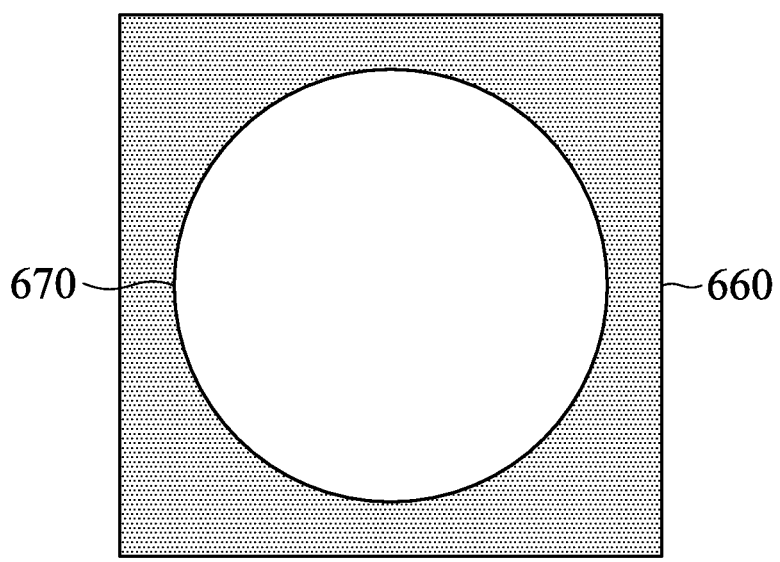
FIG. 20 is a schematic diagram of the absorbent surface of the nozzle according to an embodiment of the disclosure.

The light emitting diode chip 400 can further be bonded to a carrier substrate, obtaining a light emitting diode package structure. In the bonding process, referring to FIG. 18, a nozzle 650 can be used to chuck the diode chip 400 by suction and then place the diode chip on a carrier substrate 420. Particularly, the nozzle 650 can preferably have an absorbent surface 660 as shown in FIG. 19 (having a plurality of air inlets 670) replacing the conventional absorbent surface as shown in FIG. 20 (having a single air inlet 670), for improving the section strength.

Figure 21A:
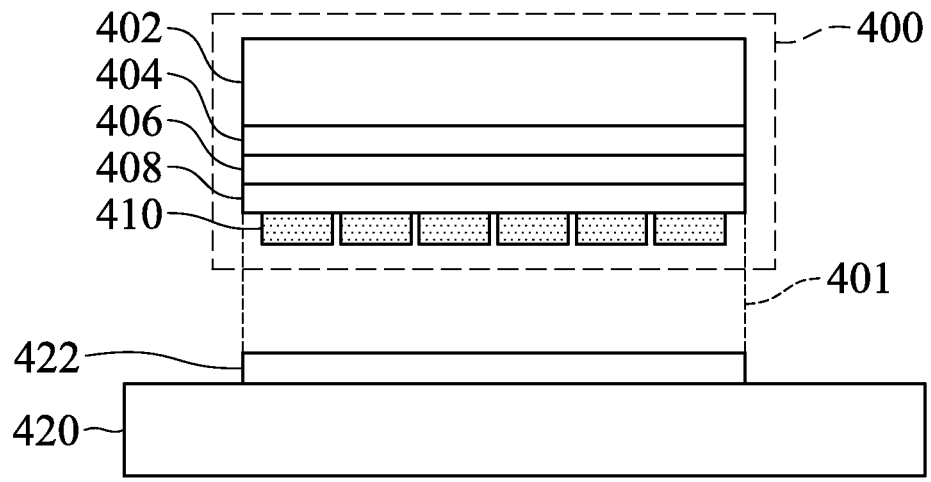
FIGS. 21A and 21B are cross-sections showing a method for fabricating a light emitting diode package structure according to an embodiment.

Referring to FIG. 21A, the light emitting diode chip 400 can be further bonded on a carrier substrate 420 (such as a sub-mount), obtaining a light emitting diode package structure 600. The carrier substrate 420 includes a contact pad 422 for subsequent bonding with the light emitting diode chip 400 and achieving electrical connection therebetween. The contact pad 422 may include a conductive material (such as: Pd, Pt, Ni, Au, Ag, or combinations thereof), an Ohmic-contact material, a diffusion barrier layer, a metal bonding layer, a reflective layer, or combinations thereof.

Figure 66A:
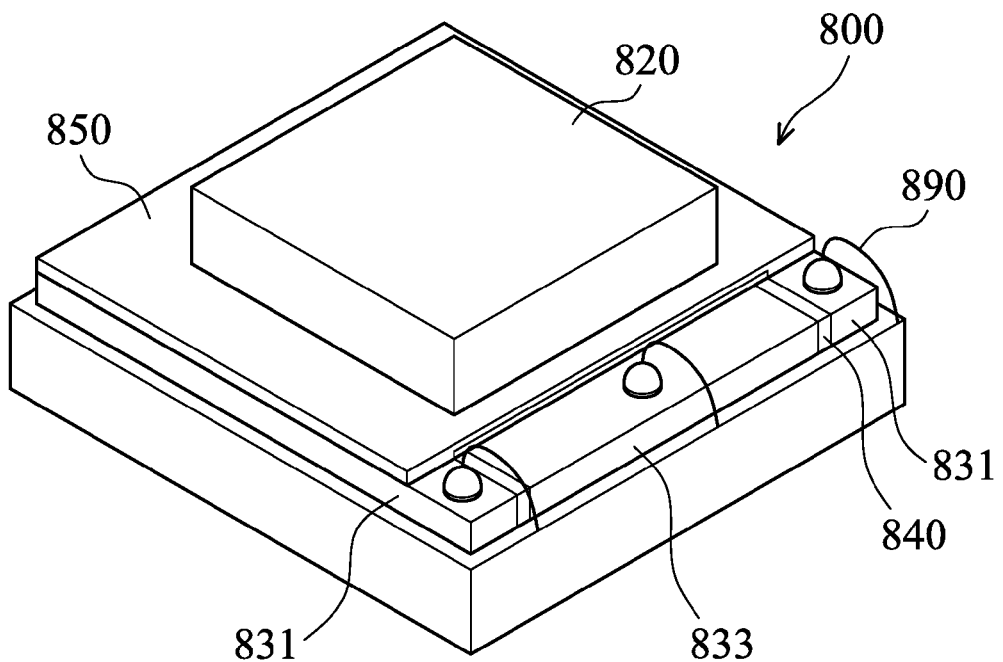
FIG. 66A is a diagram showing a LED structure having an electrode not fully surrounding its sacked structure.
Figure 66B:
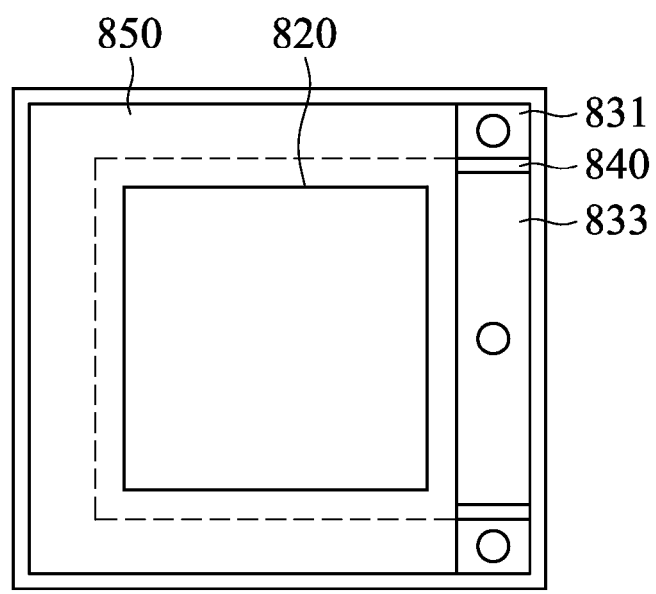
FIG. 66B is a diagram showing the top view of the LED structure in FIG. 66A.

Referring to FIG. 66B, after bonding, a light emitting diode package structure 600 is obtained.

The light emitting diode chip 400 is bonded to the carrier substrate 420 via a bonding layer 424, wherein the bonding layer 424 includes the connecting layers 410 and the contact pad 422, and the bonding layer 424 has a thickness which is equal to or less than 20 μm. It should be noted that, after the lamination step of the bonding process, the bonding layer 424 of the light emitting diode package structure 600 can have a plurality of voids 426 (which means that at least one of the connecting layers 410 and the contact pad 422 has an island structure before bonding).

Figure 21B:
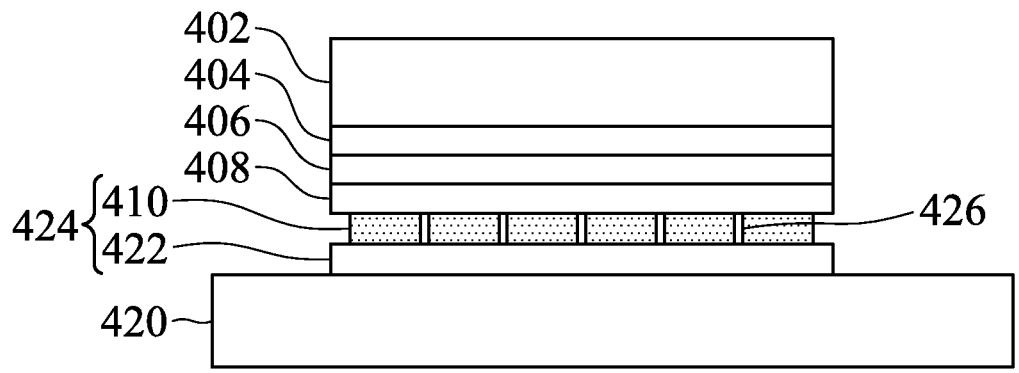

The bonding layer 424 has a plurality of voids 426 means that the bonding layer does not absolutely overflow to contact the sidewall of the first semiconductor layer 404 and the light emitting layer 406 after the lamination step. Referring to FIG. 21B, after bonding, a minimum horizontal distant between the surrounding boundary 401 and the connecting layer 410 is larger than 0.

Figure 22A:
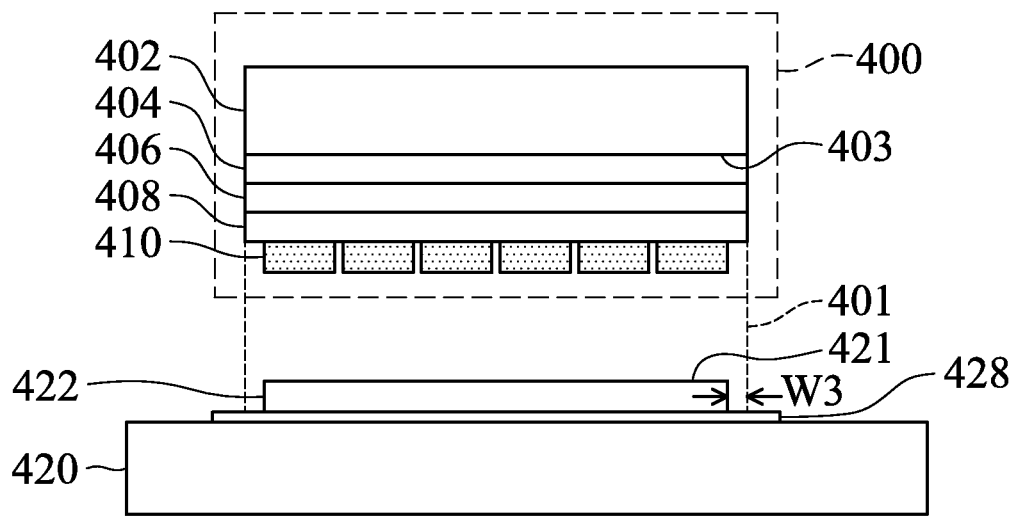
FIGS. 22A and 22B are cross-sections showing a method for fabricating a light emitting diode package structure according to an embodiment.
Figure 22B:
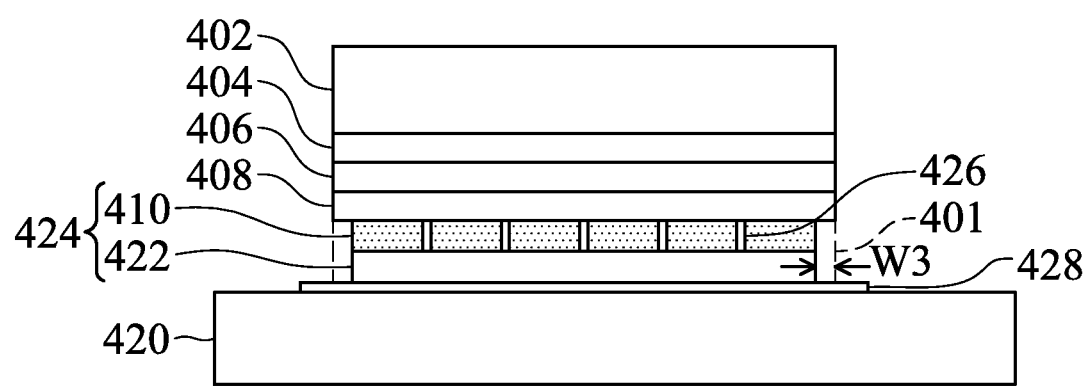

Referring to FIG. 22A, except for the metal bonding layer 422, the light emitting diode package structure 600 can further include a reflective layer 428 (such as a reflective layer) formed between the carrier substrate 420 and the bonding layer 424. The metal reflective layer 428 is disposed between the bonding layer 424 and the substrate 420, thereby reflecting the light emitted by the light emitting diode chip 400 though the voids 426 and increasing the light extraction efficiency of a device.

Due to the reflective layer 428, the contact pad 422 can be further shrunken. Namely, the minimum horizontal distant W3 between the surrounding boundary 401 of the growth substrate 402 and the contact pad 422 can be more than 0, preferably equal to or more than 10 μm. The other aspect is that the shrunken contact pad 422 can prevent the light emitting diode chip 400 from directly contacting the circuit disposed on the carrier substrate 420.

The shrunken contact pad 422 has additional advantages for preventing the light emitting diode chip 400 from contacting to the designed circuit on the carrier substrate, which would result in current leakage and increasing the tolerance for cutting inaccuracy for avoiding cracks after the LLO (laser lift off) process.

Figure 23A:
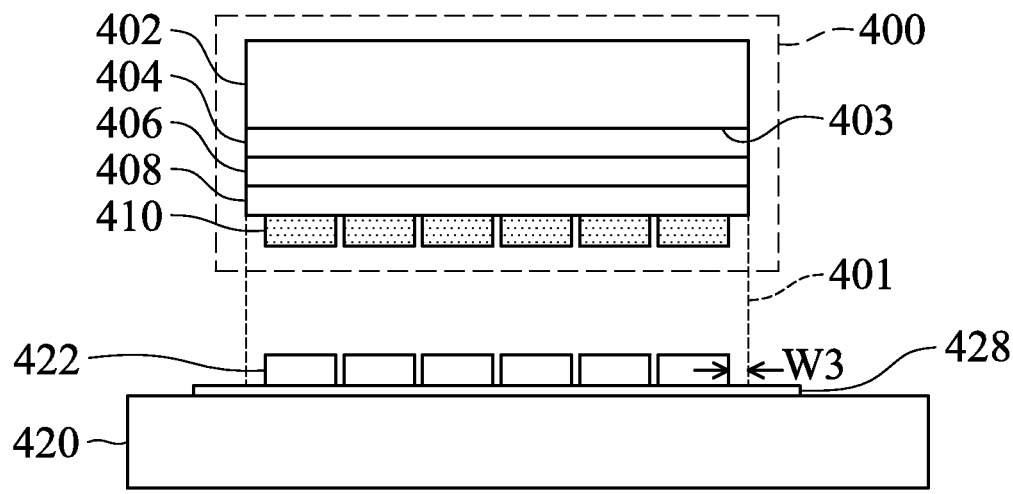
FIGS. 23A and 23B are cross-sections showing a method for fabricating a light emitting diode package structure according to an embodiment.
Figure 23B:
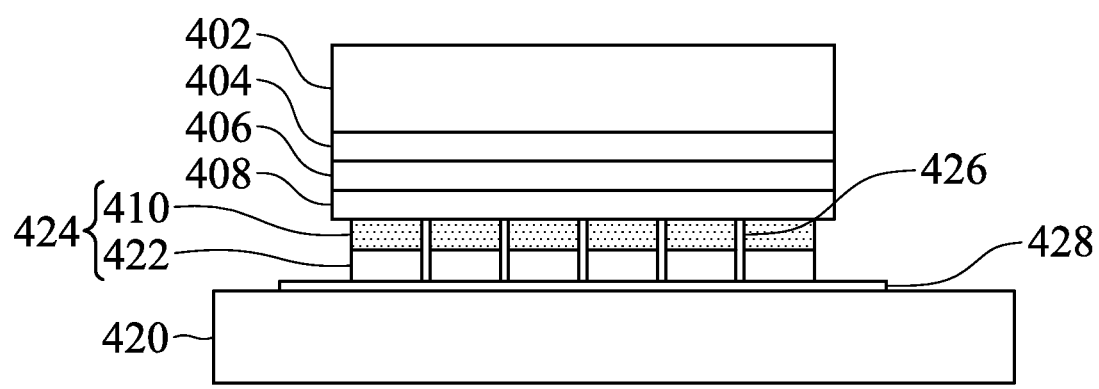

Further, since the disclosure provides light emitting diode chips to bond with a carrier substrate (such as a wafer) to achieve chip to wafer packaging, the alignment between the light emitting diode chip and the carrier substrate can be improved. Moreover, the contact pad 422 can also have a contact pad 422 having an island structure or a shrunken structure, preventing current leakage from occurring, as shown in FIGS. 23A and 23B.

After bonding with the carrier substrate, it does not matter whether the connecting layer has an island structure or a shrunken structure, the contacting area between the bonding layer (including the connecting layer and the contact pad) and the semiconductor layer is equal to or less than the area of a bottom surface of the semiconductor layer, wherein the bottom surface of the second semiconductor layer 408 directly contacts the bonding layer. Namely, the ratio between the contacting area and the area of a bottom surface of the semiconductor layer is equal to or less than 99%.

Figure 24:
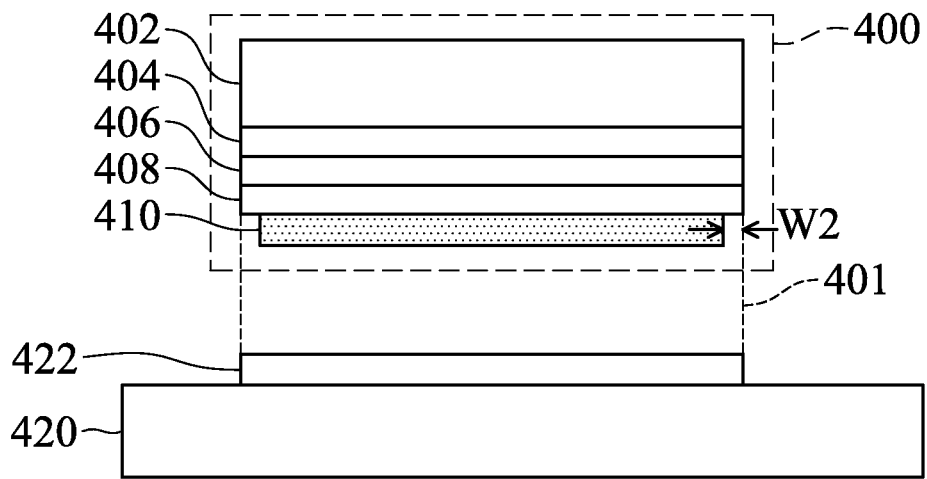
FIGS. 24 to 27 are cross-sections of light emitting diode package structures according to other embodiments of the invention.
Figure 25:
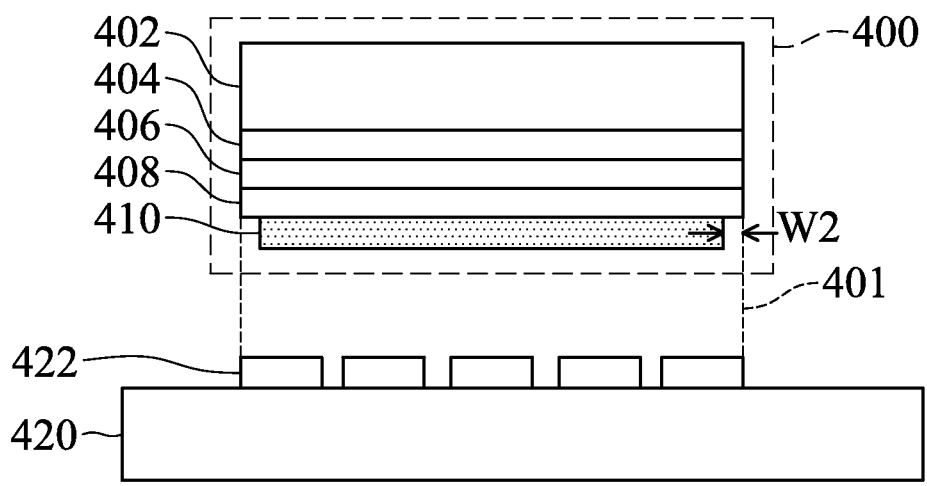

Further, referring to FIGS. 24 and 25, the connecting layer 410 of the light emitting diode chip 400 can be a continuous film. The connecting layer 410 can have a shrunken structure (i.e. the minimum horizontal distant W2 between the surrounding boundary 401 of the growth substrate 402 and the plate electrode 410 is more than 0, preferably more than 10 μm), preventing the bonding layer 424 (formed by bonding the connecting layer 410 with the contact pad 422) from directly contacting the light emitting layer 406 or the first semiconductor layer 404. Therefore, the shrunken connecting layer 410 can prevent the light emitting diode chip 400 from current leakage.

According to other embodiments, the light emitting diode package structure 600 can further include a passivation layer 416 disposed on a sidewall of the first semiconductor layer 404, a sidewall of the light emitting layer 406, and a sidewall of the second semiconductor layer 408.

Figure 26:
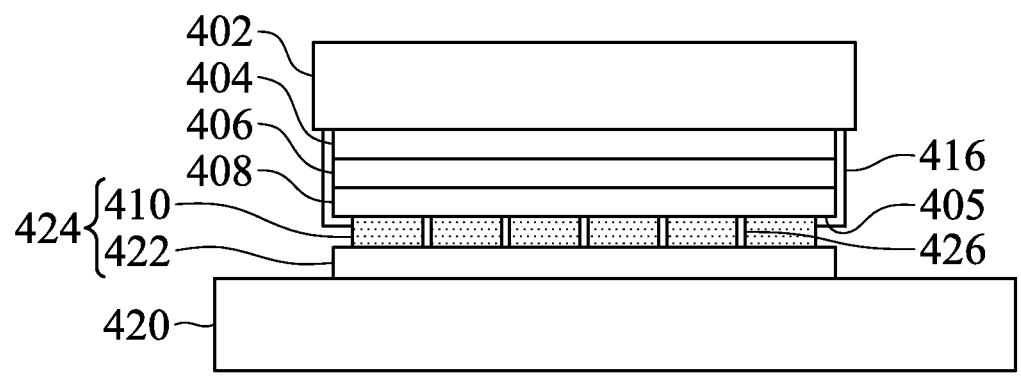

Further, the passivation layer 416 can extend to a top surface 405 of the second semiconductor layer 408, as shown in FIG. 26. Therefore, after bonding the light emitting diode chip 400 with the carrier substrate 420, the passivation layer 416 can prevent the bonding layer 424 from becoming directly in contact with the light emitting layer 406 or the first semiconductor layer 404.

Figure 27:
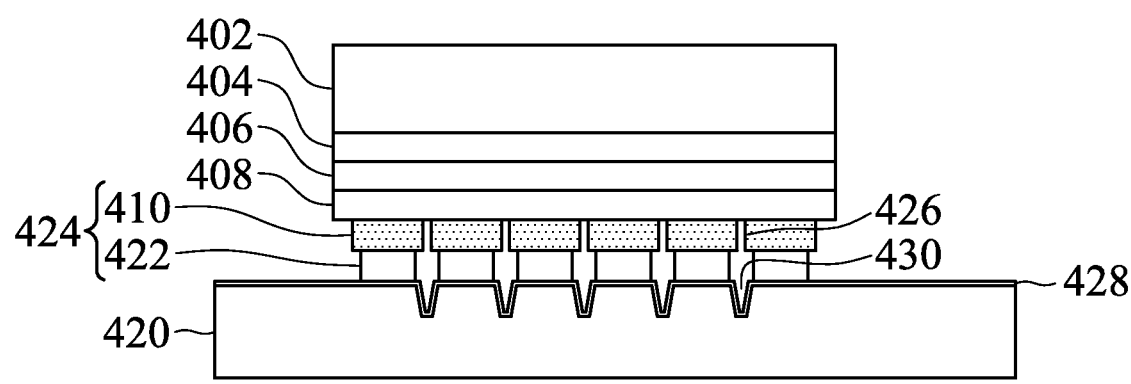

Further, referring to FIG. 27, the carrier substrate 420 employed by the light emitting diode package structure 600 can have a plurality of recesses 430 on a top surface of the carrier substrate 420, thereby preventing the bonding layer 424 from overflowing. Particularly, a reflective layer 428 can be blanketly formed on the top surface of the carrier substrate 420 to cover the sidewall and the bottom surface of the recesses 430.

Figure 28:
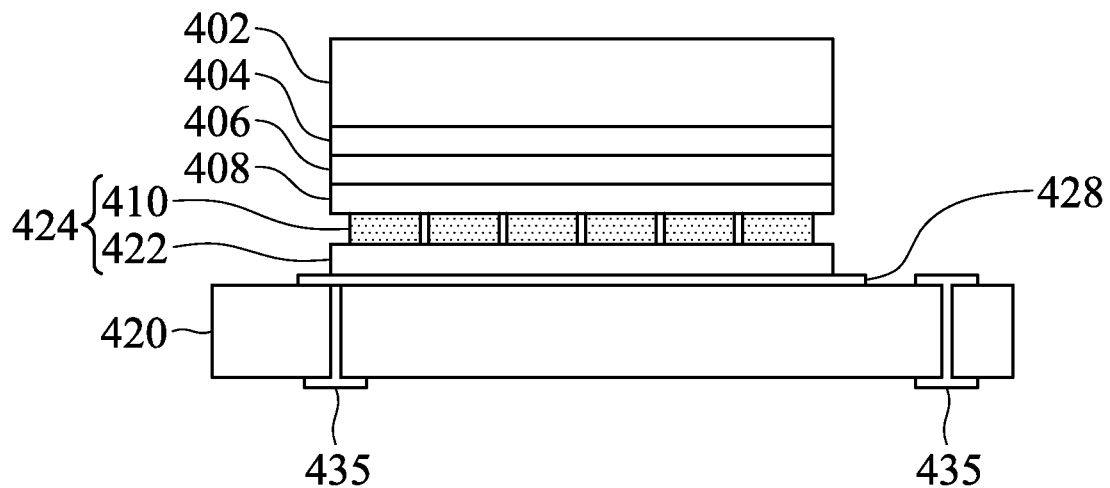
FIGS. 28-31 are cross-sections showing a method for fabricating a light emitting diode package structure according to an embodiment.

According to other embodiments, the carrier substrate 420 of the light emitting diode package structure 600 can be a package substrate with a designed circuit 435 for completing the electrical connections of the connecting layers 410, as shown in FIG. 28. Further, a wire can be employed to electrically connect the circuit 435 with another electrode formed on the first semiconductor layer 404 (after removing the substrate).

Figure 29:
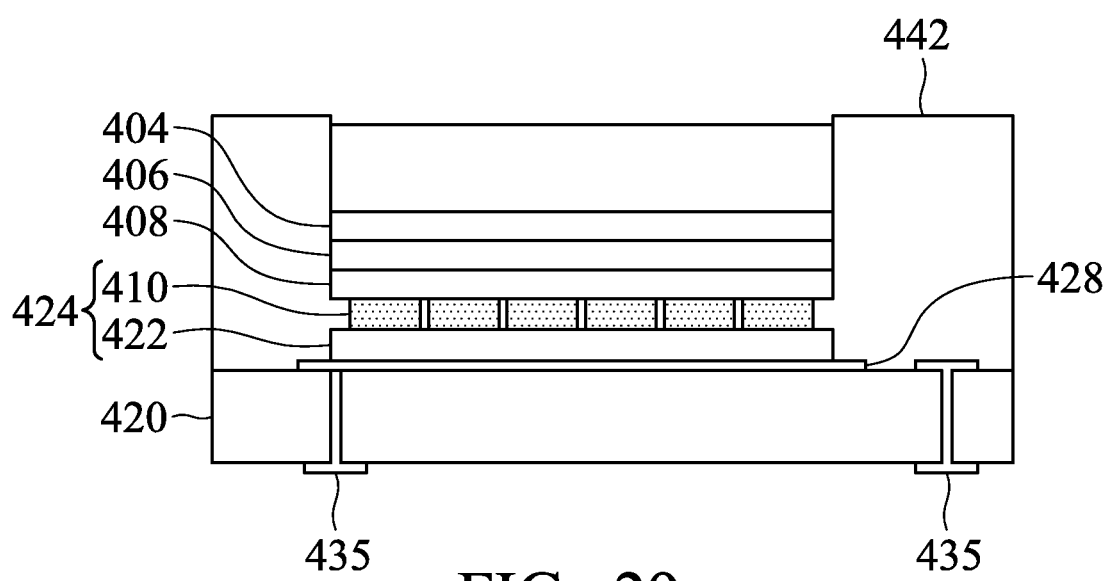
Figure 30:
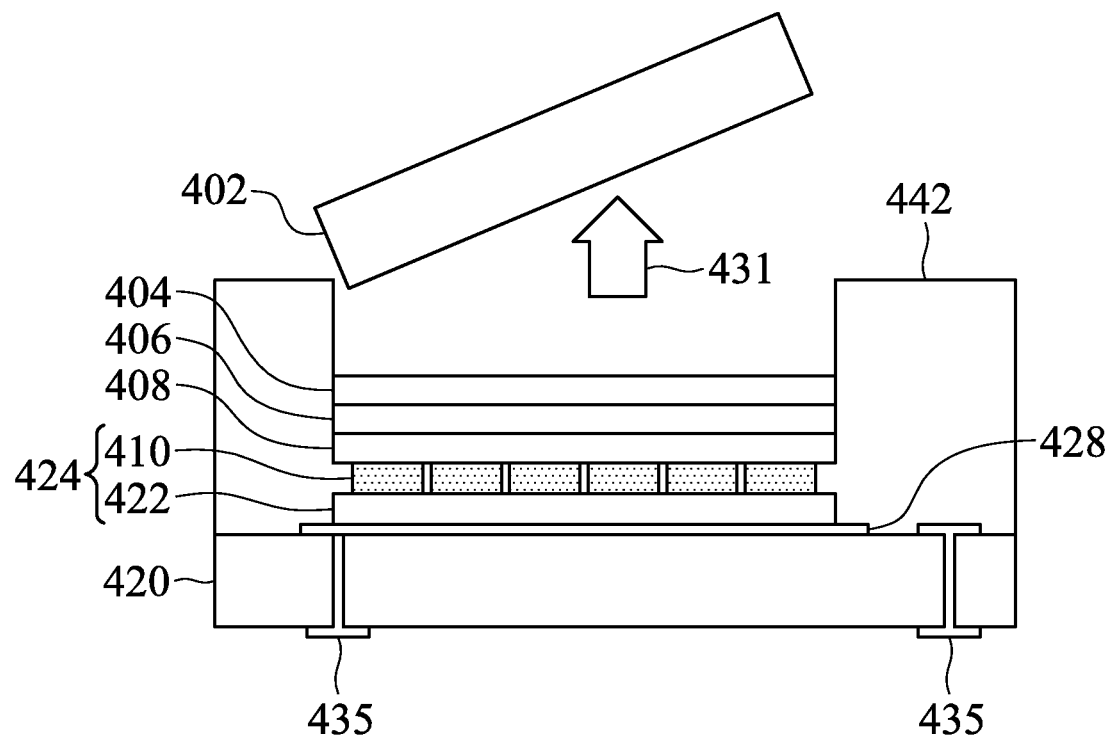

Next, an isolation layer 442 (such as an adhesion layer) can be formed on the carrier substrate 420, exposing the surface of the growth substrate 402, as shown in FIG. 29. The surrounding layer 442 can be a dielectric material (such as oxide dielectric layer), photo-resist, or under-fill material. Next, the growth substrate 402 of the light emitting diode chip 400 can be removed by an LLO (laser lift off) process 431 (if the substrate is GaAs, SiC, Si or ZnO, it can be removed by a wet etching process), as shown in FIG. 30. The surrounding layer 442 can be made of photo-resist, adhesion material, or semifluid. In another embodiment of the disclosure, the surrounding layer 442 can be removed completely after the LLO process.

Figure 31:
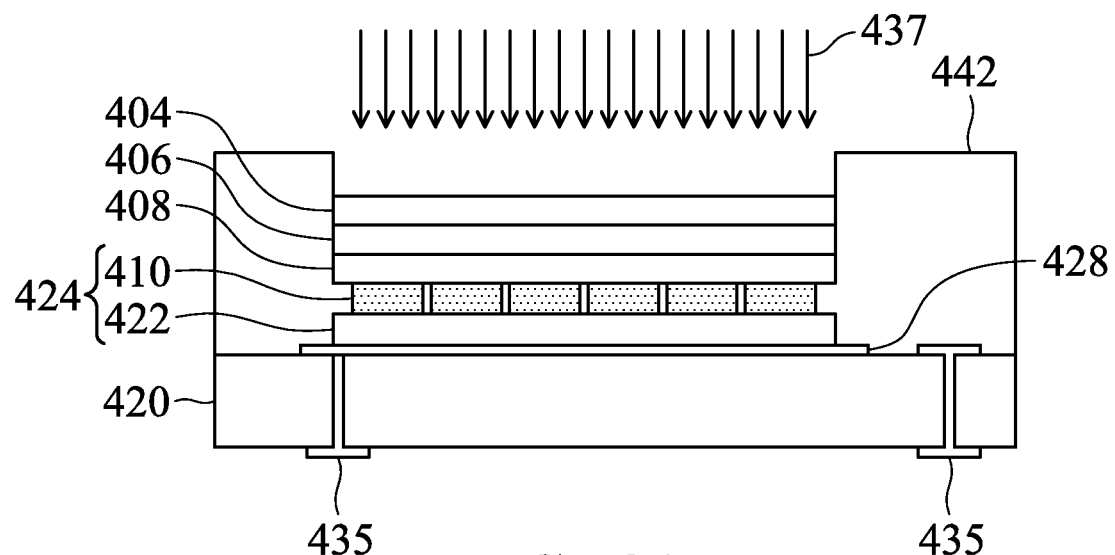
Figure 32:
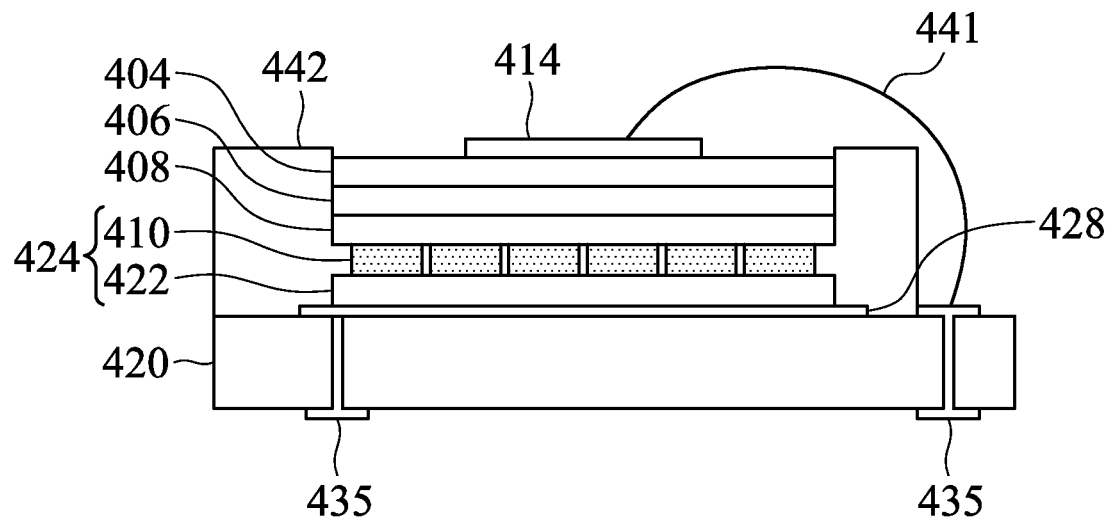
FIGS. 32-34 are cross-sections showing a method for fabricating a light emitting diode package structure according to another embodiment.

Next, a part of the first semiconductor layer 404 of the light emitting diode chip 400 can be removed by dry etching, as shown in FIG. 31. After removing the growth substrate 402, an electrode 414 can be formed on the first semiconductor layer 404. Next, a part of the surrounding layer 442 is removed, and a wire 441 is used to achieve the electrical connection between the electrode 414 and the circuit 435, as shown in FIG. 32.

Figure 33:
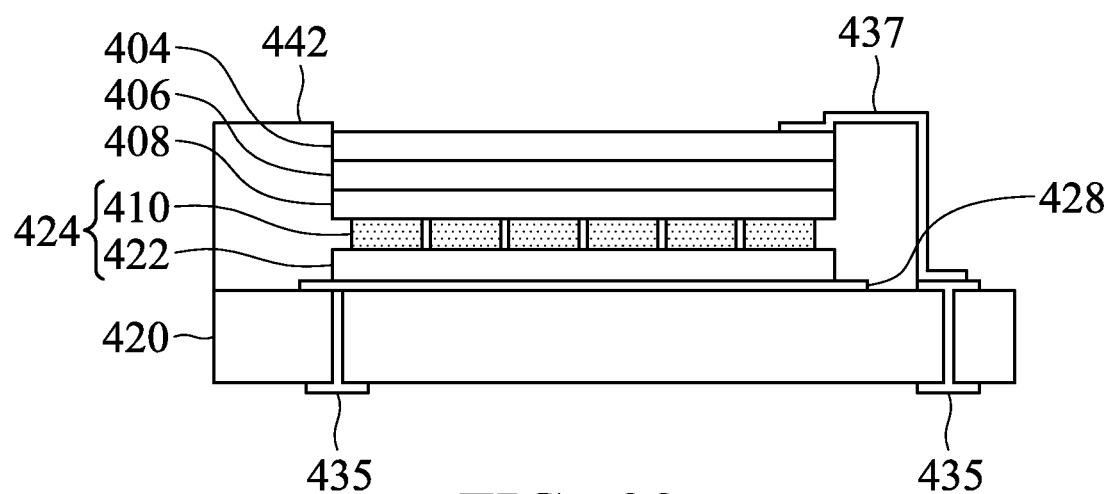
Figure 34:
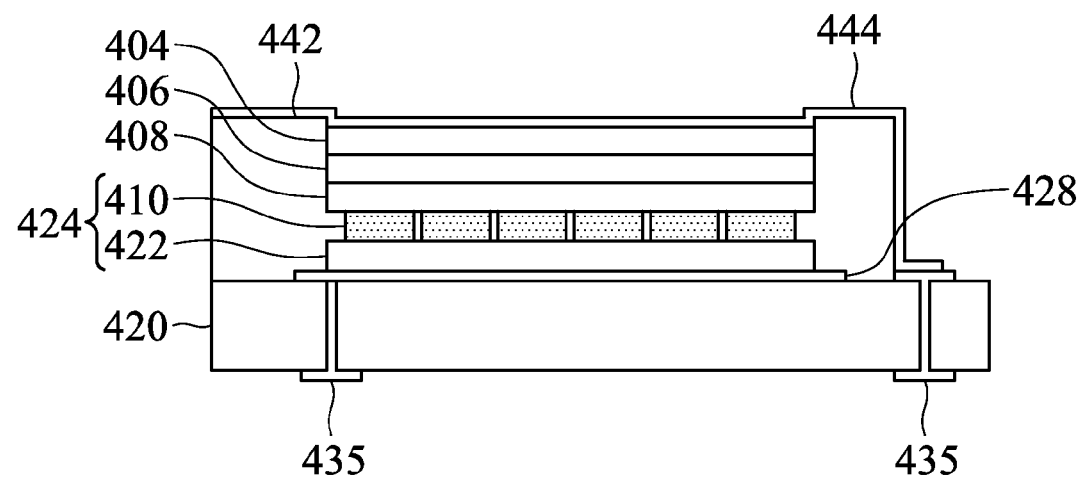

In another embodiment of the disclosure, a planar circuit pattern 437 can be formed on the first semiconductor layer 404 and the surrounding layer 442, electrically connecting the first semiconductor layer 404 with the circuit 435, as show in FIG. 33. In some embodiments of the disclosure, a blanket transparent conductive layer 444 can be formed on the first semiconductor layer 404 and the surrounding layer 442, electrically connecting the first semiconductor layer 404 with the circuit 435, as show in FIG. 34. Particularly, the transparent conductive layer 444 can be made by transparent conducting oxide (such as ITO (indium-tin oxide) or IZO (indium zinc oxide)), transparent conducting nitride, transparent conducting fluoride, carbon nano-particle, or thin metal film (such as Ag film, Au film, or Al film). Further, the blanket transparent conductive layer 444 can have a rough surface in order to increase the light extraction efficiency. For example, the semiconductor layer (such as a GaN layer) can be subjected to a surface roughening process before forming the blanket transparent conductive layer 444.

Figure 35:
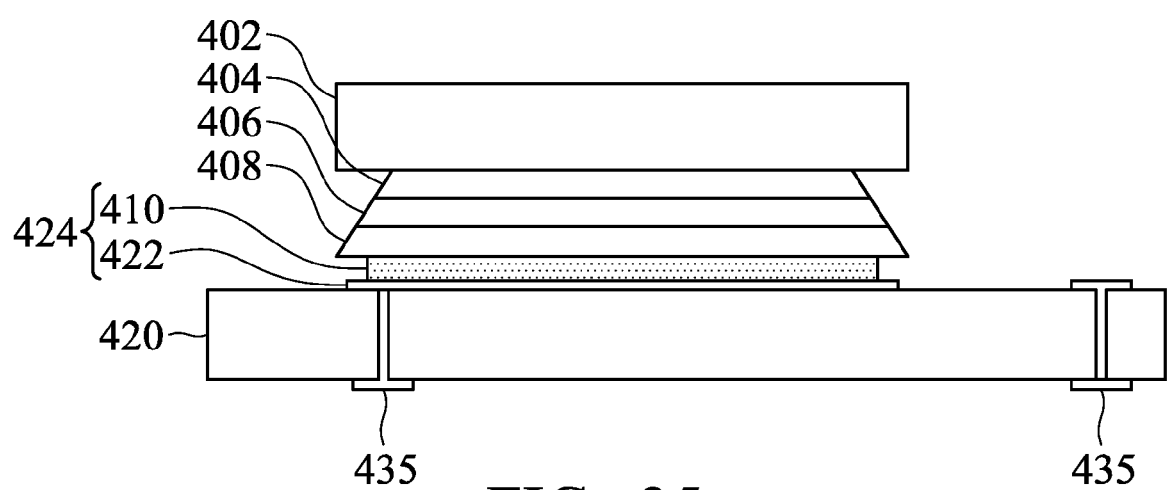
FIGS. 35-37 are cross-sections showing a method for fabricating a light emitting diode package structure according to another embodiment.
Figure 36:
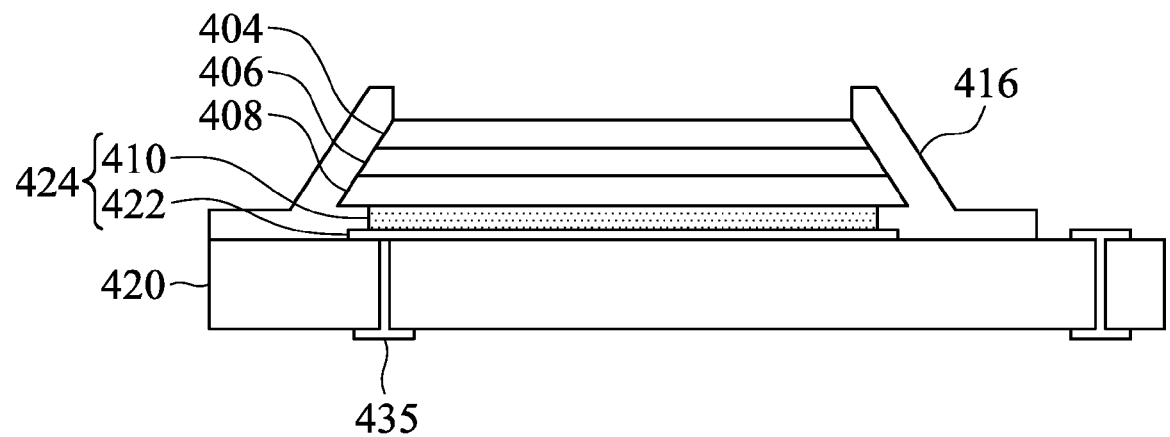
Figure 37:
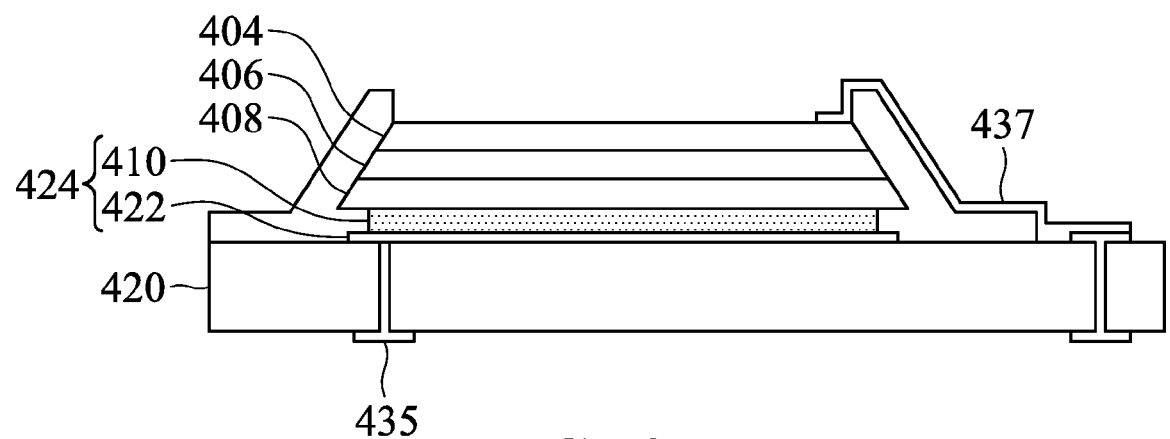

According to yet other embodiment, the light emitting diode chip 400 with tapered sidewall shown in FIG. 16 can be disposed on the carrier substrate 420 by bonding the connecting layer 410 with the contact pad 422, as shown in FIG. 35. After a bonding and a laser lift-off process, a passivation layer 416 can be conformally formed on the tapered sidewall of the light emitting diode chip 400 and the top surface of the carrier substrate 420, as shown in FIG. 36. Finally, a planar circuit pattern 437 can be formed on the passivation layer 416 and electrically connect to the first semiconductor layer 404, as shown in FIG. 37.

Figure 38:
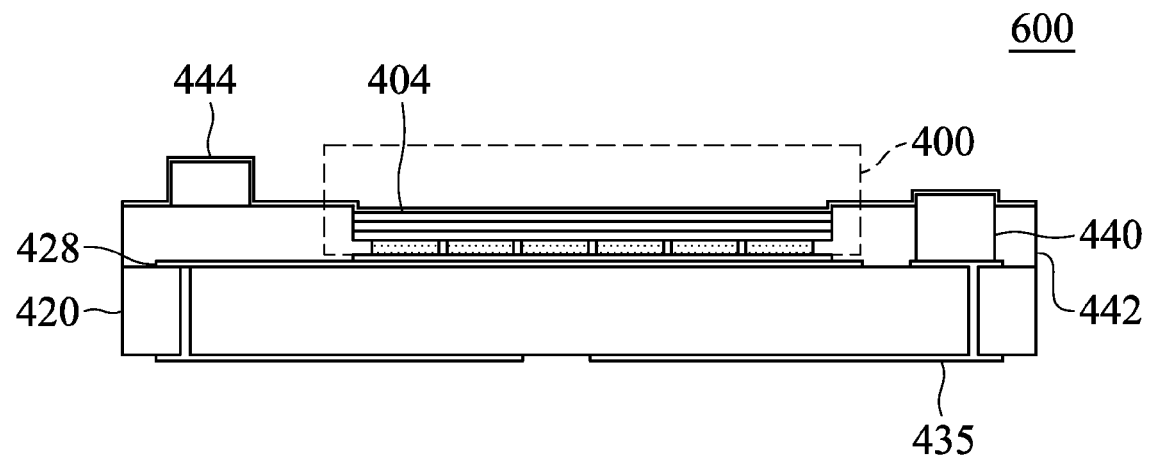
FIGS. 38 and 39 are cross-sections of light emitting diode package structures combined with an electrode pattern design without light shading according to other embodiments of the disclosure.
Figure 39:
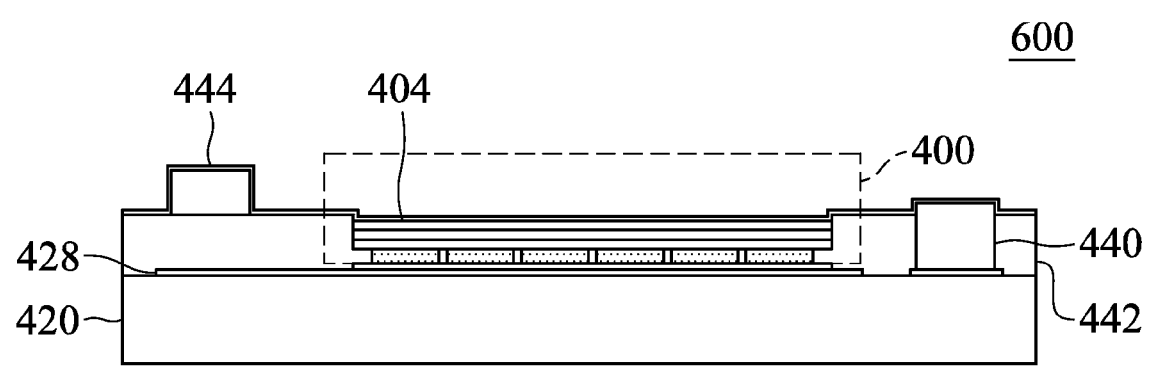
Figure 47:
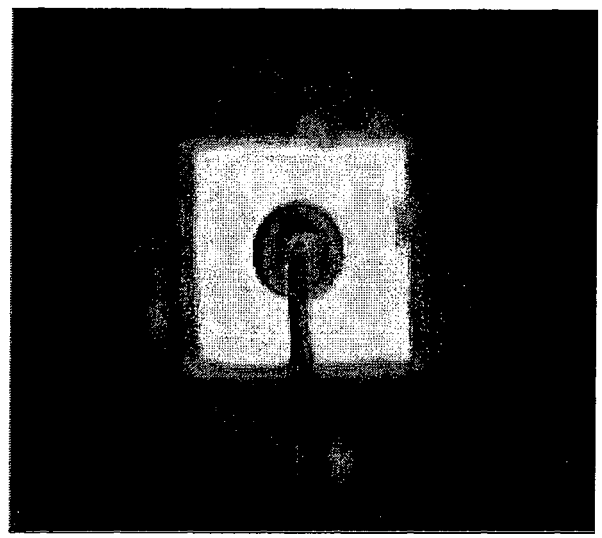
FIG. 47 is a photograph of a conventional LED package structure with wire light shielding.

Further, in order to prevent the reduction of luminous intensity resulting from the light shielding of the wire (as shown in FIG. 47), the light emitting diode package structure 600 can be designed to so that light shielding does not occur, i.e. there is no opaque wire disposed on the electrode 414. Referring to FIGS. 38 and 39, the light emitting diode package structure 600 can further include a metal pad 440, a passivation layer 442, and a transparent electrode 444, wherein the metal pad 444 surrounds the light emitting diode chip 400 and does not directly contact with the electrode 414. Further, the transparent electrode 444 is blanketly formed on the electrode 414 and electrically connected to the metal pad 440.

Figure 40:
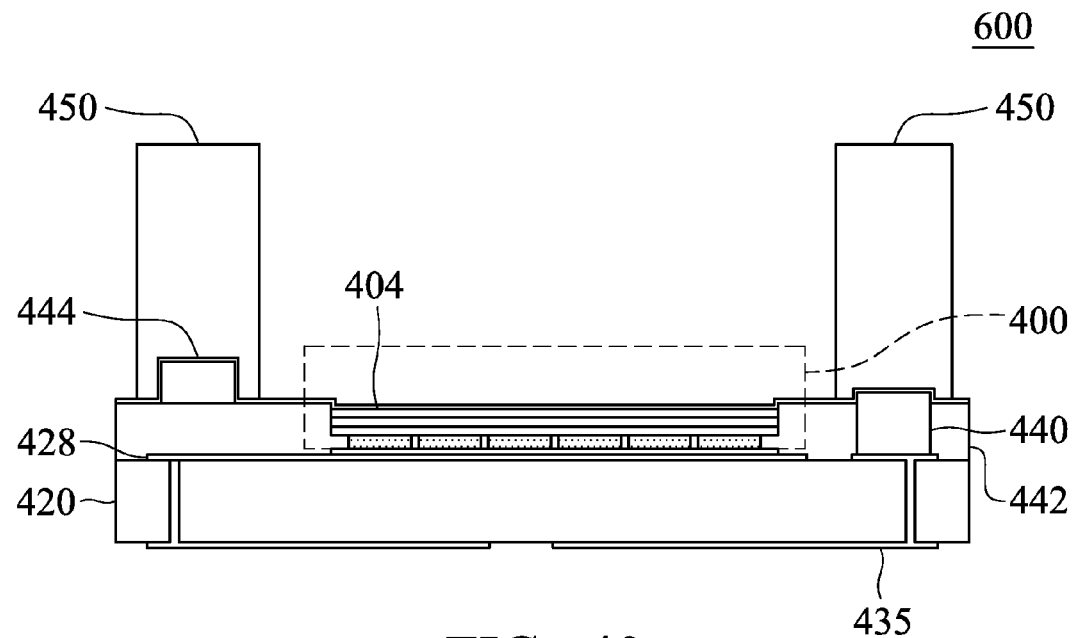
FIGS. 40 and 41 are cross-sections showing a method for fabricating a light emitting diode package structure according to another embodiment.
Figure 41:
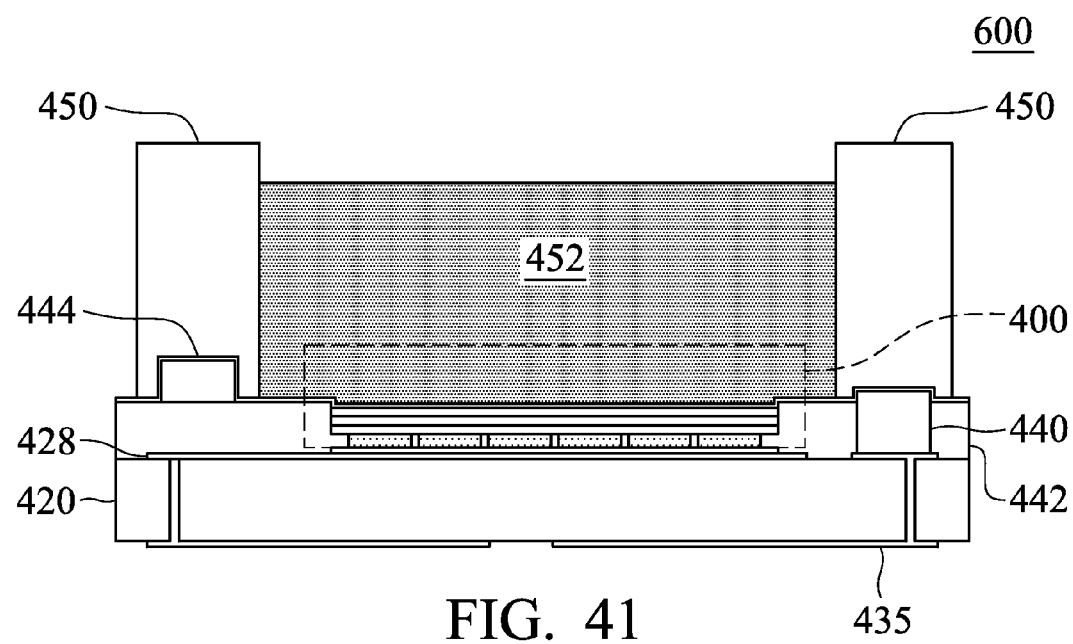
Figure 42:
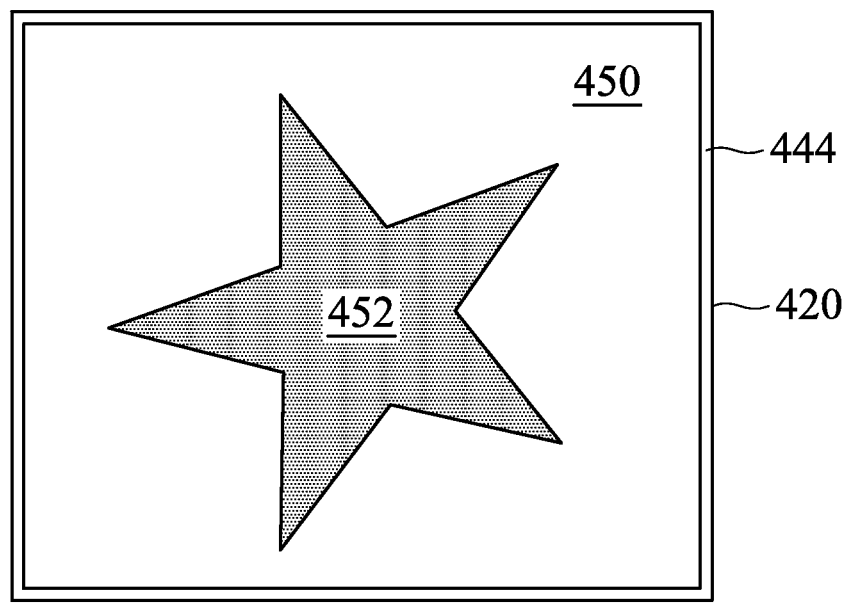
FIG. 42 is a top view of the patterned light emitting diode package structure according to another embodiment.

Moreover, referring to FIG. 40, a surrounding wall 450 can be formed on the transparent electrode 444 over the metal pad 440 by electroplating to achieve an electrode pattern design without light shading. Next, since the surrounding wall 450 and transparent electrode 444 can constitute an opening, next, a florescent powder 452 can be filled into the opening, achieving an object for emitting light, as shown in FIG. 41. Further, since the metal pad 440 can be designed to be various shapes and the surrounding wall 450 (or photoresist) can be further patented, and a shapable light emitting diode package structure can be obtained, referring to FIG. 42.

Figure 43:
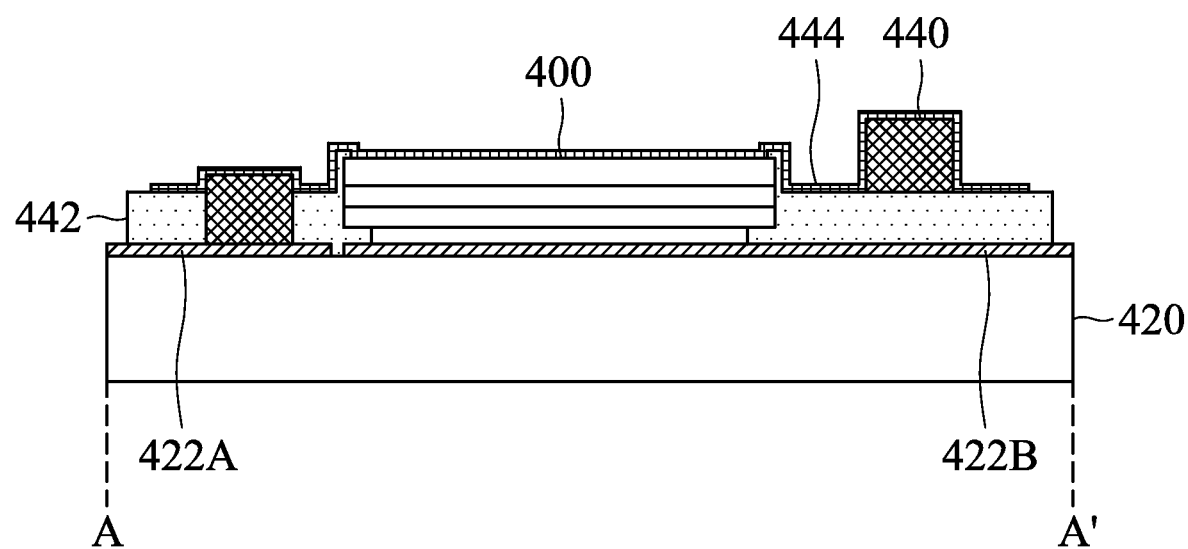
FIG. 43 is a cross-section of light emitting diode package structure combined with an electrode pattern design without light shading according to yet another embodiment of the disclosure.

In another embodiment of the disclosure, as shown in FIG. 43, the light emitting diode package structure as shown in FIG. 24 can be further combined with the aforementioned electrode pattern design without light shading, obtaining a novel light emitting diode package structure.

As shown in FIG. 43, a transparent conductive layer 444 is substituted with a conventional opaque electrode or wire used in the light emitting diode chip of the light emitting diode package structure 600, to prevent the reduction of luminous intensity resulting from the light shielding of the opaque electrode or wire. Alternatively, since the contacting area between the bonding layer 424 and the semiconductor layer is less than the area of the semiconductor layer, current leakage is prevented from occurring and light emitting efficiency and reliability of the light emitting diode package structure are increased. Further, the transparent conductive layer 444 is electrically connected to the contact pad 422A via the metal pad 440.

Figure 51:
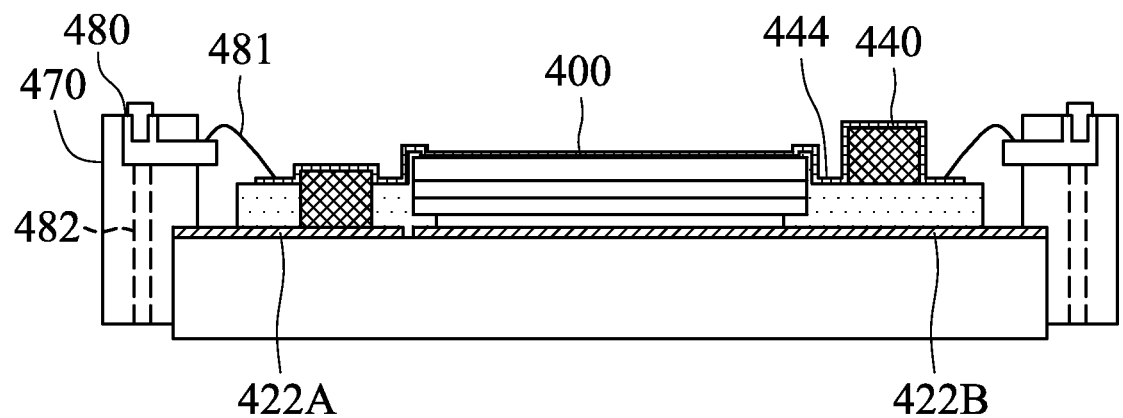
FIGS. 51 and 52 are cross-sections of light emitting diode package structures mounting on a frame according to other embodiments of the disclosure.
Figure 52:
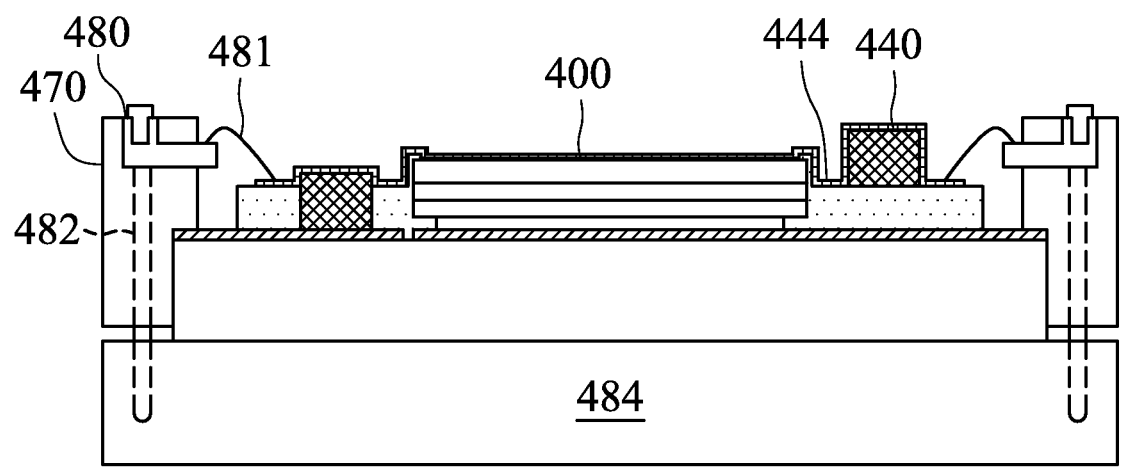

In some embodiments of the disclosure, a frame 470 can be further provided and the light emitting diode package structure 600 can be mounted inside of the frame 470, as shown in FIG. 51. Therefore, the frame can protect the light emitting diode package structure 600 from damage. Further, the frame 470 can include a metal connect 480 to respectively and electrically connect to the positive electrode and the negative electrode of the light emitting diode package structure 600 via a wire 481. The frame 470 can include a through hole for further mounting with a heat sink 484 via a plug 482, as shown in FIG. 52.

Figure 53:
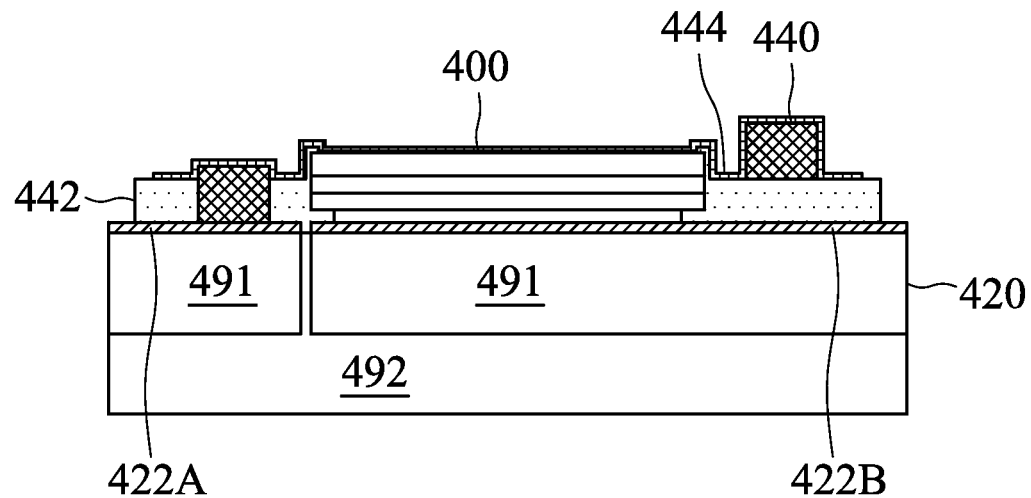
FIGS. 53 and 54 are cross-sections of zener light emitting diode package structures mounting on a frame according to other embodiments of the disclosure.
Figure 54:
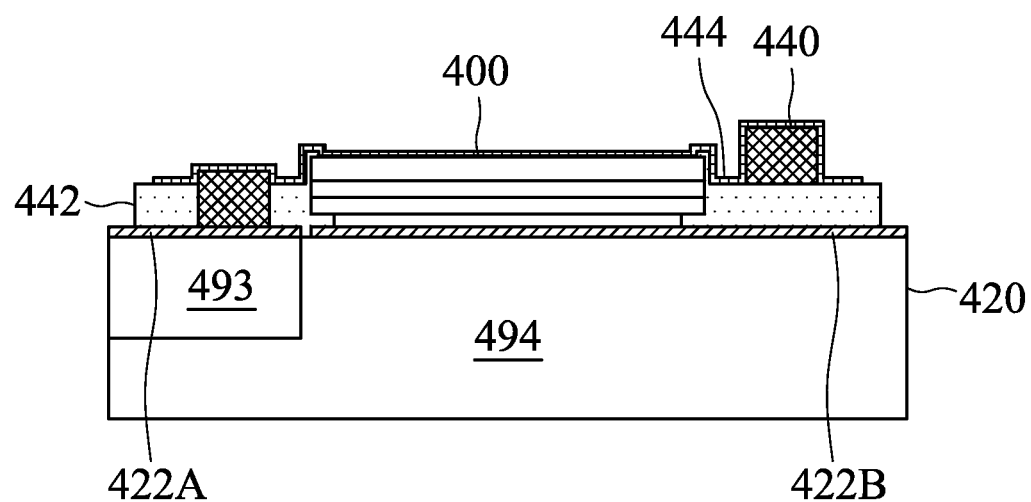

In some embodiments, the disclosure also provides a zener light emitting diode package structure 600 to achieve an ESD (electrostatic discharge) protection circuit and saving an isolation ($SiO_2$) coating (which increases the thermal resistance), as shown in FIGS. 53 and 54. As shown in FIG. 53, the carrier substrate 420 includes a first N+ type region 491A, a second N+ type region 491B, and a P type region 492. It should be noted that the contact pad 422A is disposed on the first N+ type region 491A and the contact pad 422B is disposed on the second N+ type region 491B. In another embodiment, the carrier substrate 420 includes a first P+ type region 493 and a N type region 494 (as shown in FIG. 54), and the contact pad 422A is disposed on the P+ type region 493 and the contact pad 422B is disposed on the N type region 494 for forming a zener light emitting diode package structure.

Figure 45:
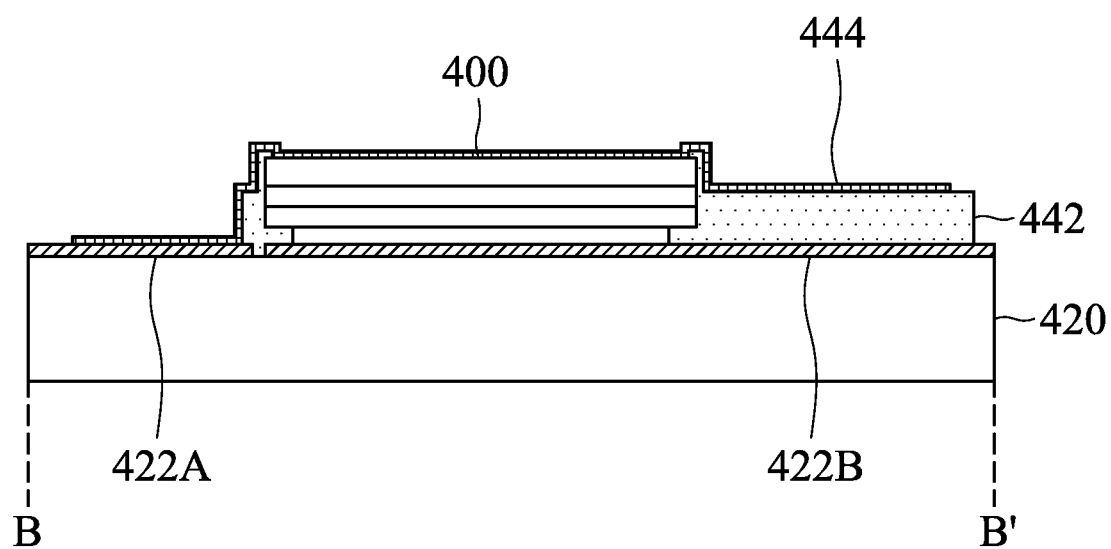
FIG. 45 is a cross-section of light emitting diode package structures combined with an electrode pattern design without light shading according to still another embodiment of the disclosure.
Figure 96:
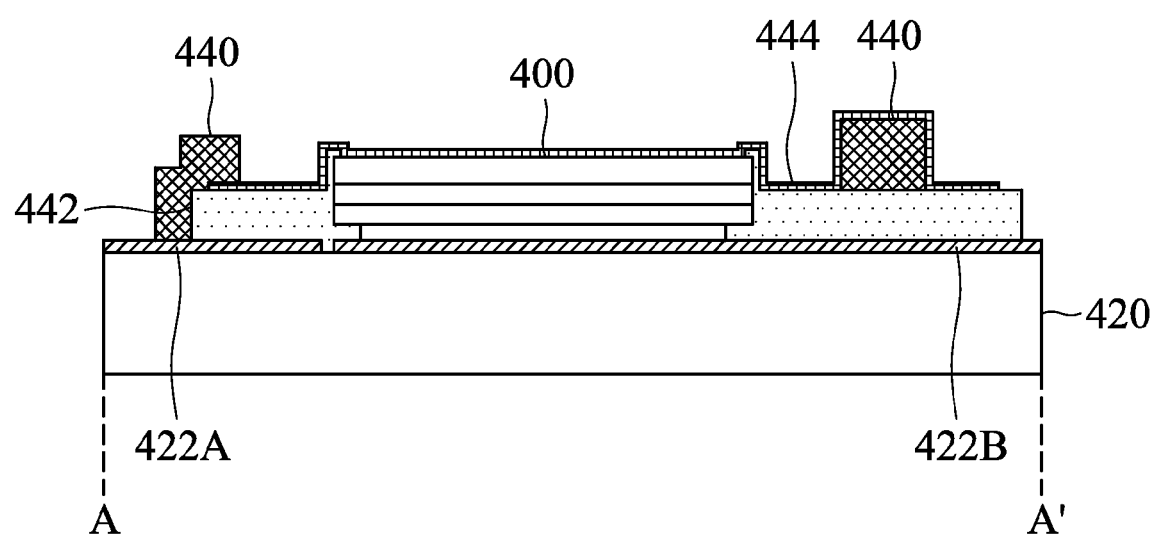
FIG. 96 is a cross-section of light emitting diode package structure combined with an electrode pattern design without light shading according to still another embodiment of the disclosure.

Accordingly, the light emitting diode chip with the connecting layer having a shrunken structure (or the light emitting diode chip with the connecting layer having an island structure) can be used to be combined with the electrode pattern design without light shading. FIG. 45 shows another embodiment of the diode package structure combined with the aforementioned electrode pattern design without light shading, wherein the difference between FIGS. 43 and 35 is that the transparent conductive layer 444 shown in FIG. 45 is directly formed on the contact pad 422A, and there is no metal pad 440 disposed between the transparent conductive layer 444 and the contact pad 422A. The carrier substrate shown in FIGS. 43 and 45 can be a sub-mount, and can be further combined with a lead frame, thereby simplifying process complexity and reducing process costs. In comparison with the package structure of FIG. 43, the package structure of FIG. 45 has the advantages of having simplified process complexity and reduced process costs. Further, due to the surrounding metal pad 440, the package structure of FIG. 43 exhibits improved current spreading. Moreover, the package structure of FIG. 34 employing a package substrate has the advantages of a smaller occupied area, and is suitable for being combined with a surface mount technology to enable automated production. Further, according to an embodiment of the disclosure, referring to FIG. 96, the transparent conductive layer 444 can be directly formed on the patterned isolation layer 442, and the surrounding metal pad 440 can be formed subsequently on the transparent conductive layer 444, thereby achieving an electrical connecting between the transparent conductive layer 444 and the contact pad 422A.

Figure 44A:
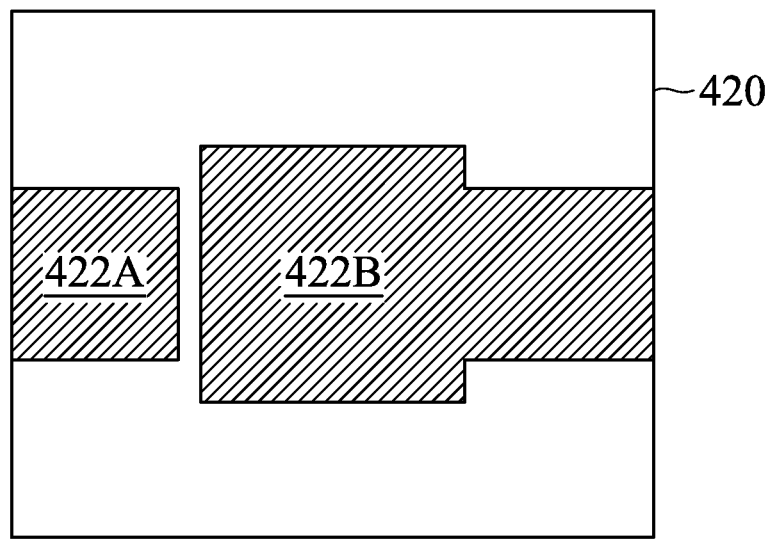
FIGS. 44A-44F are a series of top views showing the process for fabricating the light emitting diode package structure of FIG. 43.
Figure 44B:
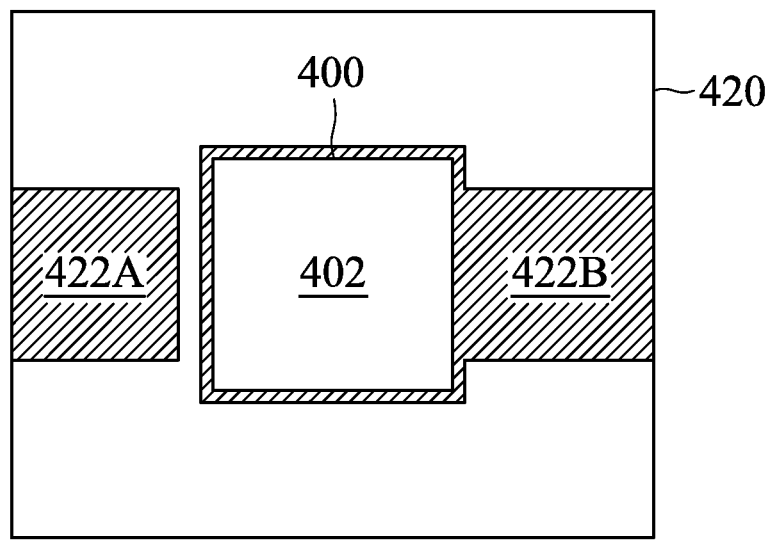
Figure 44C:
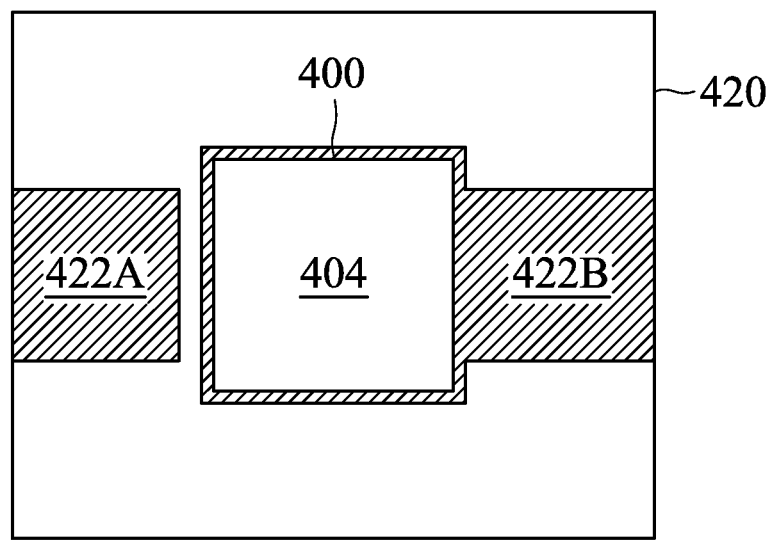
Figure 44D:
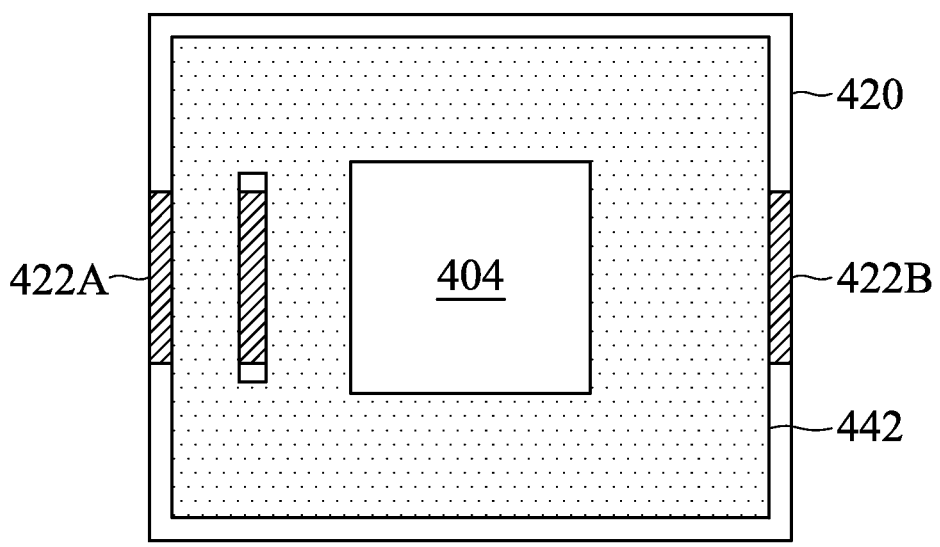
Figure 44E:
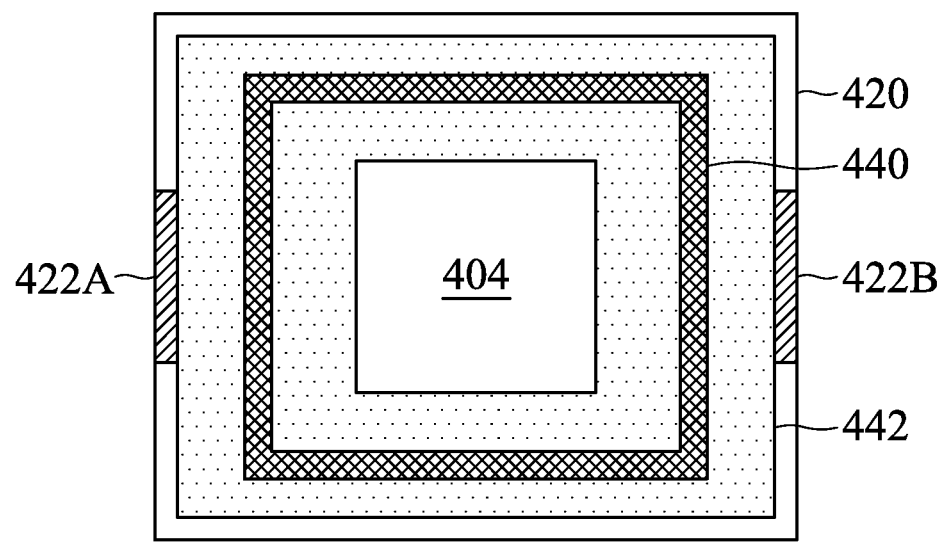
Figure 44F:
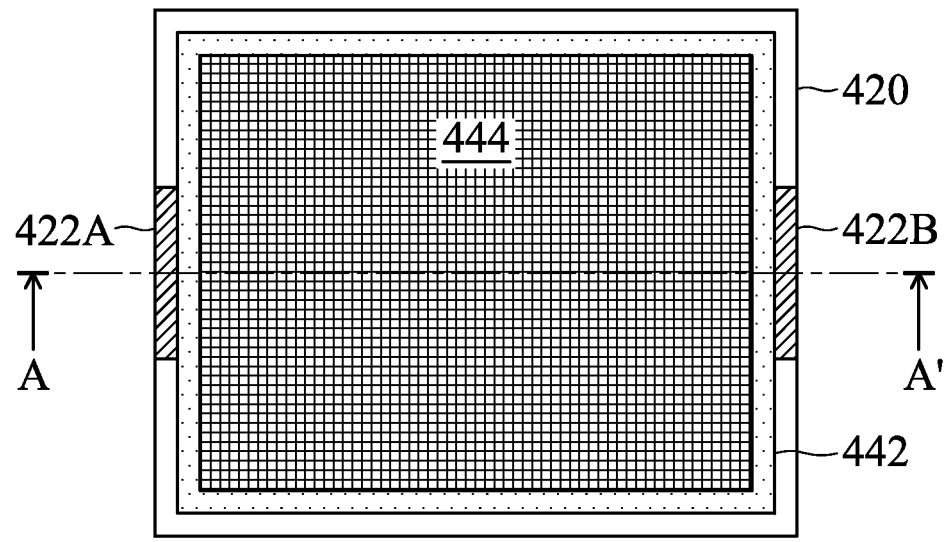

FIGS. 44A to 44F are a series of cross-sections showing the fabrication process of the light emitting diode package structure 600 of FIG. 43. First, a sub-mount 420 having a contact pad 422A and a contact pad 422B is provided, as shown in FIG. 44A, wherein the contact pad 422A and the contact pad 422B can be any shape and size that would prevent short circuits. Next, a light emitting diode chip 400 is disposed on the contact pad 422B via a bonding process, as shown in FIG. 44B. Next, the growth substrate 402 of the light emitting diode chip 400 is removed to expose the surface of the first semiconductor layer 404, as shown in FIG. 44C. Next, a patterned isolation layer 442 is formed on the sub-mount 420 to expose a part of the contact pad 422A (for electrical connection with a subsequently formed metal pad 440), as shown in FIG. 44D. Next, a metal pad 440 is formed on the substrate 420, wherein the metal pad 440 is filled into an opening surrounding by the surrounding layer 442 and directly contacted with the contact pad 422A. It should be noted that a part of the metal pad 440 and the contact pad 422B are separated by the surrounding layer 442, as shown in FIG. 44E. Finally, a transparent conductive layer 444 is formed on the metal pad 440 by sputtering, obtaining the light emitting diode package structure 600 as shown in FIG. 44F (FIG. 43 is a cross view along the section A-A' in FIG. 44F).

According to another embodiment of the disclosure, the transparent conductive layer of FIG. 43 can be formed to only cover the top surface of the light emitting diode chip, and a metal circuit can be formed on the sidewall of the light emitting diode chip and further connect to an external circuit. The metal circuit can include at least one metal line covering at least one sidewall of the light emitting diode chip, increasing the reliability, the luminous intensity, and the current distribution uniformity. Further, since the transparent conductive layer is friable, the metal circuit replaced with the transparent conductive layer formed on the sidewalls of the light emitting diode chip can improve the reliability (i.e. the reliability would not be effected by thermal expansion coefficient difference between the transparent conductive layer and the light emitting diode chip) and avoid the light shading by a metal circuit formed on the top surface of the light emitting diode chip.

Figure 46A:
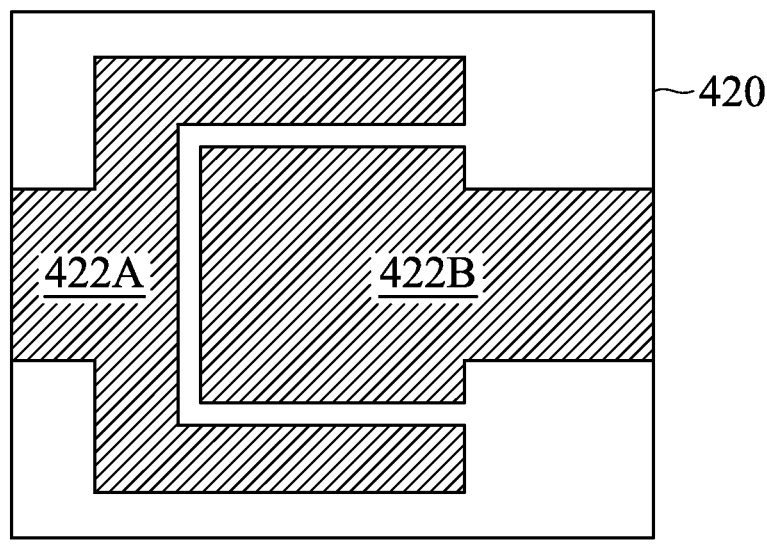
FIGS. 46A-46E are a series of top views showing the process for fabricating the light emitting diode package structure of FIG. 45.
Figure 46B:
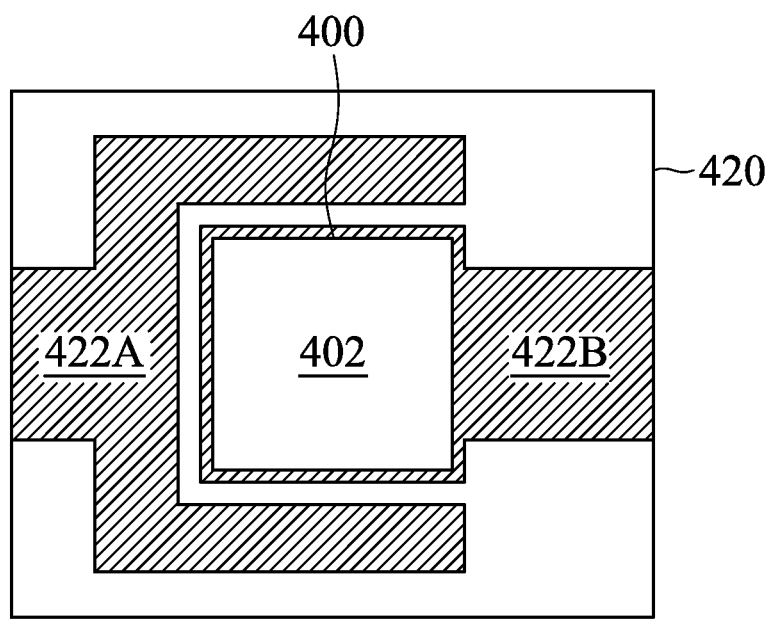
Figure 46C:
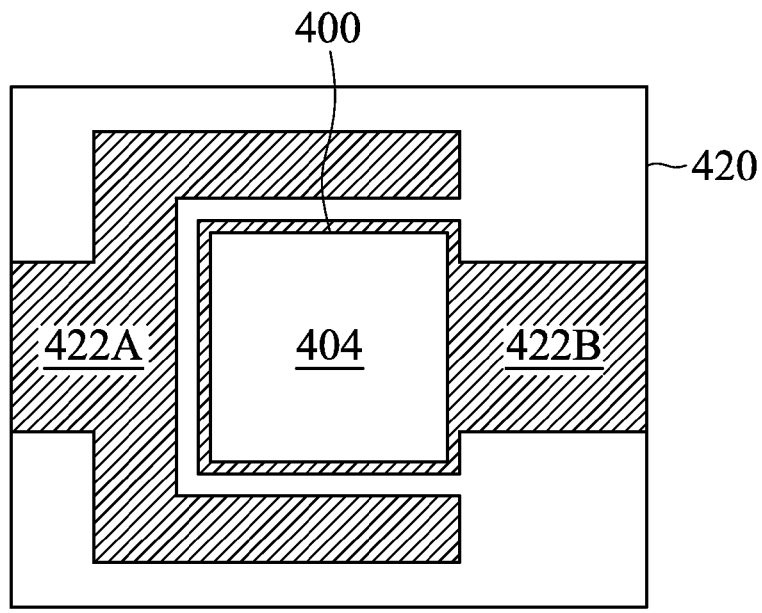
Figure 46D:
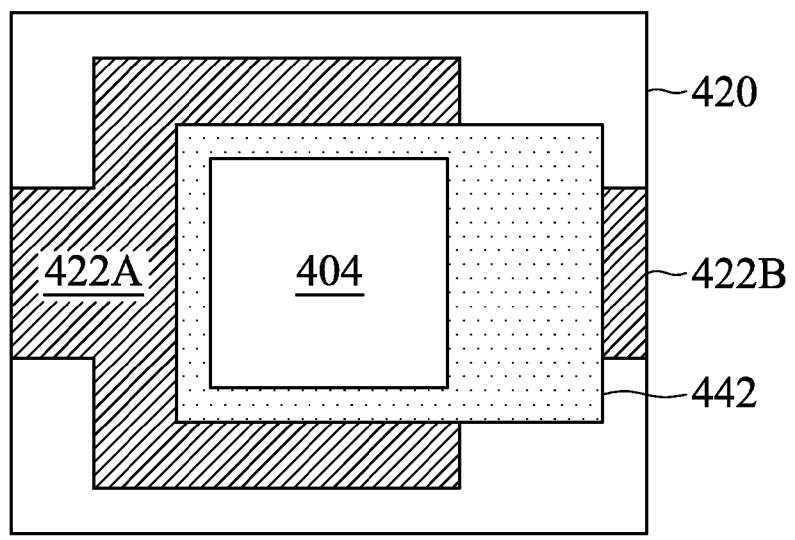
Figure 46E:
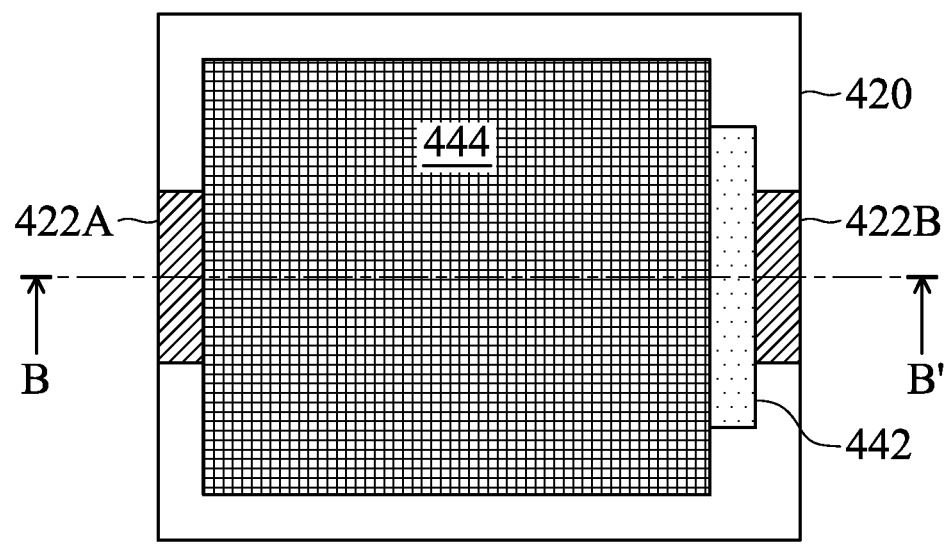
Figure 48:
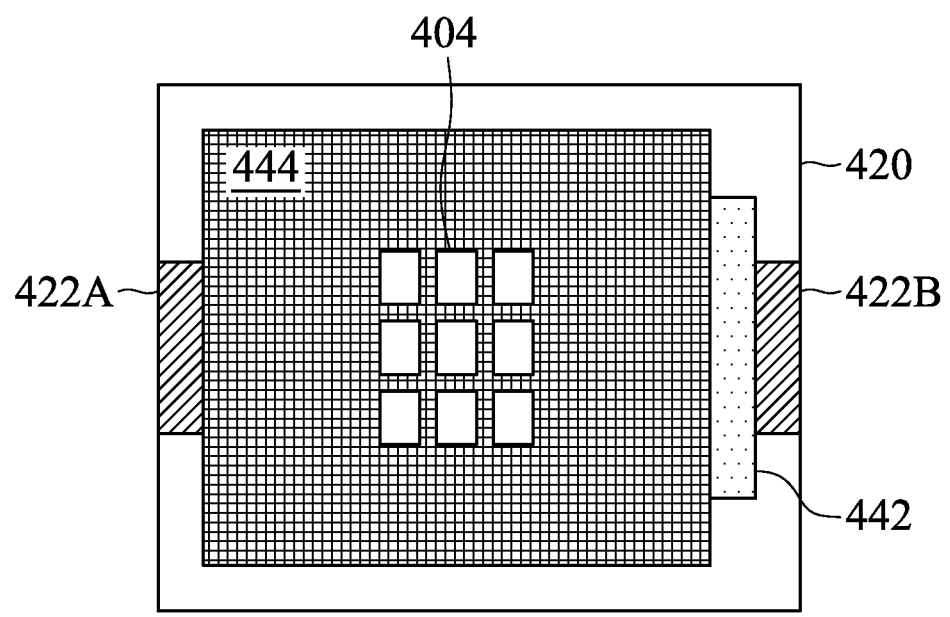
FIG. 48 is a top view showing the light emitting diode package structure according to another embodiment of the disclosure.

FIGS. 46A to 46E are a series of cross-sections showing the fabrication process of the light emitting diode package structure 600 of FIG. 45. First, a sub-mount 420 having a contact pad 422A and a contact pad 422B is provided, as shown in FIG. 46A, wherein the contact pad 422A and the contact pad 422B can be any shape and size that would prevent short circuits. Next, a light emitting diode chip 400 is disposed on the contact pad 422B via a bonding process, as shown in FIG. 46B. Next, the growth substrate 402 of the light emitting diode chip 400 is removed to expose the surface of the first semiconductor layer 404, as shown in FIG. 46C. Next, a patterned isolation layer 442 is formed on the sub-mount 420 to expose a part of the contact pad 422A (for electrical connection with a subsequently formed transparent conductive layer 444) and the top surface of the first semiconductor layer 404, as shown in FIG. 46D. Finally, a transparent conductive layer 444 is formed on the patterned isolation layer 442 to electrically contact with the exposed contact pad 422A by sputtering, obtaining the light emitting diode package structure 600 as shown in FIG. 46E (FIG. 45 is a cross view along the section B-B' in FIG. 46E). In another embodiment of the disclosure, the transparent conductive layer 444 can have a grid structure (exposing a part of the semiconductor layer 404 as shown in FIG. 48) to prevent light shielding effects resulting from the transparent conductive layer 444.

It should be noted that the transparent conductive layer 444 and the contact pad 422B are separated by the surrounding layer 442, as shown in FIG. 45.

The light emitting diode chip (i.e. the stacked structure of first semiconductor layer, the light emitting layer, and the second semiconductor layer) can be any shape (such as quadrilateral, pentagon, hexagonal, octagonal, or polygonal). In an embodiment of the disclosure, the profile of the light emitting diode chip can be circular (according to a best mode) and have improved current distribution uniformity in comparison with a conventional cube-shaped light emitting diode chip.

In some embodiments, the light emitting diode package structure of the disclosure can include a plurality of light emitting diode chips mounted on a carrier substrate. For example, the light emitting diode chips can be tandem arranged on the carrier substrate, and the light emitting diode package structure can be a tandem type light emitting diode package structure. FIGS. 49A to 49E are a series of cross-sections showing the fabrication process of a tandem type light emitting diode package structure.

Figure 49A:
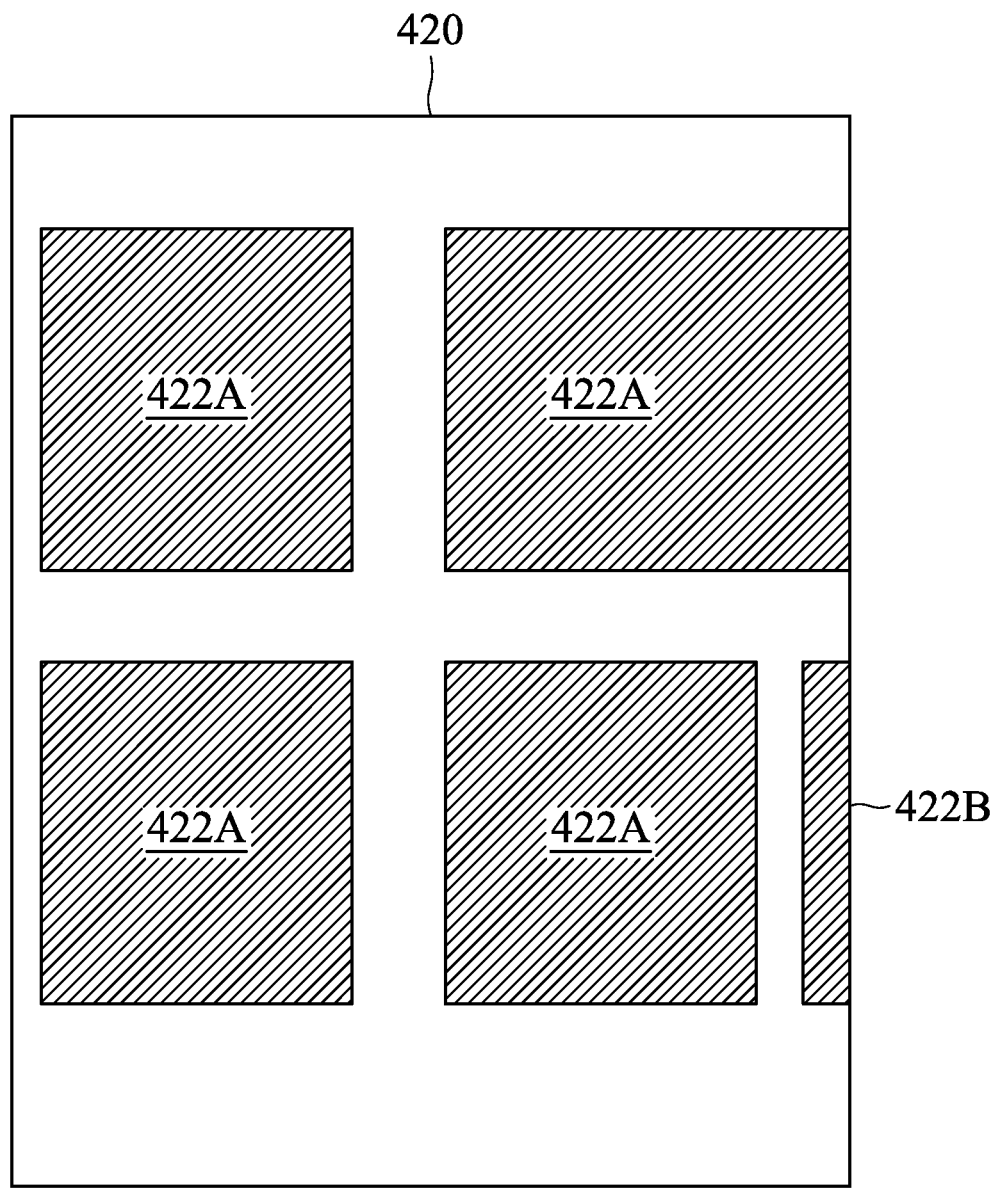
FIGS. 49A-49E are a series of top views showing the process for fabricating a tandem type light emitting diode package structure according to another embodiment of the disclosure.
Figure 49B:
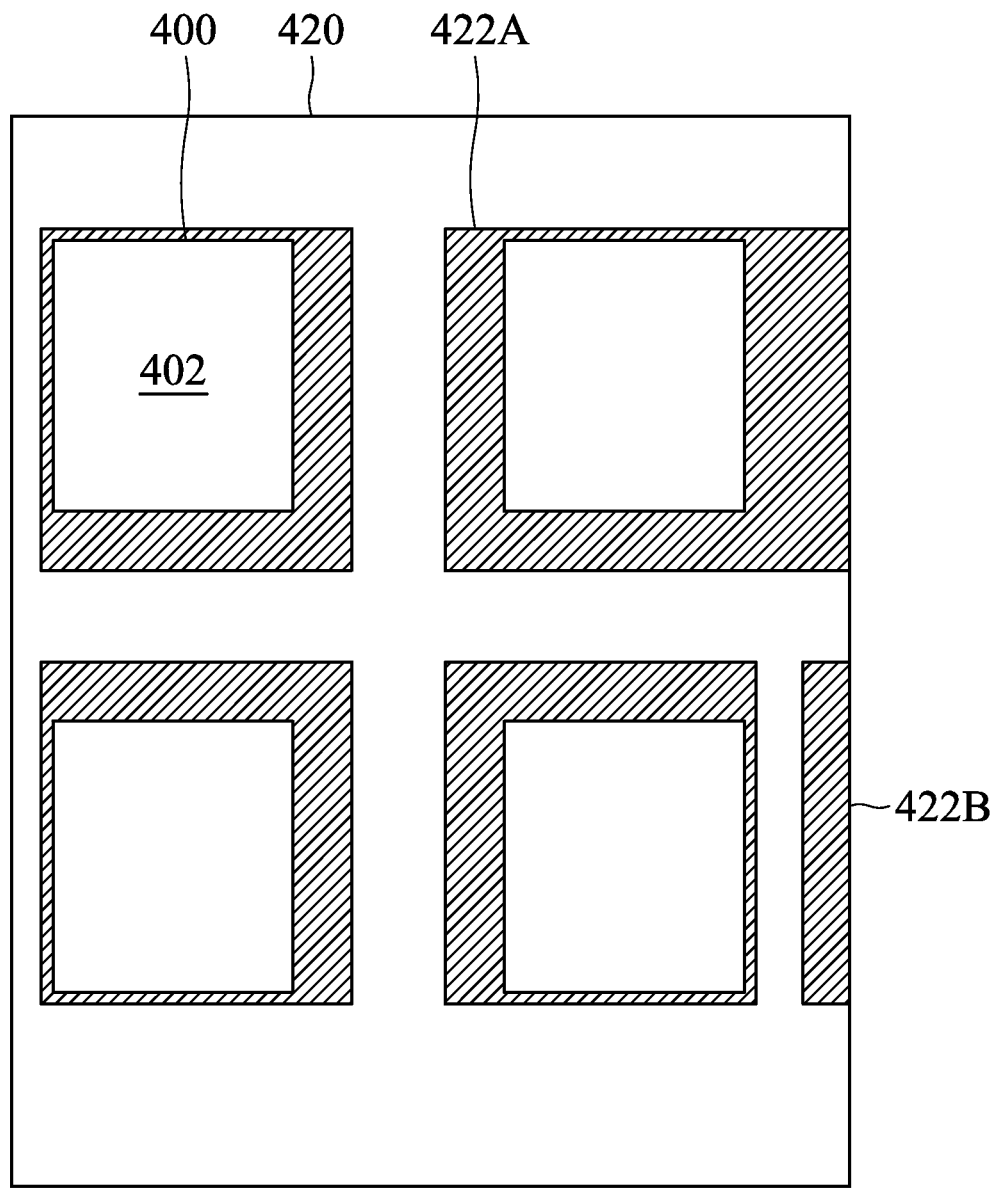
Figure 49C:
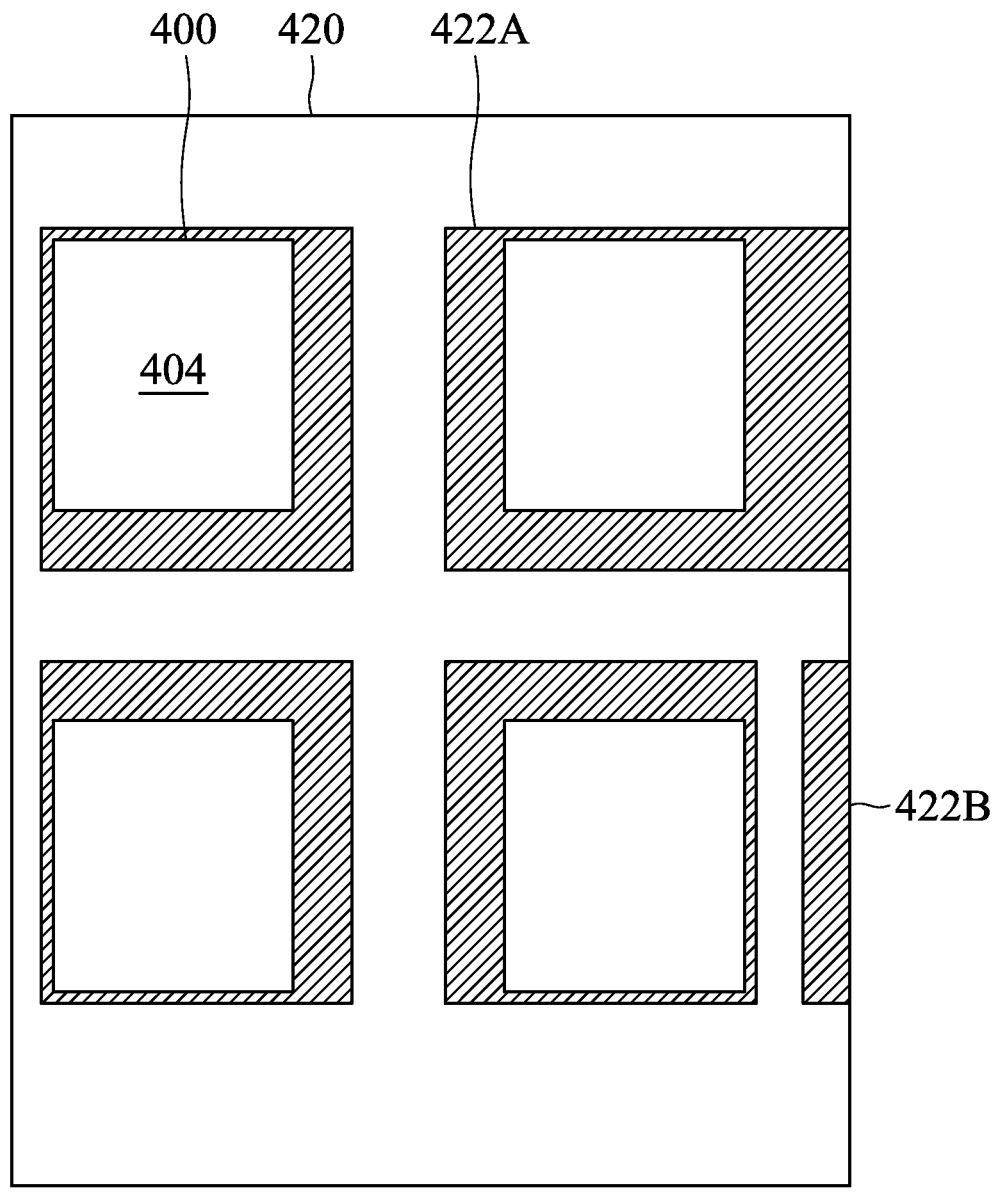
Figure 49D:
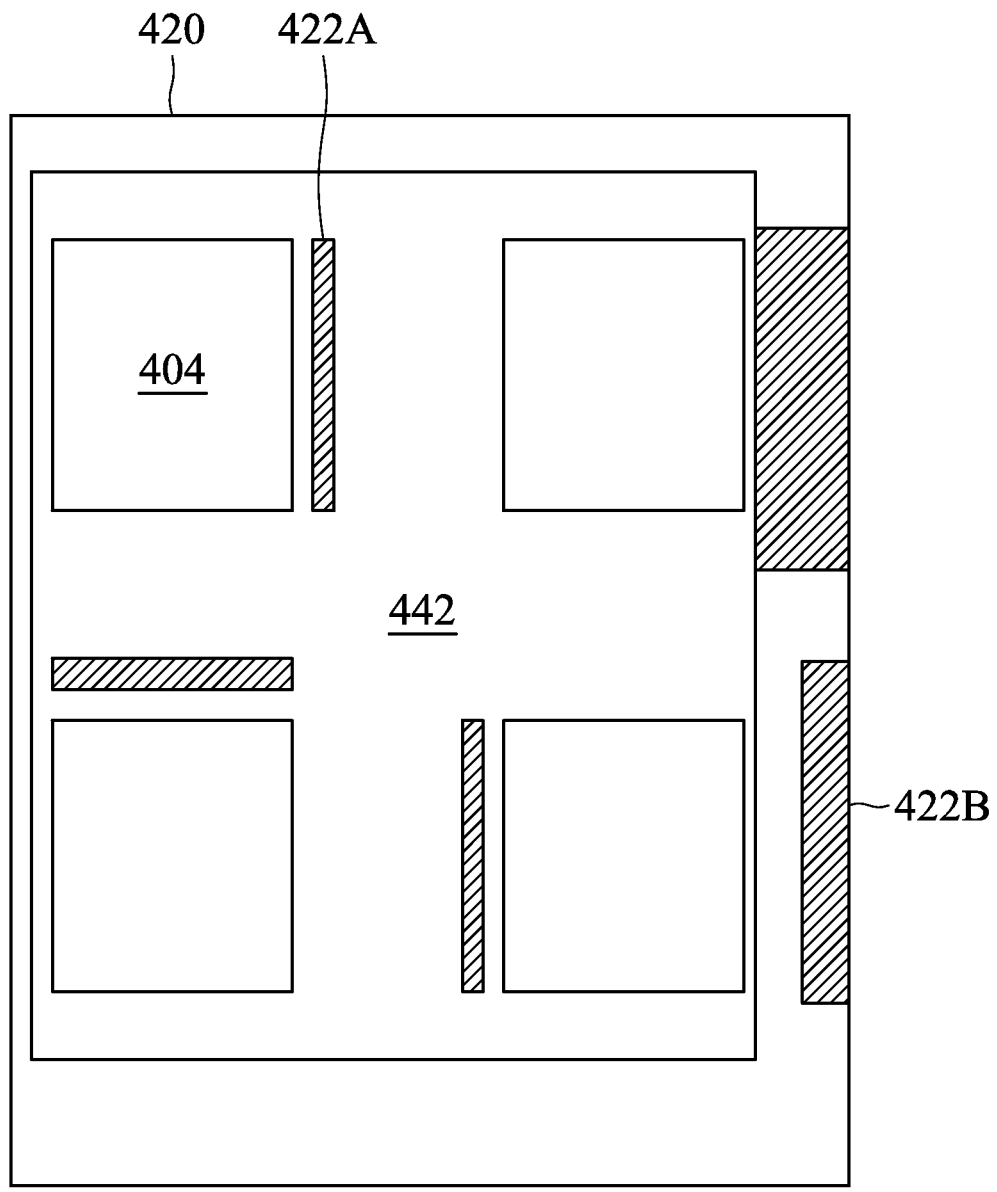
Figure 49E:
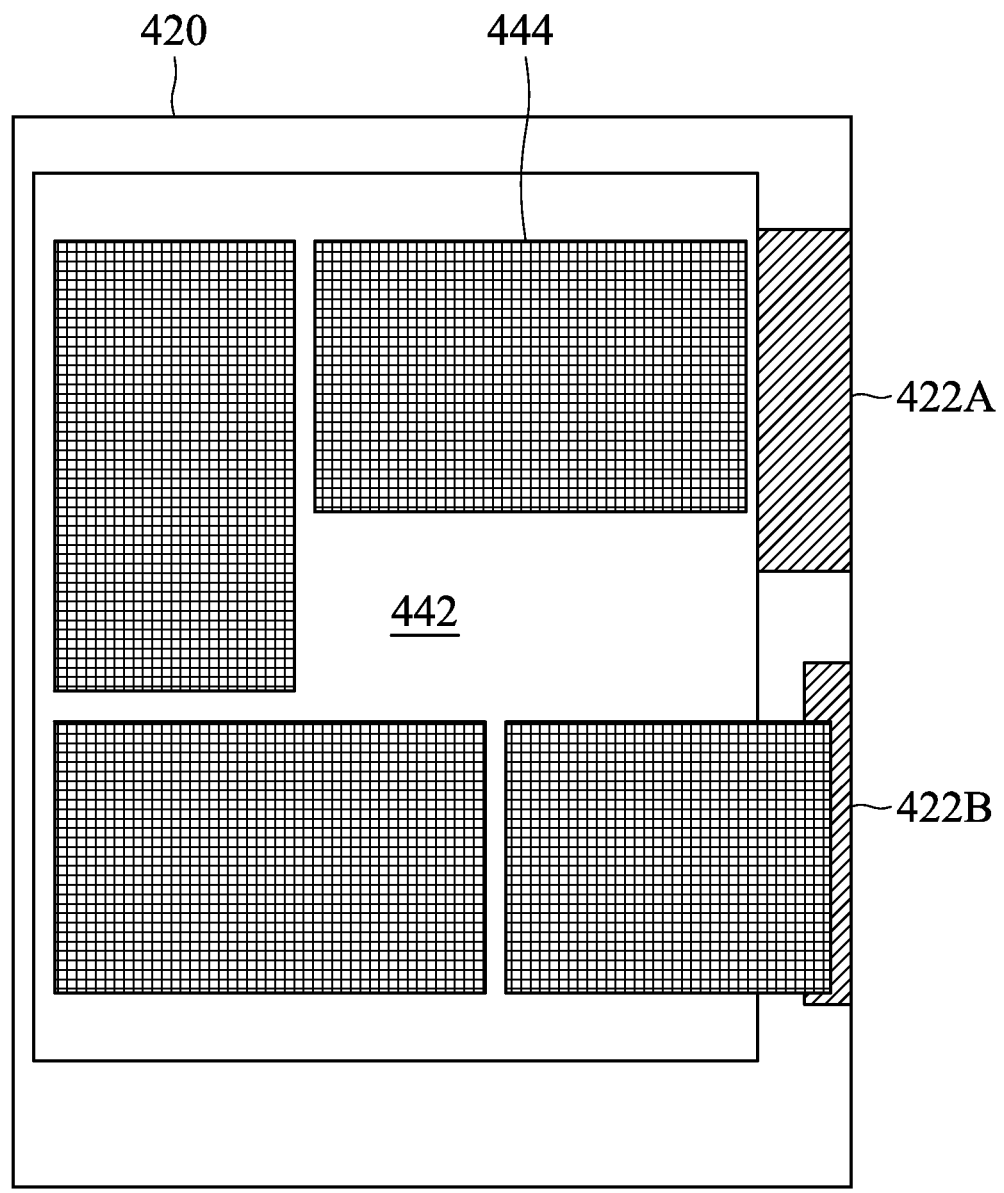

First, a carrier substrate 420 having a plurality of contact pads 422A and a contact pad 422B is provided, as shown in FIG. 49A, wherein the contact pads 422A and the contact pad 422B can be any shape and size that would prevent short circuits. Next, four light emitting diode chips 400 are respectively disposed on the contact pad 422A via a bonding process, as shown in FIG. 49B. Next, the growth substrate 402 of the light emitting diode chip 400 is removed to expose the surface of the first semiconductor layer 404, as shown in FIG. 49C. Next, a patterned isolation layer 442 is formed on the carrier substrate 420 to expose a part of each contact pad 422A and the top surface of the first semiconductor layer 404 of each light emitting diode 400, as shown in FIG. 49D. Finally, a plurality of transparent conductive layers 444 are formed on the surrounding layer 442 by sputtering, obtaining the tandem type light emitting diode package structure. It should be noted that a first light emitting diode chip is electrically connected to the exposed contact pad 422A of a second light emitting diode chip via the transparent conductive layers 444, the second light emitting diode chip is electrically connected to the exposed contact pad 422A of a third light emitting diode chip via the transparent conductive layers 444, the third light emitting diode chip is electrically connected to the exposed contact pad 422A of a fourth light emitting diode chip via the transparent conductive layers 444, and the fourth light emitting diode chip is electrically connected to the contact pad 422B via the transparent conductive layers 444.

Further, in some embodiments of the disclosure, the light emitting diode chips can be parallel connected on the carrier substrate, and the light emitting diode package structure can be a parallel connection type light emitting diode package structure. FIGS. 50A to 50E are a series of cross-sections showing the fabrication process of a parallel connection type light emitting diode package structure.

Figure 50A:
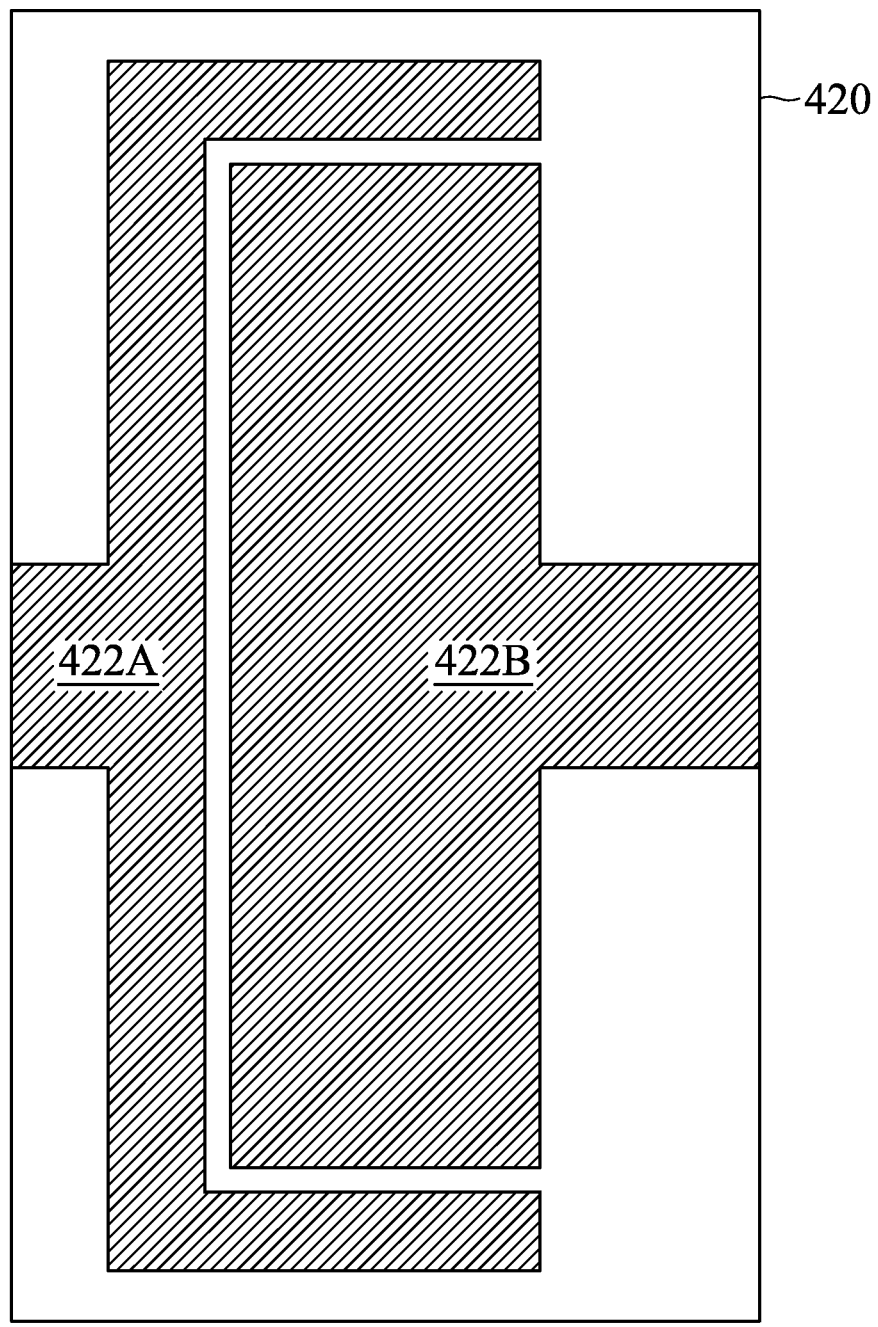
FIGS. 50A-50E are a series of top views showing the process for fabricating a parallel connection type light emitting diode package structure according to another embodiment of the disclosure.
Figure 50B:
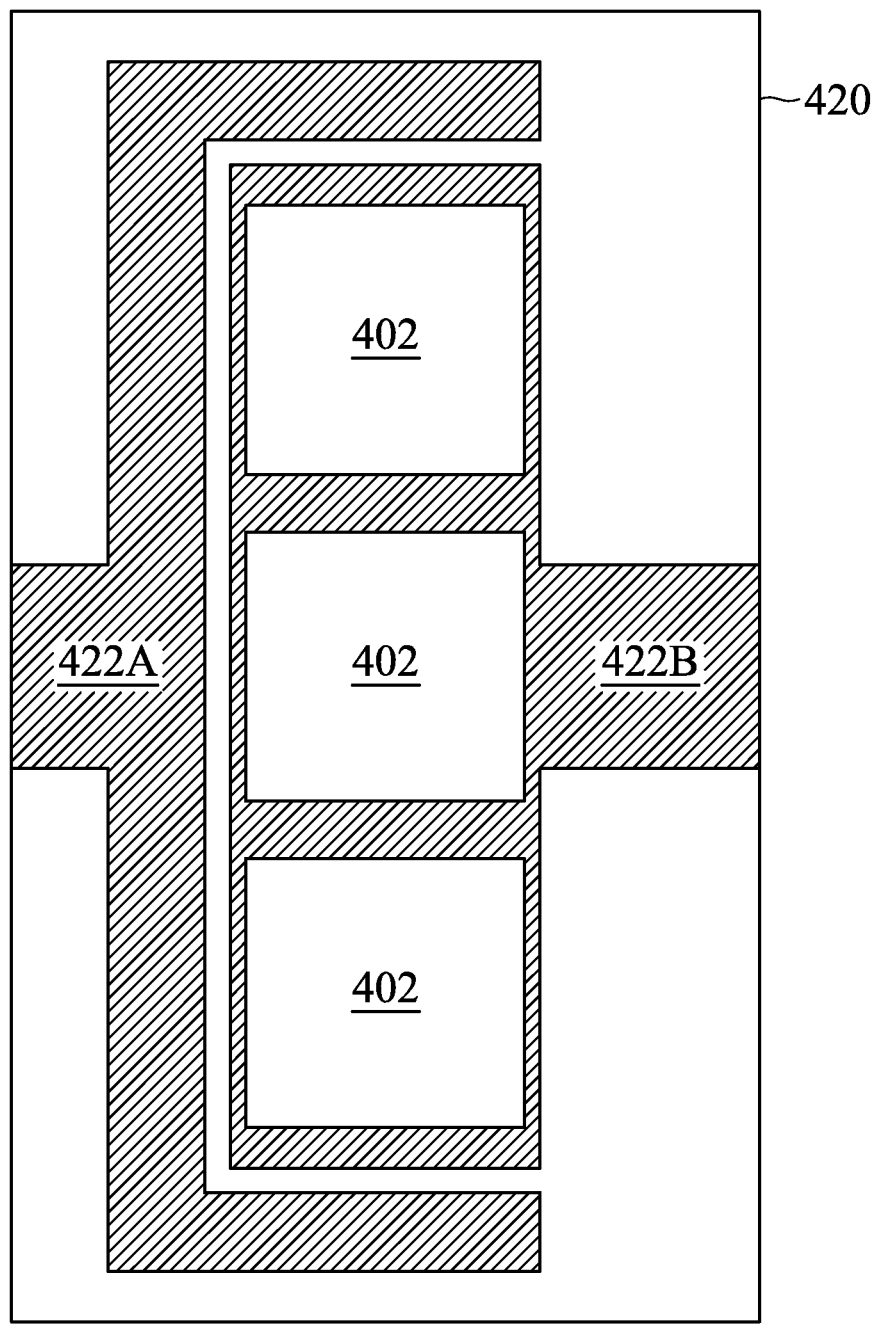
Figure 50C:
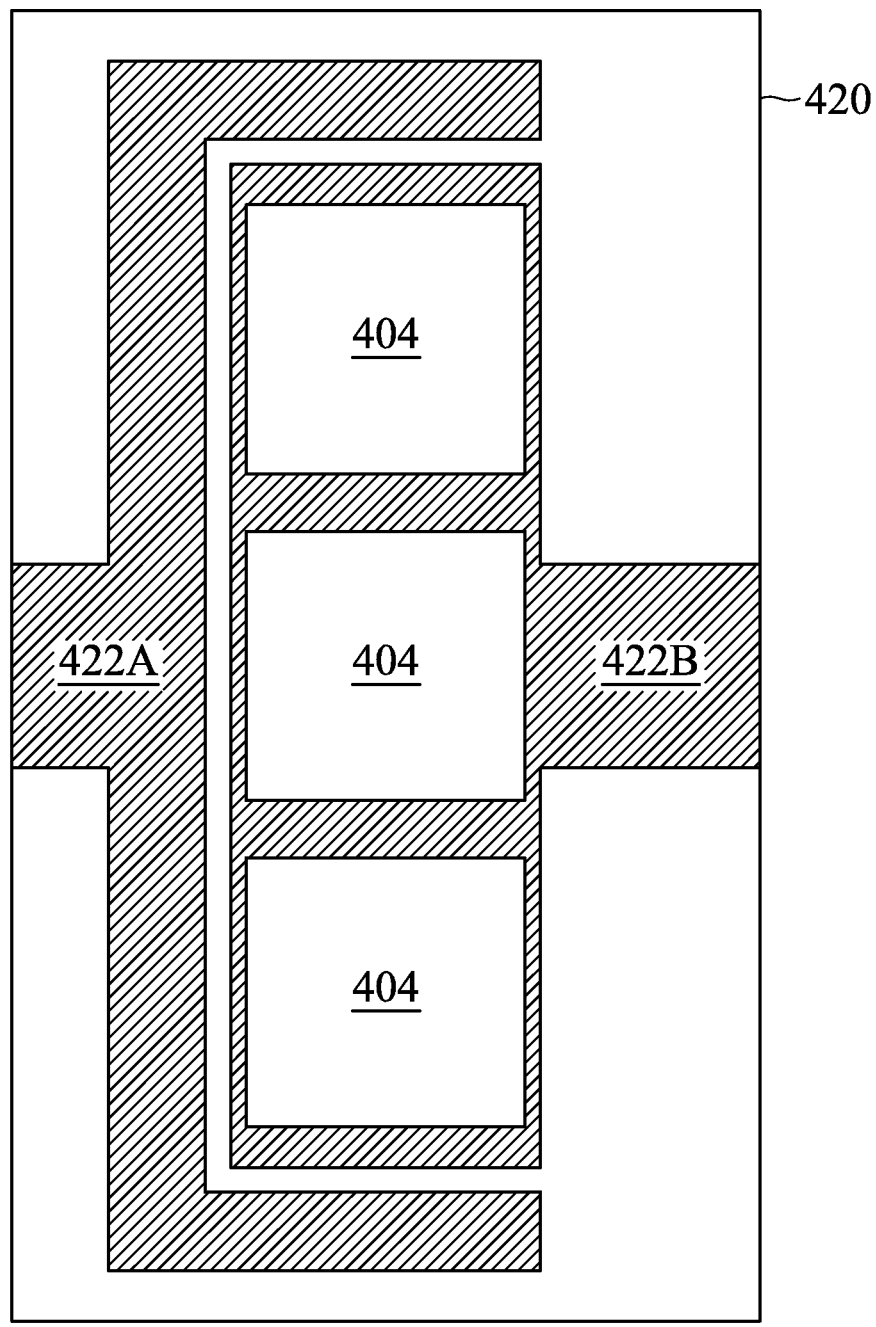
Figure 50D:
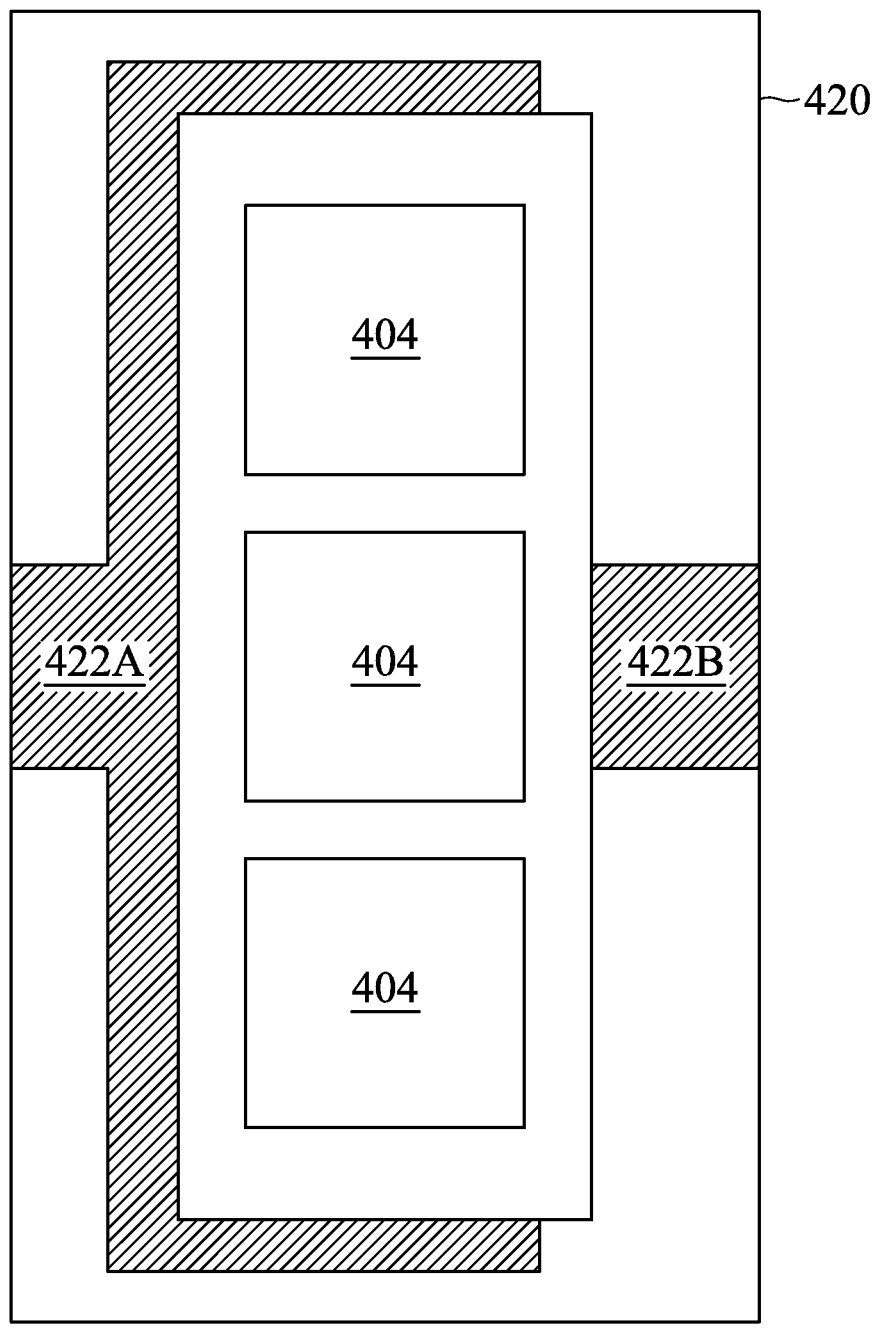
Figure 50E:
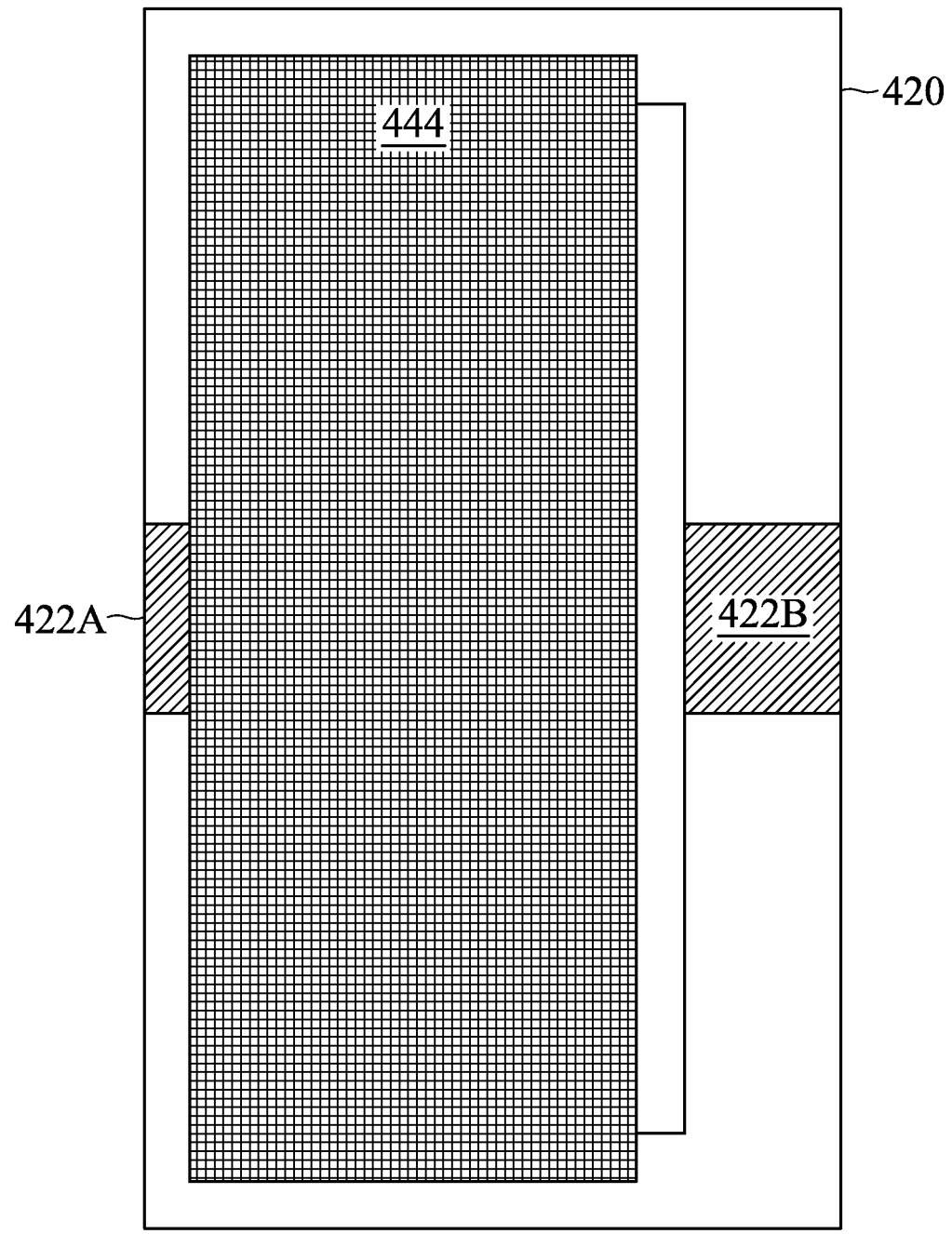

FIGS. 50A to 50E are a series of cross-sections showing the fabrication process of a parallel connection type light emitting diode package structure. First, a carrier substrate 420 having a contact pad 422A and a contact pad 422B is provided, as shown in FIG. 50A, wherein the contact pad 422A and the contact pad 422B can be any shape and size that would prevent short circuits. Next, three light emitting diode chips 400 are disposed on the contact pad 422B via a bonding process, as shown in FIG. 50B. Next, the growth substrate 402 of the light emitting diode chip 400 is removed to expose the surface of the first semiconductor layer 404, as shown in FIG. 50C. Next, a patterned isolation layer 442 is formed on the carrier substrate 420 to expose a part of the contact pad 422A and the top surface of the first semiconductor layer 404 of each light emitting diode 400, as shown in FIG. 50D. Finally, a transparent conductive layer 444 is formed on the patterned isolation layer 442 to electrically contact the exposed contact pad 422A with the three light emitting diode chips by sputtering, obtaining the parallel connection type light emitting diode package structure 600 as shown in FIG. 50E. Moreover, in some embodiments of the disclosure, the light emitting diode package structure can be a hybrid of the tandem type light emitting diode package structure and the parallel connection type light emitting diode package structure.

Accordingly, the disclosure uses the light emitting diode chip with a connecting layer having an island structure or a shrunken structure to bond with a carrier substrate, preventing current leakage from occurring. Further, since the disclosure employs a ship to wafer bonding process (further combining a specific nozzle to chuck the chip), the light emitting diode package structure has improved current distribution uniformity.

Figure 55:
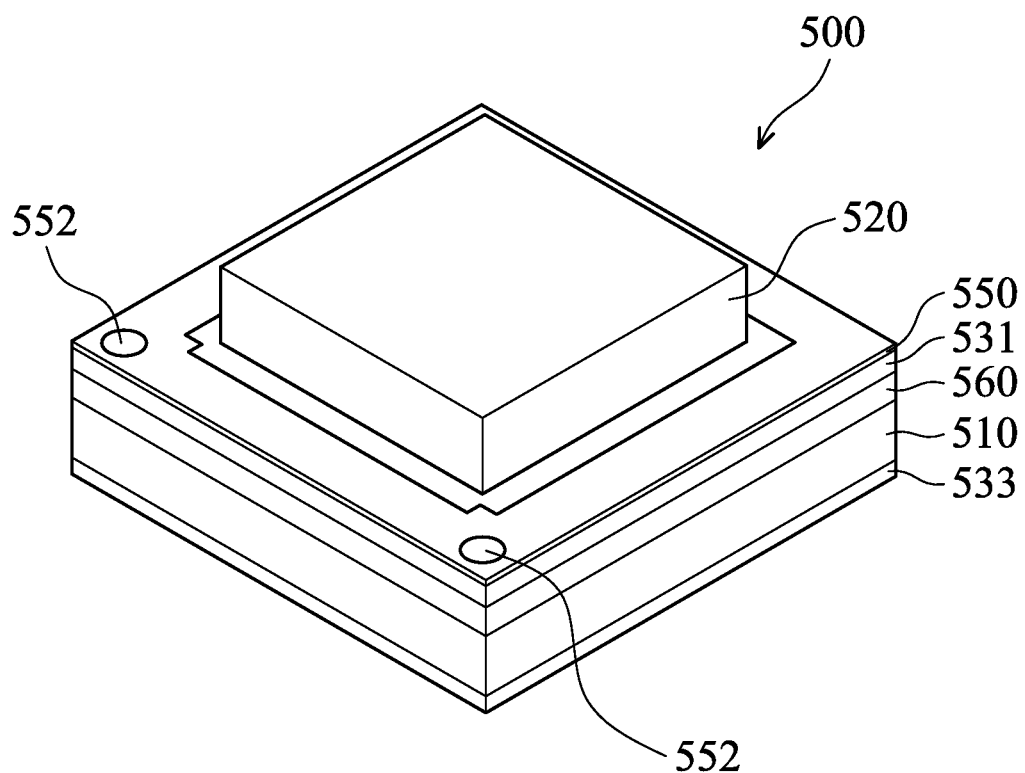
FIG. 55 is a diagram showing a light emitting diode (LED) structure according to a preferred embodiment.
Figure 56:
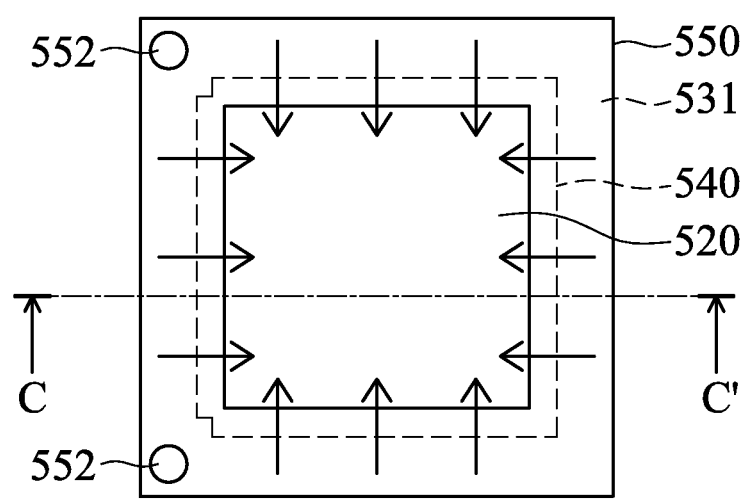
FIG. 56 is a diagram showing the top view of the LED structure in FIG. 55.
Figure 57:
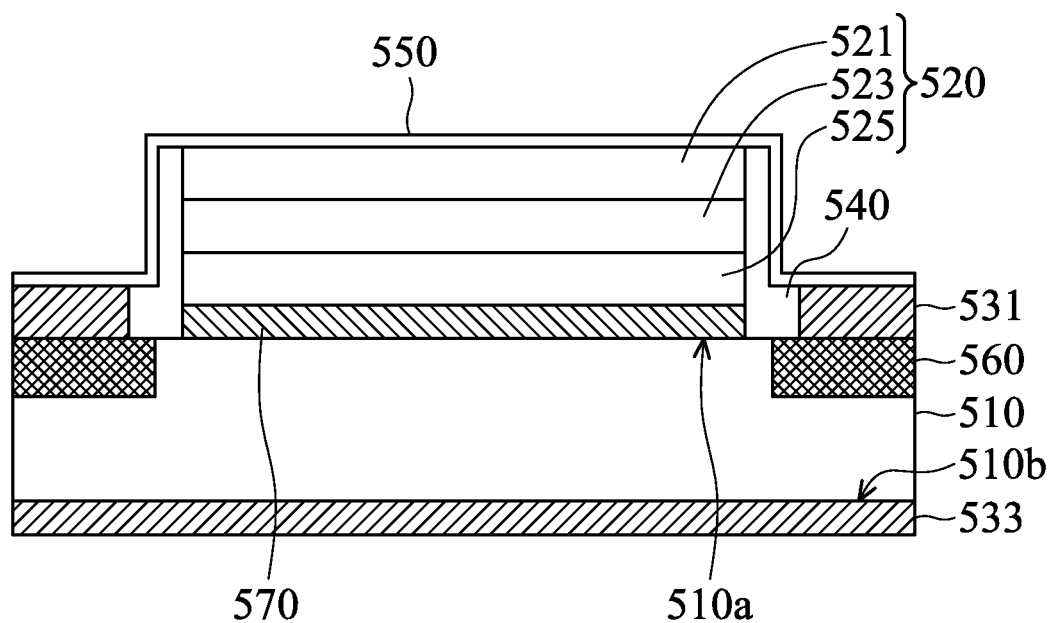
FIG. 57 is a diagram showing the c-c' cross-sectional view of the LED structure in FIG. 55.

FIG. 55 is a diagram showing a light emitting diode (LED) structure 500 according to a preferred embodiment. FIG. 56 is a diagram showing the top view of the LED structure 500 in FIG. 55. FIG. 57 is a diagram showing the c-c' cross-sectional view of the LED structure 500 in FIG. 55. The LED structure 500 includes a sub-mount 510, a stacked structure 520, an electrode 531, an isolation layer 540 and a conductive thin film layer 550. As shown in FIG. 57, the sub-mount 510 has a first surface 5100A and a second surface 5100B opposite the first surface 5100A. The stacked structure 520 has a first semiconductor layer 521, an active layer 523 and a second semiconductor layer 525 that are laminated on the first surface 510a. The electrode 531 is disposed apart from the stacked structure 520 on the first surface 510a. The isolation layer 540 surrounds the stacked structure 520 as well as covers the lateral sides of the stacked structure 520 on the first surface 510a. The conductive thin film layer 550 connects the electrode 531 to the stacked structure 520.

In the embodiment, the conductive thin film layer 550 covers the electrode 130, the isolation layer 540 and the stacked structure 520, for example, for electrically connecting the electrode 531 to the stacked structure 520. Yet in another example, the conductive thin film layer 550 can cover a part of the electrode 531. Furthermore, a plurality of metal pads 552 as shown in FIG. 55 are disposed on the conductive thin film layer 550 to assist the conductive thin film layer 550 in connecting with metal bumps. The metal pads 552 can be formed on the conductive thin film layer 550 by plating. Or, the conductive thin film layer 550 can be partially removed by, for example, etching, to expose parts of the electrode 531, such that the exposed parts of the electrode 531 can be used as the metal pads 552.

In the embodiment, although the isolation layer 540 surrounds all the lateral sides of the stacked structure 520 (shown in FIG. 57) and the conductive thin film layer 550 covers the isolation layer 540 and the stacked structure 520, the invention is not limited thereto. The isolation layer 540 can cover the lateral sides of the active layer 523 and up to the second semiconductor 525. Such an arrangement suffice to overcome the short-circuiting of the stacked structure 520. Besides, the isolation layer 540 can merely be disposed along three lateral sides of the stacked structure 520, and the conductive thin film layer 550 can just cover a part of the isolation layer 540 and the stacked structure 520.

The LED structure 500 further includes another electrode 533 and an interface layer 570. The LED structure can optionally include an electrostatic discharge (ESD) protection element. The ESD protection element 560 can be disposed under the electrode 531 and embedded in the sub-mount 510. The electrode 533 is disposed on the second surface 510b of the sub-mount 510. The interface layer 570 is disposed between the stacked structure 520 and the sub-mount 510.

The active layer 523 has a p-n junction region for emitting light when applied by a bias voltage, and the first and second semiconductor layers 521, 525 are used as cladding layers for the active layer 523. In the preferred embodiment, the first semiconductor layer 521 is a single layer that includes, for example, an n-type semiconductor such as n-GaN, and the second semiconductor layer 525 is also a single layer that includes, for example, a p-type semiconductor such as p-GaN. However, the invention is not limited thereto. Each of the first and second semiconductor layers 521, 525 can also be a multi-layer structure, such as a NPN structure or a PNP structure.

Figure 58:
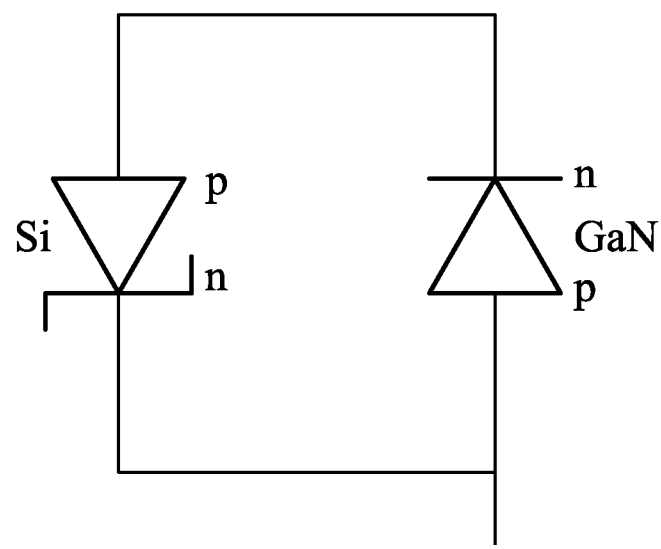
FIG. 58 is a circuit diagram showing the electrical connection of the stacked structure, the sub-mount and the ESD protection element.

In the embodiment, the electrode 531 is disposed along all the lateral sides of the stacked structure 520, as shown in FIG. 56. The material of the electrodes 531 and 533 is, for example, metal, such as Cu, Ag, Au etc. Since the electrodes 531 and 533 are disposed on two opposite sides (shown in FIG. 57) of the sub-mount 510, the sub-mount 510 is preferably conductive. For example, the material of the sub-mount 510 is a doped semiconductor. Further considering the composition of the stacked structure 520, the sub-mount 510 is preferably formed by n-type silicon. And the material of the ESD protection element 560 is preferably a p-type silicon, so as to form a p-n junction with the sub-mount 510. FIG. 58 is a circuit diagram showing the electrical connection of the stacked structure, the sub-mount and the ESD protection element. The p-n junction between the ESD protection element 560 and the sub-mount 510 is served as a Zener diode that requires a high reverse bias voltage to cross, so the ESD protection element 540 is capable of avoiding electric current flowing in the direction from the sub-mount 510 to the electrode 531, hence providing an ESD protection function for the LED structure 500.

In addition, as the electrode 531 is disposed along all the lateral sides of the stacked structure 520, the stacked structure 520 is not covered by the electrode 531 and its whole top surface is served as light emitting area, producing the largest light emitting effect.

The electrode 533 is disposed on the opposite side to the electrode 531 in the embodiment. However, the electrode 533 also can be disposed on the same side as the electrode 531 and spaced apart from the electrode 531 to avoid unnecessary electrical connection. In such case, the material of the sub-mount 510 is not limited to be the conductive materials. The material of sub-mount can be formed by any un-doped semiconductor or ceramic material.

The material of the isolation layer 540 disposed between the electrode 531 and the stacked structure 520 is, for example, silicon oxide for preventing the stacked structure 520 from directly connecting the electrode 531. The light transmittance of the conductive thin film layer 550 for a primary wavelength of the light generated by the active layer 523 is greater than 60%. In addition, the material of the conductive thin film layer 550 is selected from one group consisted of $In_2O_3$, $SnO_2$, ZnO, CdO, TiN, $In_2O_3$:Sn(ITO), ZnO:In(IZO), ZnO:Ga(GZO), ZnO:Al(AZO), $SnO_2$:F, $TiO_2$:Ta, $In_2O_3$—ZnO, $CdIn_2O_4$, $Cd_2SnO_4$, $Zn_2SnO_4$, $Mg(OH)_2$—C, ITO, IZO, GZO, AZO, ATO, FTO, NiO, and an allay consisted of the above elements. Preferably, the material of the conductive thin film layer 550 is selected from one group consisted of ITO, IZO, GZO, AZO, ATO, FTO, NiO, and an alloy consisted of the above elements. The interface layer 570 between the stacked structure 520 and the sub-mount 510 can serve as an adhesive layer and/or as a reflector layer in the LED structure 500. The interface layer 570 can provide both an adhesive function and a reflective function for the stacked structure 520. For example, the interface layer 570 can additionally includes a metal reflector for reflecting the light generated by the active layer 523. Moreover, the interface layer 570 further includes an adhesive for combining the stacked structure 520 and the sub-mount 510.

It is noted that, since the electrode 531 is disposed along all the lateral sides of the stacked structure 520 and is electrically connected to the stacked structure 520 by the conductive thin film layer 550, electric current flows inwardly in the direction from the electrode 531 to the stacked structure 520 when voltage is applied to the electrodes 531 and 533, avoiding the electric current concentrating on a single portion of the stacked structure 520. Thus, the energy loss of the applied voltage is reduced, and the energy usage is enhanced accordingly.

Figure 59:
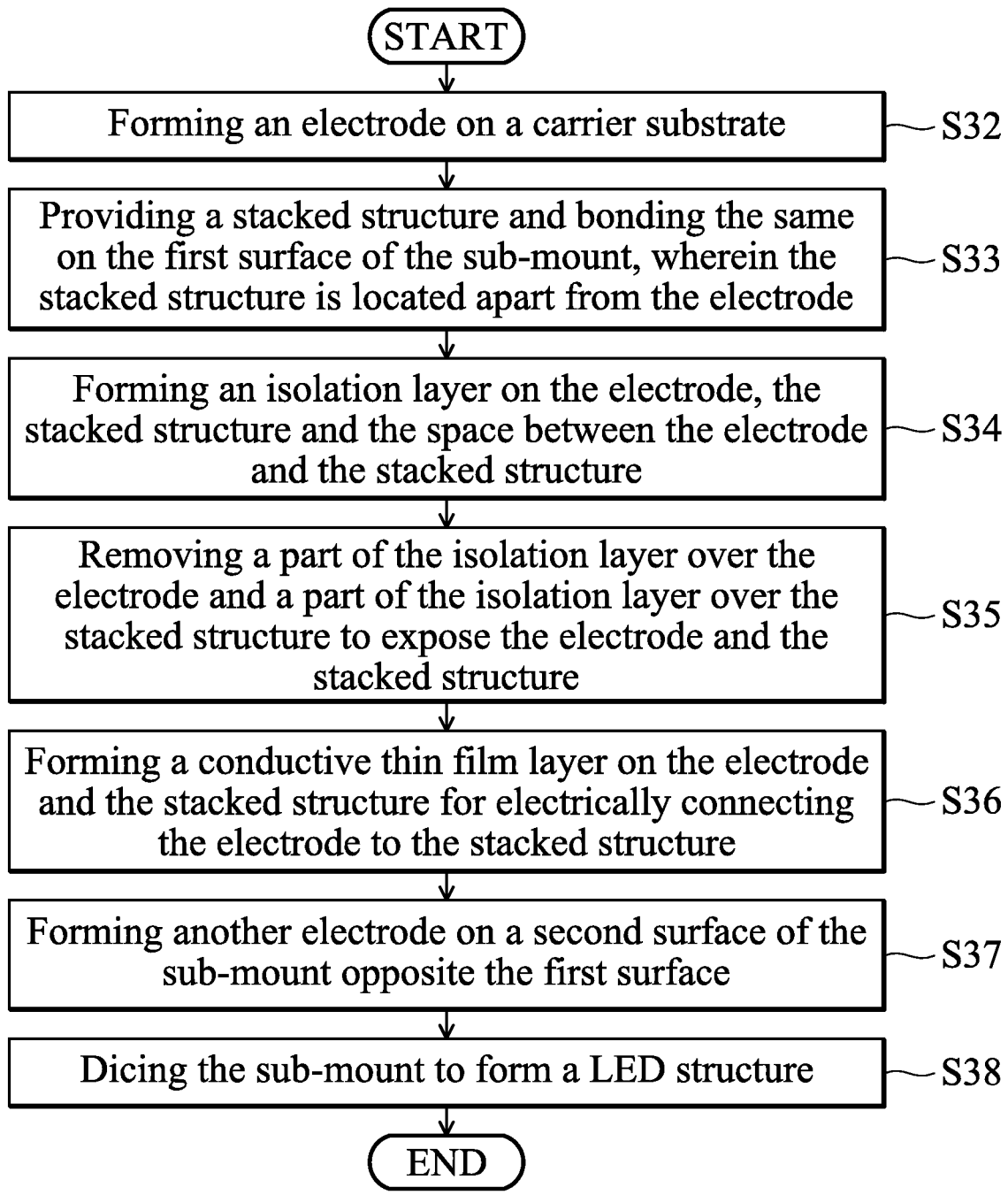
FIG. 59 is a flowchart showing a method of forming a LED structure according to a preferred embodiment.

FIG. 59 is a flowchart showing a method of forming a LED structure according to a preferred embodiment. The method includes steps S31 to S38 elaborated in the following accompanying with FIGS. 61A to 61G that sequentially show the formation of a LED structure in accordance with the steps of the method in FIG. 59.

Figure 61A:
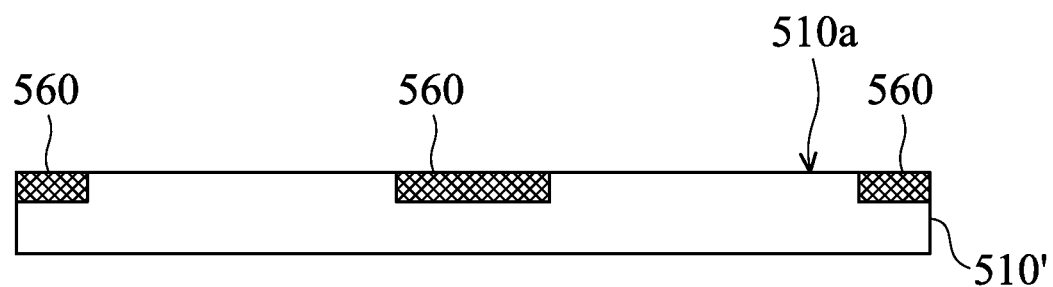
FIGS. 61A to 61G are diagrams sequentially showing the formation of a LED structure in accordance with the steps of the method in FIG. 59.
Figure 61B:
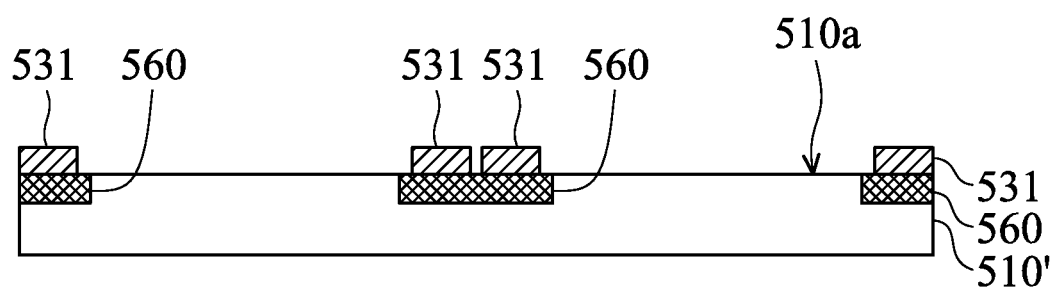

In step S32, an electrode is formed on a carrier substrate, wherein the electrode is disposed along the edges of a first surface on the carrier substrate and is embedded in the sub-mount. Further, an ESD protection element can be optionally formed between the carrier substrate and the electrode. As shown in FIG. 61A, when fabricating, a large-sized sub-mount 510' is normally provided and a plurality of areas on the large-sized sub-mount 510' are predetermined. The thickness of the large-sized sub-mount 510' is usually less than 700 micrometer in consideration of heat effect. A plurality of ESD protection elements 560 are formed on the large-sized sub-mount 510' and within the predetermined areas. Besides, the ESD protection elements 560 are disposed along the edges of the first surface 5100A within each predetermined area of the large-sized sub-mount 510' and are embedded in the large-sized sub-mount 510'. As shown in FIG. 61B, a plurality of electrodes 531 are formed on the first surface 510a in accordance with the ESD protection elements 560.

Figure 61C:
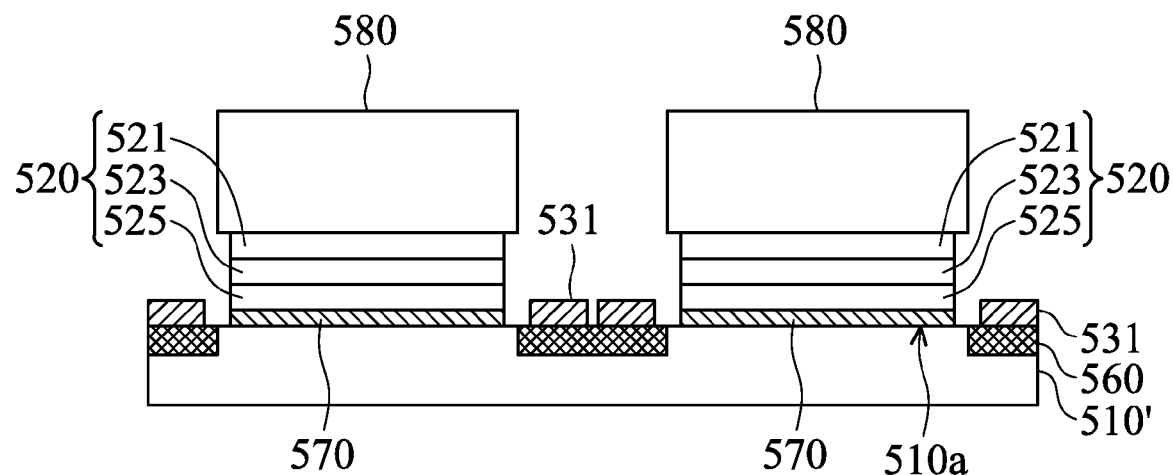

Then, the method proceeds to step S33 that a stacked structure is provided and is bonded on the first surface of the sub-mount, wherein the stacked structure is located apart from the electrode. In FIG. 61C, the stacked structure 520 and an interface layer 570 are formed on a growth substrate 580 in advance before being bonded to the large-sized sub-mount 510'. The growth substrate 580 is, for example, a sapphire ($Al_2O_3$) substrate, silicon carbide substrate, or gallium arsenic substrate. Normally, the materials of the first semiconductor layer 521, active layer 523, second semiconductor layer 525 and interface layer 570 are formed and laminated on a large-sized growth substrate (not shown) in order, and then the large-sized growth substrate and the materials thereon are diced to form a plurality of the growth substrates 580 with the stacked structures 520 and interface layers 570. As shown in FIG. 61C, each growth substrate 580, on which the stacked structure 520 and the interface layer 570 are loaded, is then reversed to face the first surface 510a of the large-sized sub-mount 510'. After that, the interface layer 570 and the large-sized sub-mount 510' can be bonded together by applying ultrasonic energy and heat onto the large-sized sub-mount 510'.

Due to the characteristic of ultrasonic wave, the bonding temperature in the embodiment ranges from about 100° C. to 200° C. The bonding temperature is much lower than conventional bonding temperature, which is about 400° C., causing least change to the quality of the LED structure, such as stress distribution, so the strength of the LED structure is maintained.

Figure 61D:
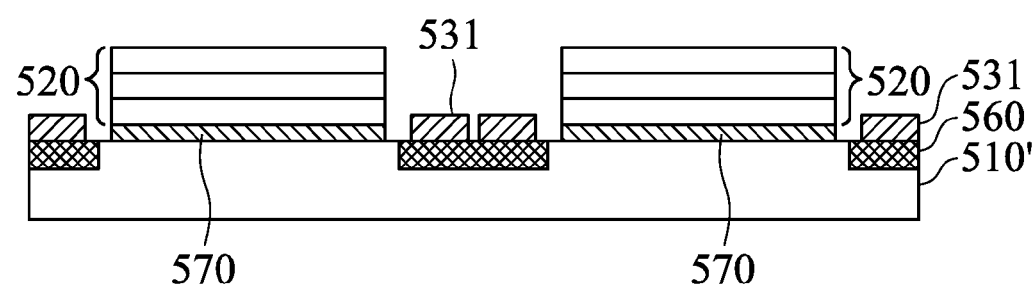

When the stacked structure 520 and interface layer 570 are fixed on the large-sized sub-mount 510', the growth substrate 580 should be detached from the stacked structure 520. As the first semiconductor layer 521 is formed by n-GaN, a laser lift-off method can be used to detach the growth substrate 580 due to the characteristic of n-GaN. For example, when the first semiconductor layer 521 is projected by a laser beam, the portion of the first semiconductor layer 521 that connects the growth substrate 580 absorbs the energy of laser beam and then has decomposition reaction to generate nitrogen gas, loosing the connection between the first semiconductor layer 521 and the growth substrate 580. It is noted that, because the growth substrates 580 with the stacked structure 520 is diced into pieces of small chips, the peeling of each individual growth substrate 580 produces less pulling force to the stacked structures 520 during the procedure of detaching, hence easing the damage to the stacked structures 520. Also, with the help of nitrogen gas, each of the growth substrates 580 is more easily separated from the stacked structures 520. As shown in FIG. 61D, during the fabrication procedure, a plurality of stacked structures 520 are formed on the large-sized sub-mount 510' at the same time within the predetermined areas and located apart from the electrodes 531.

Figure 61E:
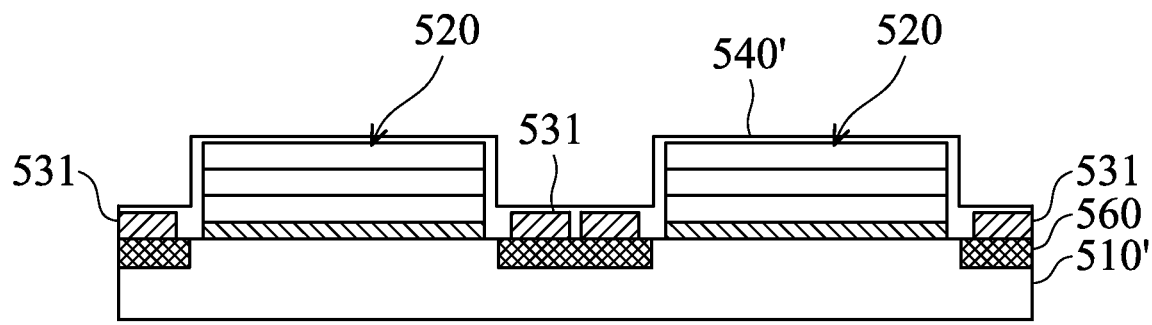

Next, in step S34, an isolation layer is formed on the electrode, the stacked structure and the space between the electrode and the stacked structure. As shown in FIG. 61E, an overall isolation layer 540' is formed over the electrodes 531, the stacked structures 520 and the spaces between the electrodes 531 and the stacked structures 520. The overall isolation layer 540' is mainly used for avoiding direct electrical connection between the stacked structures 520 and the electrodes 531. The overall isolation layer 540' can be formed by spinning or plasma enhanced chemical vapor deposition (PECVD).

Figure 61F:
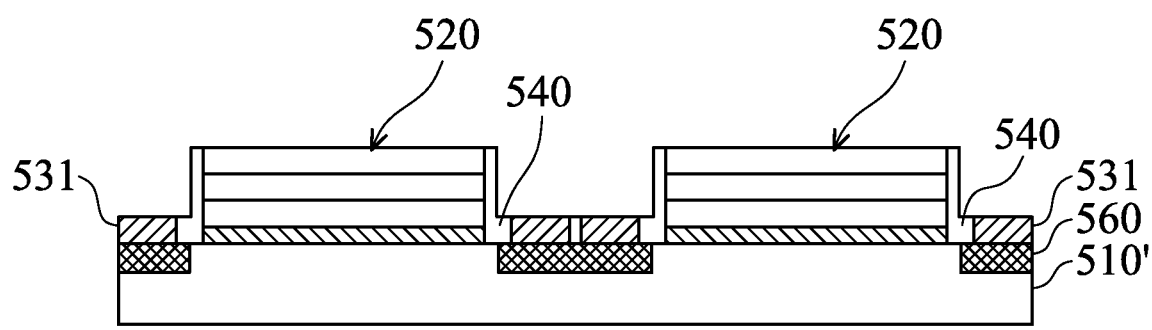

Then, in step S35, part of the isolation layer over the electrode and part of the isolation layer over the stacked structure are removed to expose the electrode and the stacked structure. As shown in FIG. 61E, the isolation layer 540' over the electrodes 531 and over the stacked structures 520 can be removed by etching, so as to detain the isolation layers 540 between the stacked structures 520 and the electrodes 531 on the sub-mount 510', as shown in FIG. 61F.

Figure 61G:
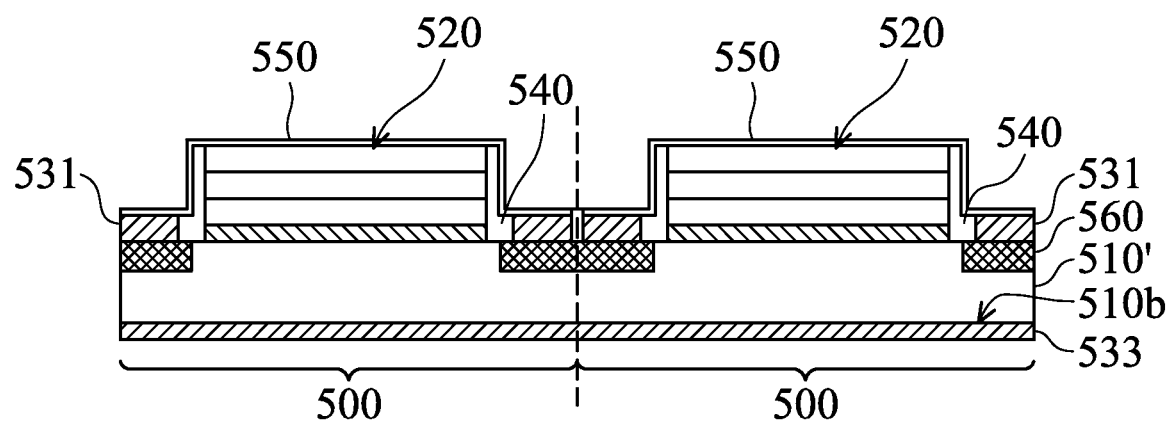

Next, in step S36, a conductive thin film layer is formed on the electrode and the stacked structure for electrically connecting the electrode to the stacked structure. As shown in FIG. 61G, conductive material such as ITO, IZO, GZO, AZO, ATO, FTO, NiO etc. is used and coated over the exposed surfaces of the electrodes 531 and stacked structures 520, as well as over the isolation layers 540, thereby forming a conductive thin film layer 550 to electrically connect the electrodes 531 with the stacked structures 520.

Then, in step S37, another electrode is formed on a second surface of the sub-mount opposite the first surface. As shown in FIG. 61G, an electrode 533 is formed on the second surface 5100B of the large-sized sub-mount 510' and is opposite the electrodes 531. Herein the fabrication of a plurality of LED structures 500, which are not yet separated, is completed. Afterwards, as stated in step S38, the sub-mount is diced to form a LED structure. As shown in FIG. 61G, the large-sized sub-mount 510' are diced along the dashed lines (only one is shown for illustration) that are preferably in accordance with the edges of the predetermined areas, and then the manufacture of each individual LED structure 500 (shown in FIG. 57) is finished.

Figure 60:
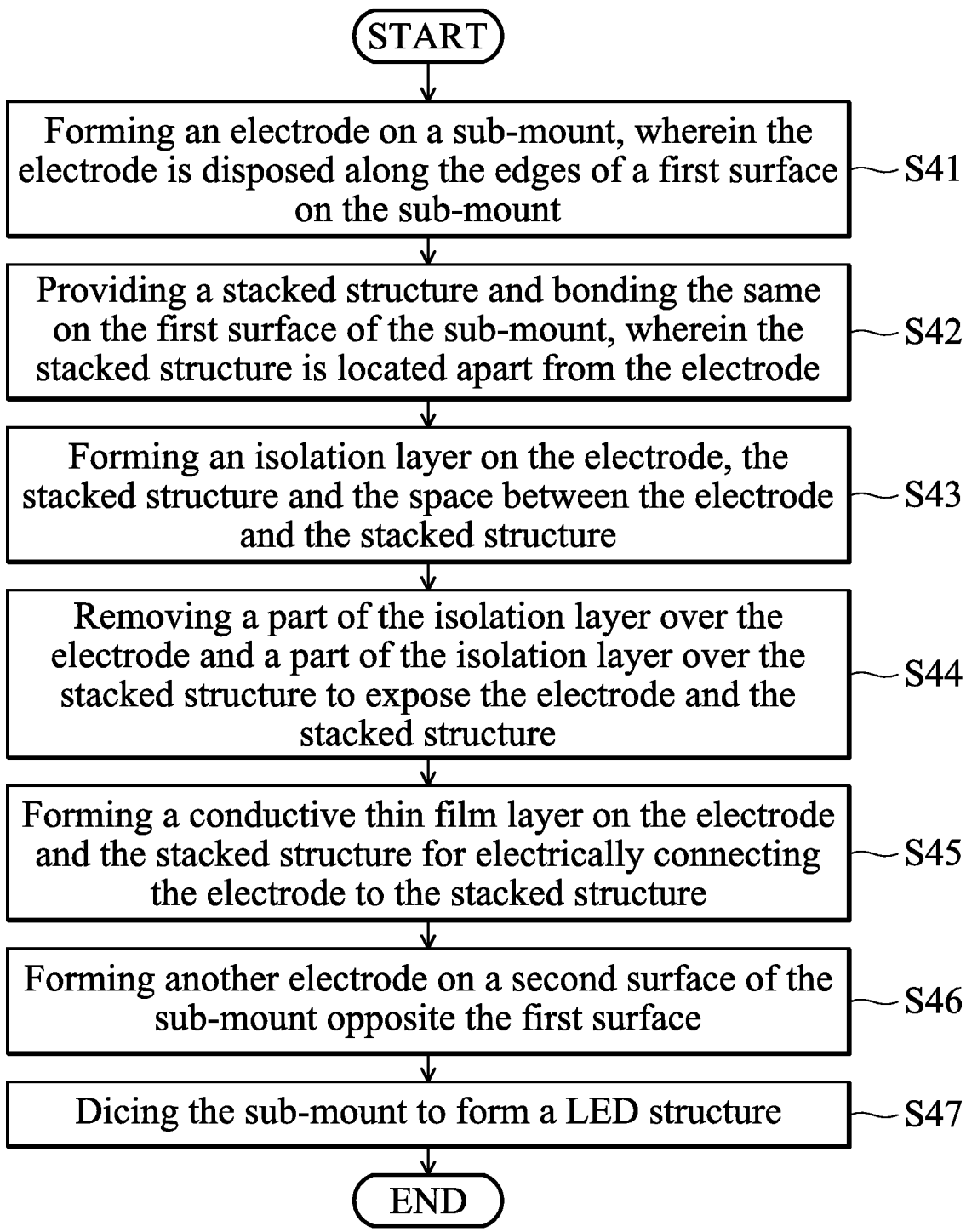
FIG. 60 is a flowchart showing a method of forming another LED structure according to a preferred embodiment.

FIG. 60 is a flowchart showing a method of forming another LED structure according to a preferred embodiment. The LED structure manufactured according to the method in FIG. 60 is different from the LED structure manufactured according to the method in FIG. 59 in the absence of ESD protection element. As shown in FIG. 60, the method includes steps S41 to S47 that also can be elaborated by FIGS. 61A to 61G but the ESD protection elements in FIGS. 61A to 61G could be left out. In step S41, an electrode is formed on a sub-mount, wherein the electrode is disposed along the edges of a first surface on the sub-mount. Then, in step S42, a stacked structure is provided and bonded on the first surface of the sub-mount, wherein the stacked structure is located apart from the electrode. Next, in step S43, an isolation layer is formed on the electrode, the stacked structure and the space between the electrode and the stacked structure. Then, a part of the isolation layer over the electrode and a part of the isolation layer over the stacked structure are removed to expose the electrode and the stacked structure. Next, a conductive thin film layer is formed on the electrode and the stacked structure for electrically connecting the electrode to the stacked structure. Then, another electrode is formed on a second surface of the sub-mount opposite the first surface. Afterwards, the sub-mount is diced to form a LED structure.

Figure 62:
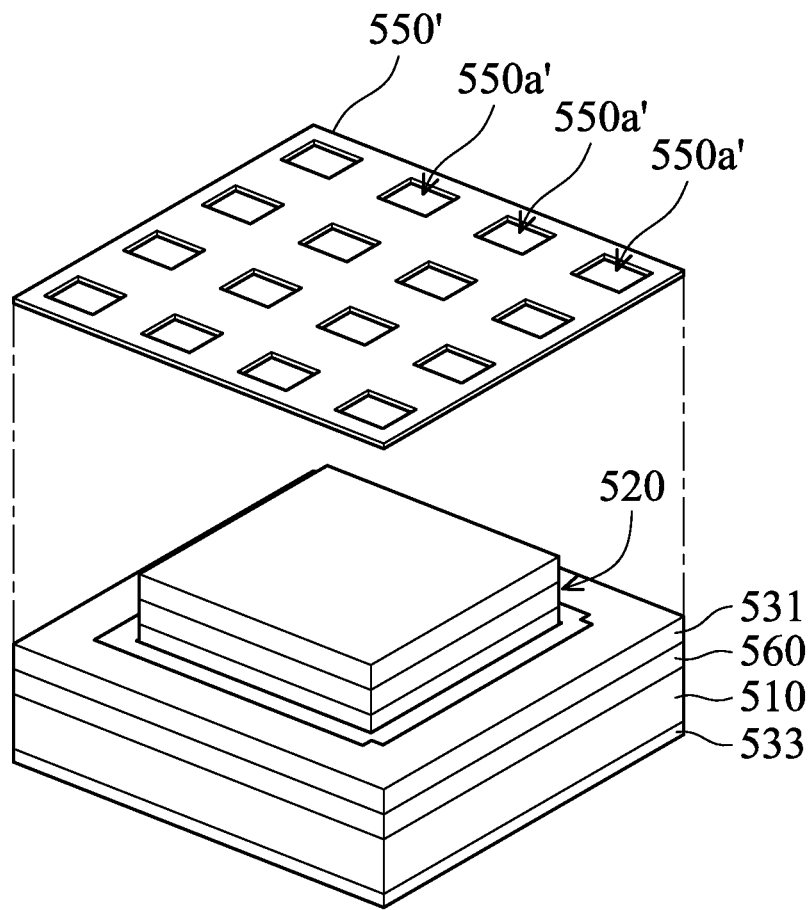
FIG. 62 is a diagram showing a conductive thin film layer with a plurality of openings.

In the above embodiment the conductive thin film layer 550 is an intact and uniform thin film layer, however the invention is not limited thereto. For example, the conductive thin film layer 550 can be designed as a thin film with openings or concaves that partially hollow out or thin out the conductive thin film layer 550. The openings or concaves are preferably located corresponding to the stacked structure 520 for changing the light transmission rate of the conductive thin film layer 550. FIG. 62 is a diagram showing a conductive thin film layer 550' with a plurality of openings 550a'. The openings 550a' do not block the light from the stacked structure 520, effectively improving the light transmission rate of the conductive thin film layer 550', and further enhancing the light usage of the stacked structure 520.

Figure 63:
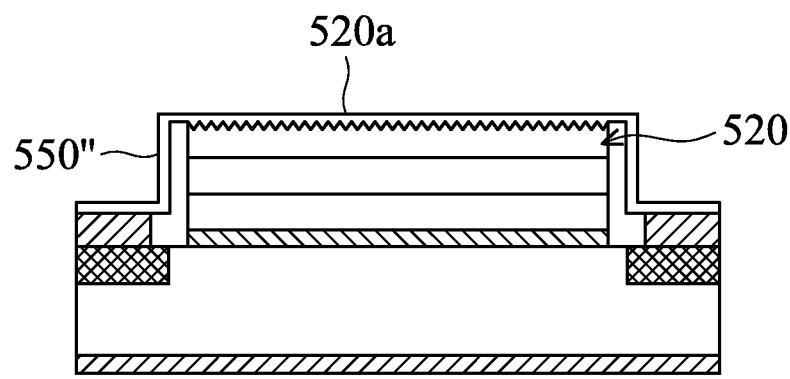
FIGS. 63 and 64 are diagrams each showing a conductive thin film layer with a light extracting feature.
Figure 64:
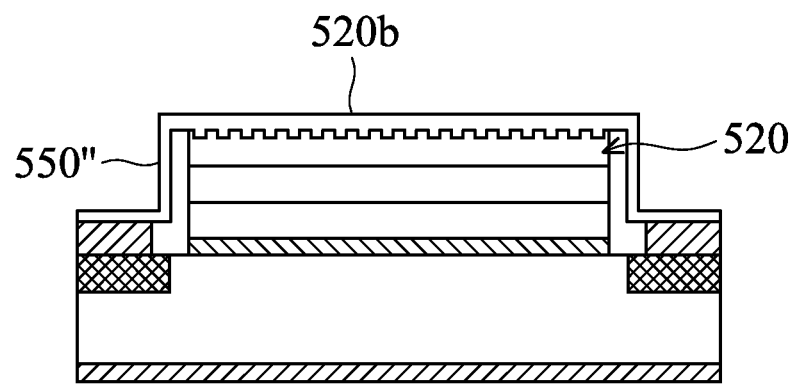

FIGS. 63 and 64 are diagrams each showing a conductive thin film layer 550" with a light extracting feature. As shown in FIG. 63, the light extracting feature includes a plurality of sawteeth 520a. The sawteeth 520a located above the top surface of the stacked structure 520 are, for example, microstructures that can be formed by roughening the outer surface of the conductive thin film layer 520. The light emitted from the stacked structure 520 is scattered in different directions by the sawteeth 520a so as to increase the light emitting area of the stacked structure 520. As shown in FIG. 64, the light extracting feature includes a plurality of pillars 520b. The pillars 520b are, for example, nano-structures. Moreover, as a conductive thin film layer is designed to have concaves, the light extracting feature can also be formed on the surfaces within the concaves.

Figure 65:
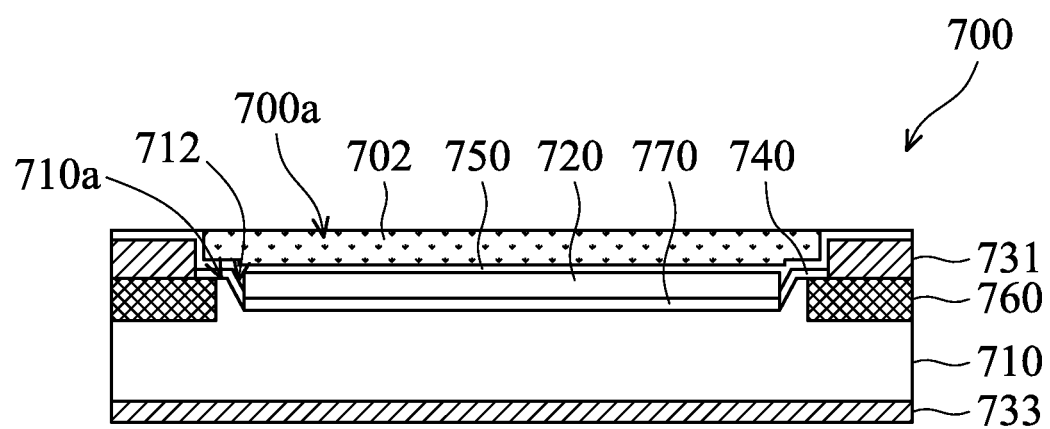
FIG. 65 is a diagram showing a LED structure filled with phosphor.

The LED structure disclosed in the above embodiment can further be used with phosphor for generating light of different color. FIG. 65 is a diagram showing a LED structure 700 filled with phosphor 702. The LED structure 700 includes a sub-mount 710, a stacked structure 720, two electrodes 731 and 733, an isolation layer 740, a conductive thin film layer 750, an ESD protection element 260 and an interface layer 770. The sub-mount 710 has a cavity 712 on its first surface 7100A. The stacked structure 720 is disposed within the cavity 712 and is positioned lower than the top of the electrode 731. And as the electrode 731 is disposed on the lateral side of the stacked structure 720, there is a concave 700a formed on the LED structure 700. The concave 700a facilitates the conformal coating of phosphor due to the reason that the concave 700a can be fully filled with the phosphor 702 easily.

As shown in FIG. 56, the electrode 531 in the above embodiment is disposed along all lateral sides of the stacked structure 520, however the invention is not limited thereto. FIG. 66A is a diagram showing a LED structure 800 having an electrode 831 not fully surrounding its sacked structure 820, and FIG. 66B is a diagram showing the top view of the LED structure 800 in FIG. 66A. The electrode 831 of the LED structure 800 is disposed along three lateral sides of the stacked structure 820, and another electrode 833 is disposed on the unoccupied lateral side apart from the electrode 831 on the stacked structure 820. An isolation layer 840 is used for isolating the electrodes 831 and 833 and the stacked structure 820 to avoid unnecessary electrical connection. A conductive thin film 850 is disposed over the electrode 831 and the stacked structure 820. As the electrode 831 does not completely surround the LED structure 800, the LED structure 800 can be combined with other LED structures via a plurality of conductive lines 890, so as to produce a larger light emitting area.

Figure 67A:
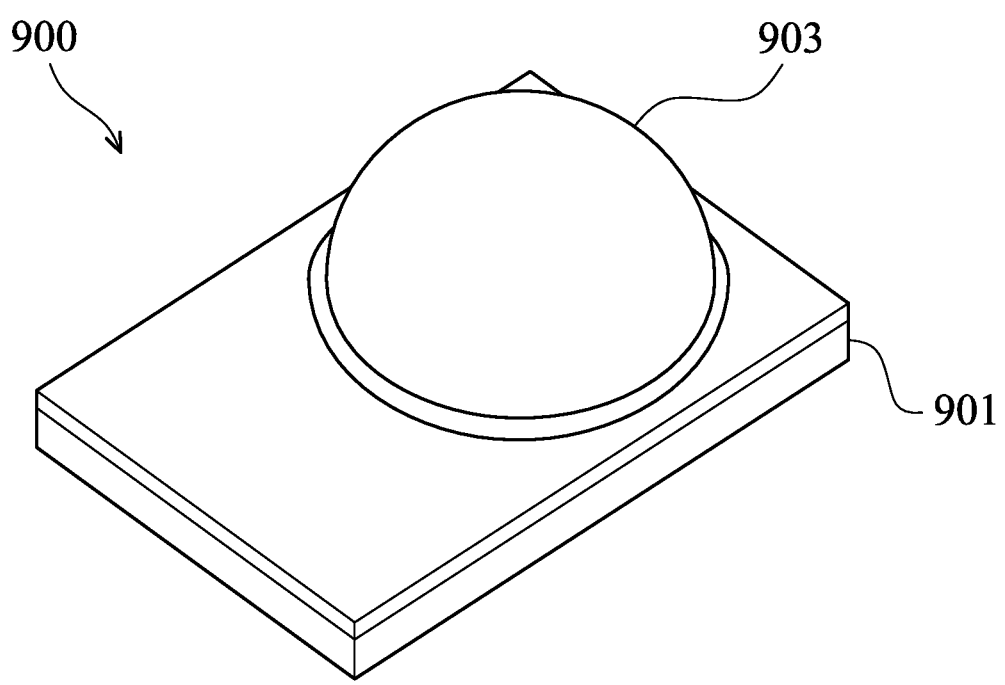
FIGS. 67A and 67B are diagrams showing a LED packaging structure according to a preferred embodiment.
Figure 67B:
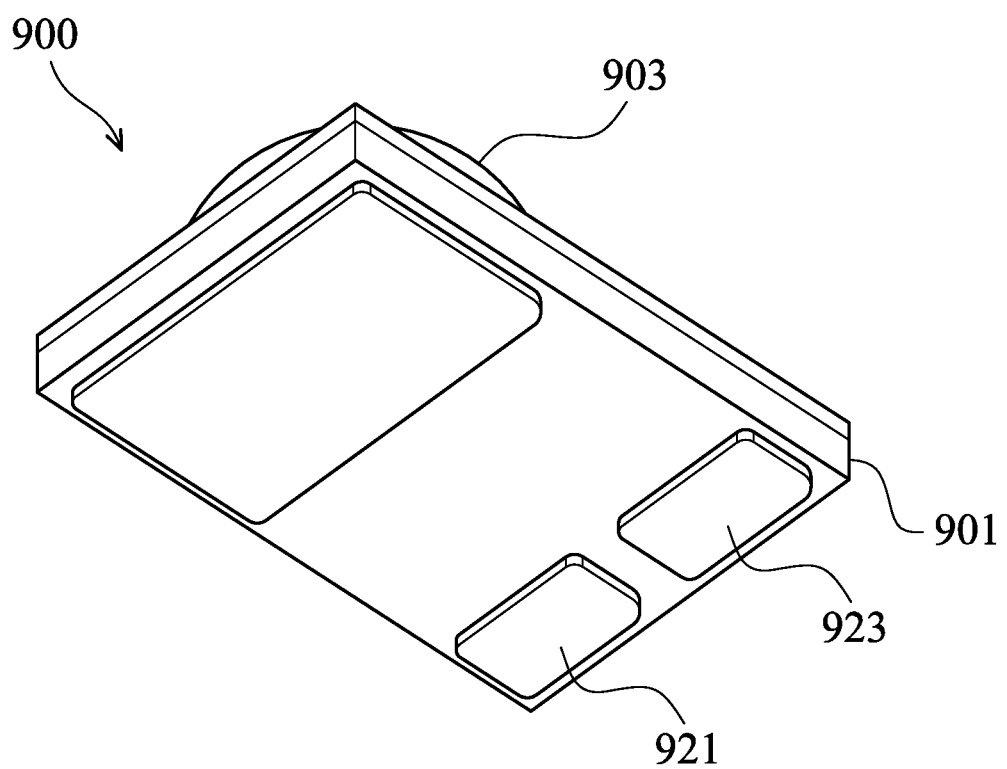
Figure 67C:
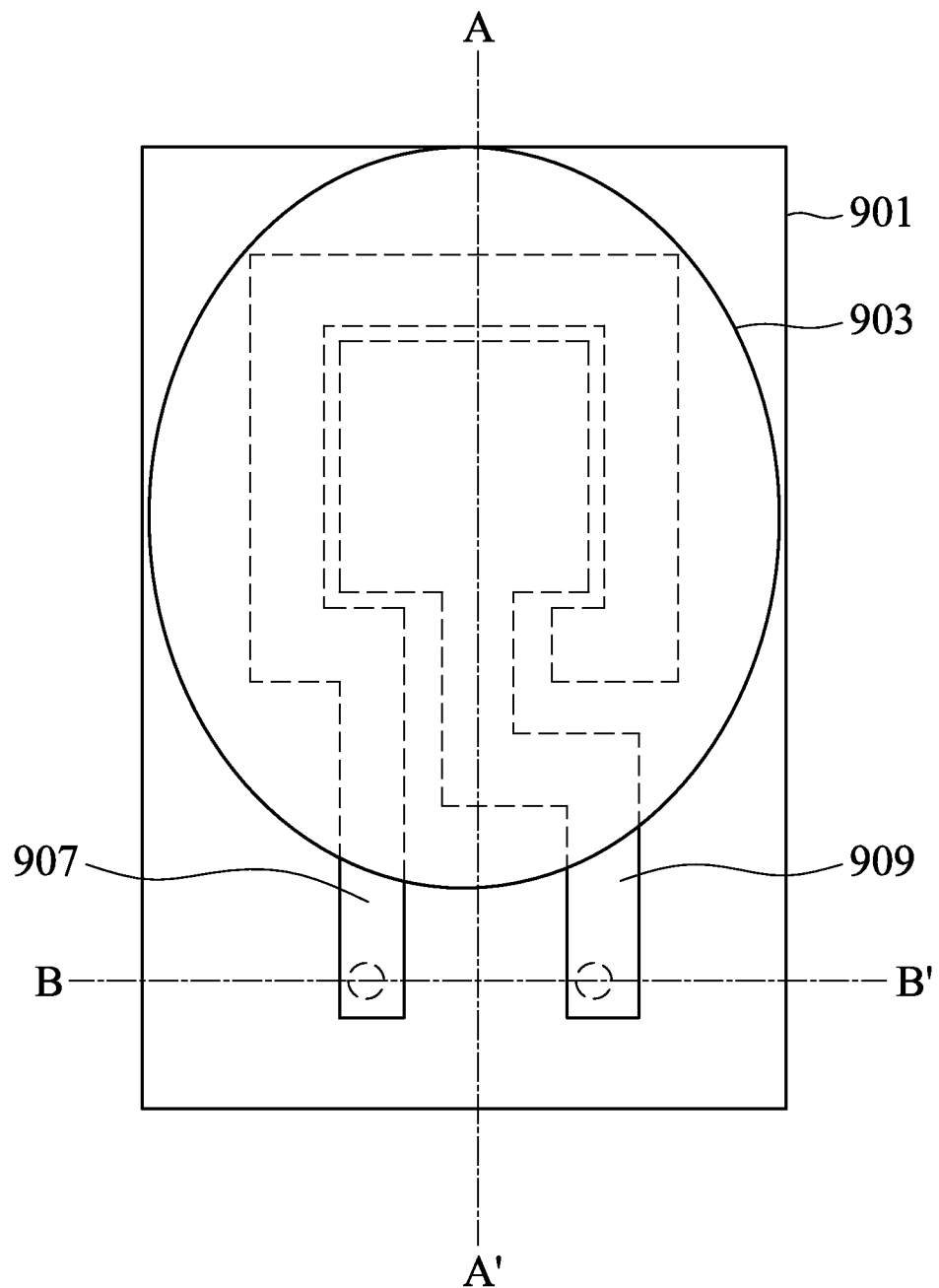
FIG. 67C is a top view of the LED packaging structure in FIG. 67A.
Figure 67D:
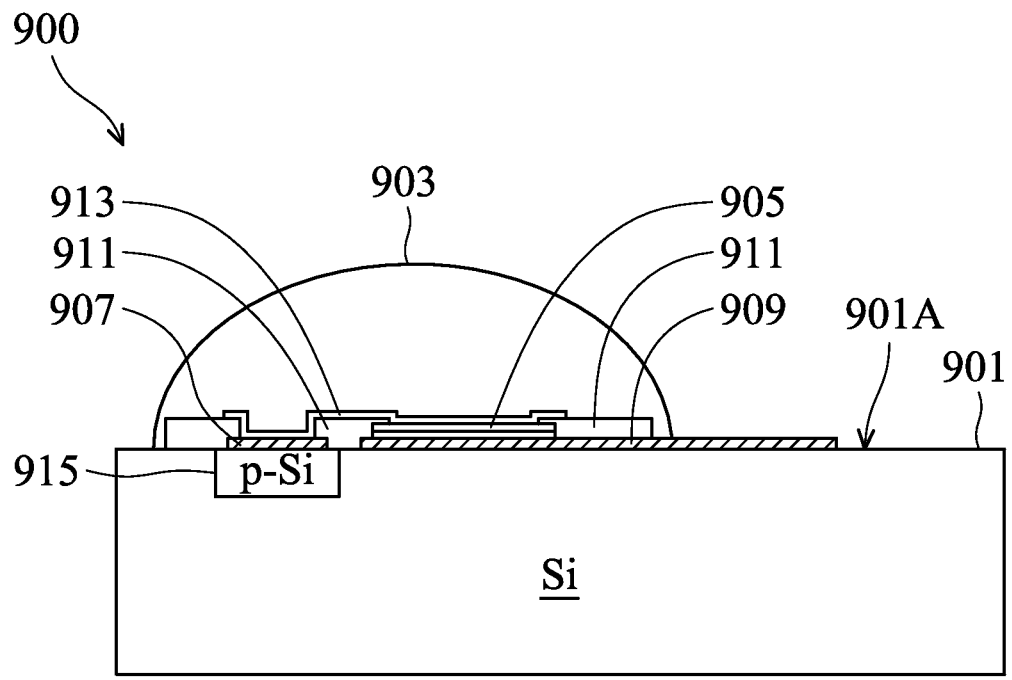
FIGS. 67D and 67E are cross-sectional views of the LED packaging structure in FIG. 67C along lines A-A' and B-B' respectively.
Figure 67E:
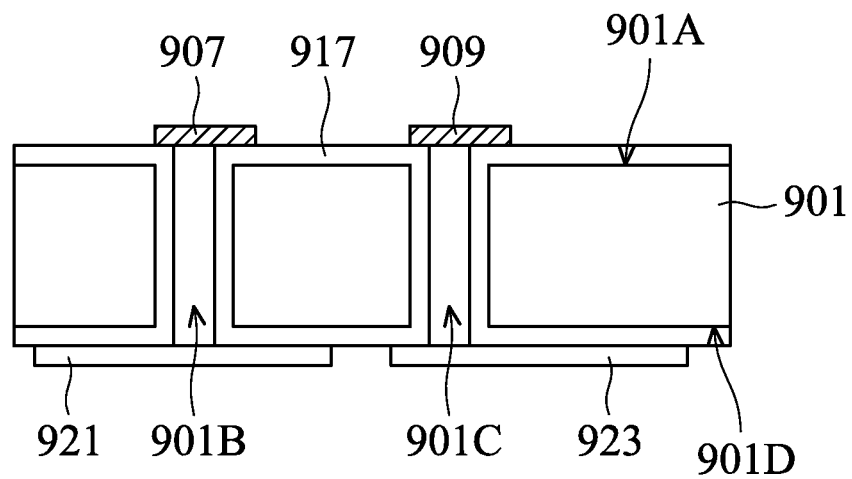

The design of lateral electrode can be applied to a LED package structure and is elaborated below by accompanying drawings. FIGS. 67A and 67B are diagrams showing a LED packaging structure according to a preferred embodiment. FIG. 67C is a top view of the LED packaging structure in FIG. 67A, and FIGS. 67D and 67E are cross-sectional views of the LED packaging structure in FIG. 67C along lines A-A' and B-B' respectively. In FIG. 67A, the LED packaging structure 900 includes a packaging substrate 901 and a transparent sealant 403 that is disposed on the packaging substrate 901. As shown in FIG. 67D, the LED packaging structure 900 further includes at least one stacked structure 905, at least one first electrode 907, at least one second electrode 909, an isolation layer 911, and at least one conductive thin film layer 913. The stacked structure 905 is disposed on a first surface 901A of the packaging substrate 401 and its design is similar to that of the stacked structure 520 shown in FIG. 57 and is not repeated herein. The first electrode 907 is disposed on the first surface 901A and apart from the stacked structure 905. The isolation layer 911 is disposed on the first surface 901A and surrounds the stacked structure 905 as well as covers the lateral sides of the stacked structure 905, and the isolation layer 911 also fills the gap between the first and second electrodes 907 and 909. The conductive thin film layer 913 connects the first electrode 907 to the stacked structure 905. The second electrode 909 is disposed on the packaging substrate 901 and is electrically connected the stacked structure 905. Preferably, the second electrode 909 is disposed between the stacked structure 905 and the packaging substrate 901. The transparent sealant 903 covers the conductive thin film layer 913 as well as the isolation layer 911 for protecting the LED packaging structure 900.

The packaging substrate 901 is, for example, a semiconductor substrate that is electro-conductive, and its thickness is preferably greater than 800 micrometer for loading the components mentioned above. As shown in FIG. 67D, the LED packaging structure 900 further includes at least one ESD protection element 915 disposed under the first electrode 907 and embedded in the packaging substrate 901. The material of the packaging substrate 901 is not limited to be electro-conductive. For example, the packaging substrate 901 can also be any type of substrate such as metal-based substrate, silicon-based substrate, ceramic-based substrate, printed circuit board (PCB), flexible printed circuit board (FCB) etc.

As shown in FIG. 67E, the packaging substrate 901 includes two through holes 901B and 901C, which extend from the first surface 901A to a second surface 901D opposite the first surface 901A as well as correspond to the first electrode 907 and the second electrode 909 respectively. As the packaging substrate 9401 is attached to other electronic device, the first electrode 907 and the second electrode 909 can be electrically connected to its driving source by the through holes 901B and 901C and two bonding pads 921 and 923. As the packaging substrate 401 is electro-conductive, the insulation of the through holes 901B and 901C should be considered. Preferably, another isolation layer 917 is disposed between the through holes 901B and 901C and the packaging substrate 901. However, as the packaging substrate 901 is formed by a non-conductive material such as ceramic, the isolation layer 917 and the ESD protection element 915 (shown in FIG. 67D) can be left out.

Figure 68:
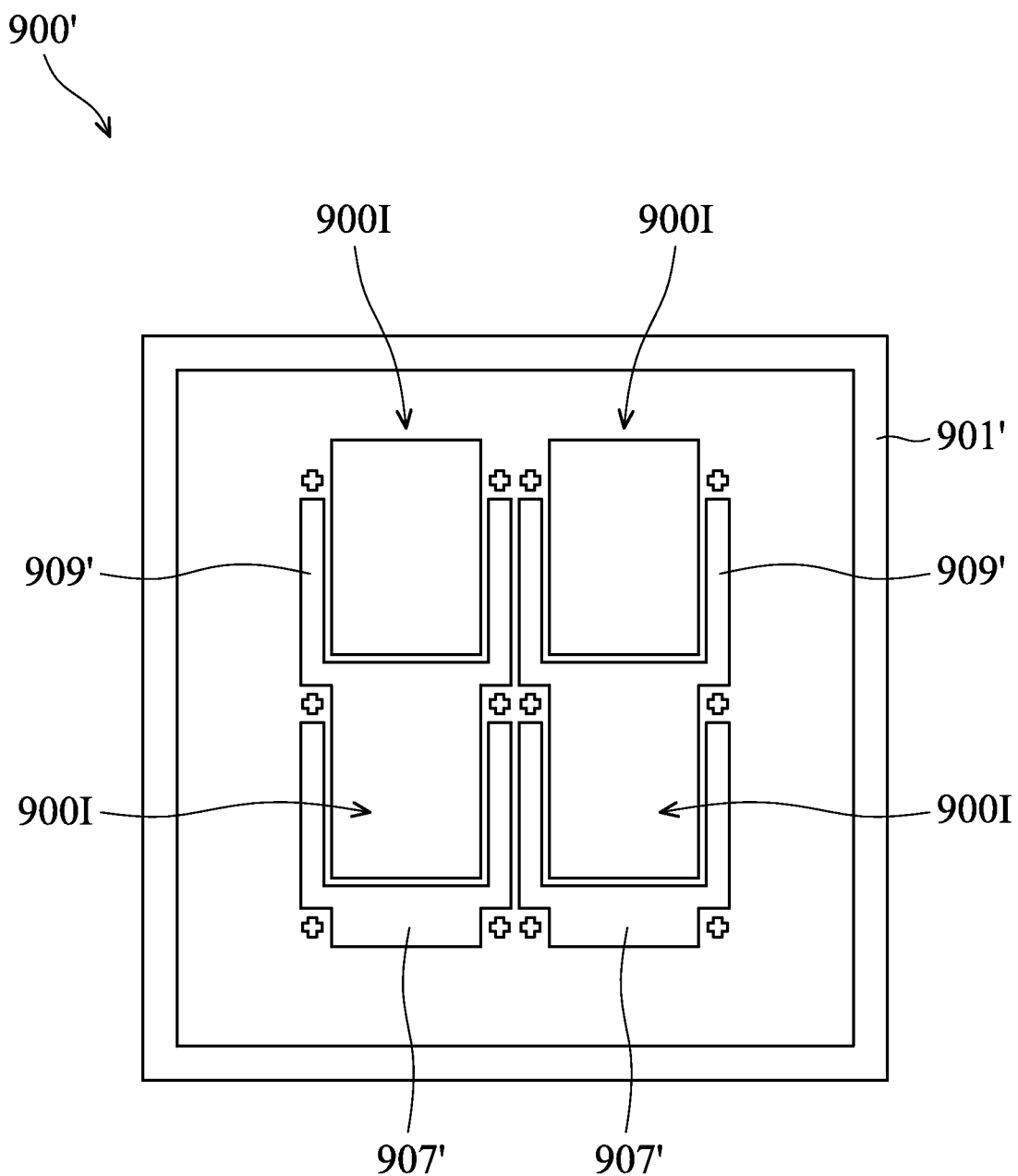
FIG. 68 is a diagram showing a LED packaging structure having a plurality of light emitting areas.

FIG. 68 is a diagram showing a LED packaging structure having a plurality of light emitting areas. The LED packaging structure 900' has a plurality of stacked structures (not shown), which are formed on the packaging substrate 901' and each correspond to one light emitting area 900I. A plurality of first electrodes 907' and a plurality of second electrodes 909' are disposed on the packaging substrate 901'. The LED packaging structure 900' provides a total light emitting area larger than that of the LED packaging structure 900 (shown in FIG. 67C).

Figure 69A:
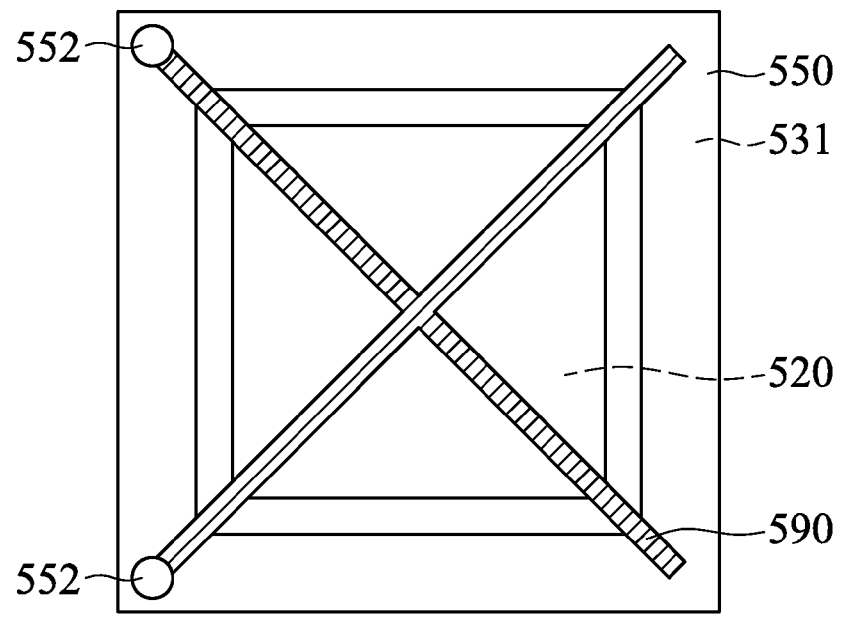
FIGS. 69A and 69B are diagrams each showing an auxiliary electrode disposed on the conductive thin film layer.
Figure 69B:
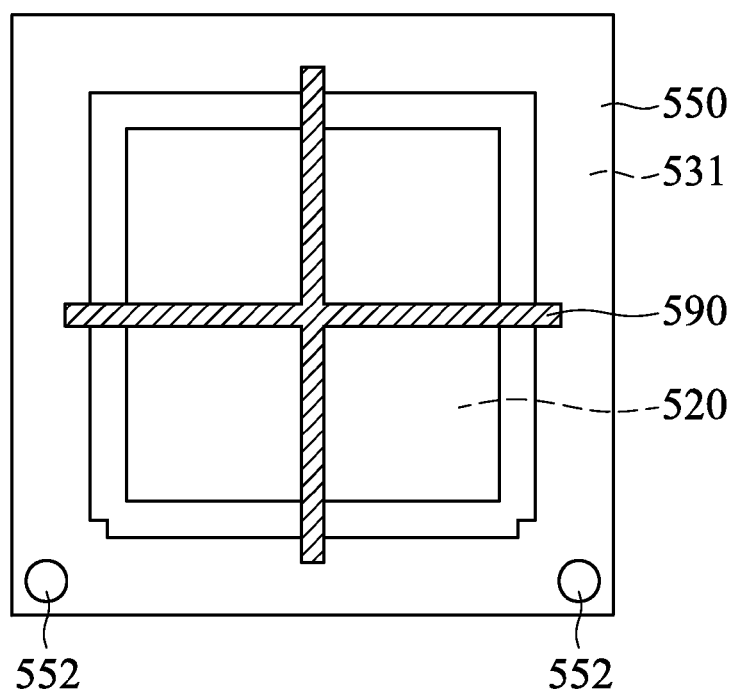

The connection between the stacked structure and the electrode makes use of the conductive thin film layer in the above embodiment. However, the electric current in the conductive thin film layer may not be always steady. Thus, an auxiliary electrode can be used to assist the electrical connection between the stacked structure and the electrode. FIGS. 69A and 69B are diagrams each showing an auxiliary electrode disposed on the conductive thin film layer. As shown in both FIGS. 69A and 69B, the auxiliary electrode 190 is disposed on the conductive thin film layer 550 and covers a part of the conductive thin film layer 550. The auxiliary electrode 190 is a cross structure for example, and the four ends of the cross structure correspond to the four corners (as shown in FIG. 69A) or four edges (as shown in FIG. 69B) of the conductive thin film layer 550, respectively, and extend to the electrode 531, thus the electrical connection between the stacked structure 520 and the electrode 531 is enhanced. Besides, the auxiliary electrode 590 can be further disposed along the lateral sides of the stacked structure 520. Furthermore, for increasing the attachment between the conductive thin film layer 550 and other elements such as metal bumps, a plurality of metal pads 552 are disposed on the conductive thin film layer 550.

Figure 70A:
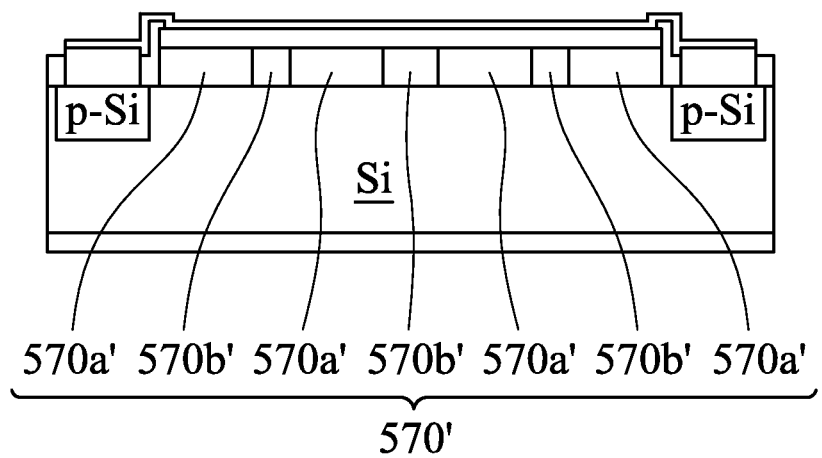
FIGS. 70A and 70B are diagrams each showing an interface layer having a plurality of partitions.
Figure 70B:
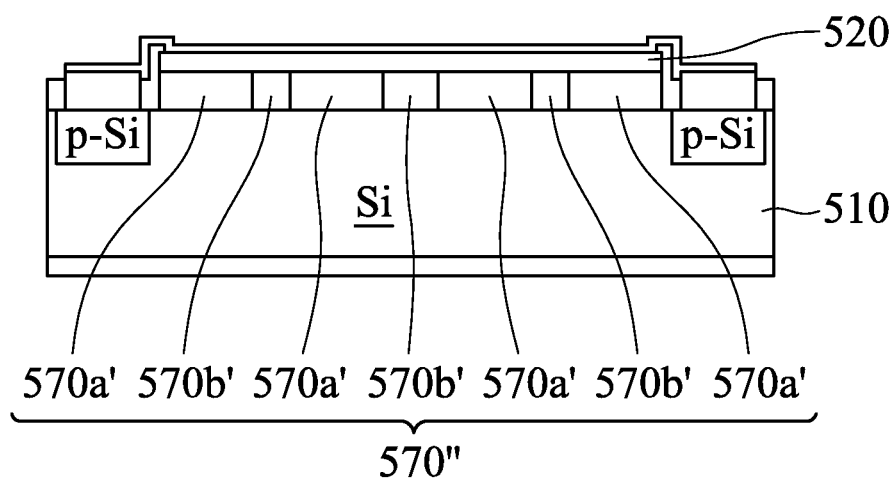

The interface layer used for combining the stacked structure with the sub-mount in the above embodiment totally fills the gap between the stacked structure and the sub-mount, however the invention is not limited thereto. FIGS. 70A and 70B are diagrams each showing an interface layer having a plurality of partitions. As shown in FIG. 70A, the interface layer 570' includes partitions 570a' that are separated by several vacancies 570b'. The interface layer 570' is easy to manufacture and the yield is thus increased. As shown in FIG. 70B, the interface layer 570" includes partitions 570a', and each vacancy between two partitions 570a' is filled with a filling material 570c' such as resin or silicone.

The LED structure, LED packaging structure and method of forming a LED structure disclosed in the preferred embodiment have the electrode, which is mostly formed by opaque metal, disposed along the lateral sides of the stacked structure that emits light, so the electrode does not block the light from the stacked structure, rendering the LED structure fit for the requirement of a high light emitting device. Besides, the LED structure itself has an electrostatic discharge (ESD) protection element, which can be formed with the sub-mount of the LED structure, for ESD protection of the LED structure, thus neither additional ESD protection device nor conductive line needs to be assembled after the LED structure is fabricated. Therefore, the LED structure in the embodiment is simpler than a conventional LED device equipped with ESD protection device, facilitating the manufacturing process as well as saving the manufacturing cost.

In order to at least improve the uniformity of luminance for the LED dies in packaging process, the disclosure has propose a novel structure with the fabrication processes. Several embodiments are provided for describing the disclosure but the disclosure is not limited to the provided embodiments.

Figure 71:
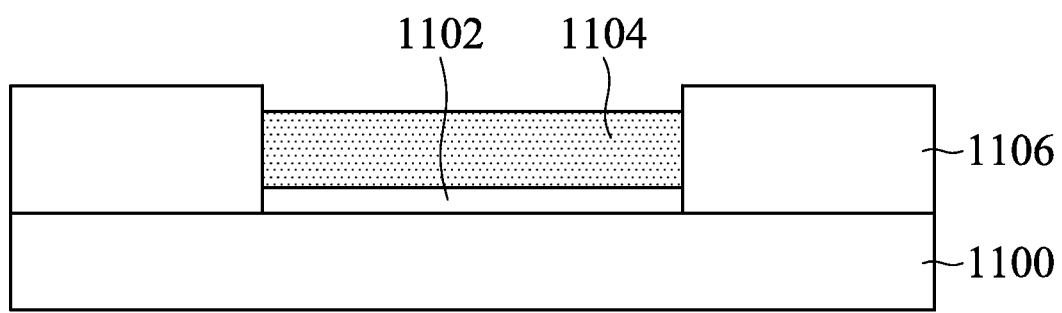
FIG. 71 is a cross-section schematically illustrating a structure of LED die, according to an embodiment.

FIG. 71 is a cross-sectional view, schematically illustrating a structure of LED die, according to an embodiment. In FIG. 71, when considering the structure being fabricated, a carrier 1100 is serving as the substrate. The carrier 1100, as known, usually has a circuit for connection to the power or any external control circuit. A light emitting semiconductor stacked layer 1102, such as the LED without transparent sub-mount, is disposed on the carrier 1100. The LED is usually, for example, less than 50 microns in thickness and at least includes P-type layer, N-type layer and active layer between the P-type layer, N-type layer, for example. The LED semiconductor structure can be a known structure state-in-the art, without specific limitation. A wavelength conversion layer 1104 on the light-emitting semiconductor stacked layer 1102. A surrounding layer 1106 is disposed on the carrier 1100 and surrounds a sidewall of the light-emitting semiconductor stacked layer 1102 and the wavelength conversion layer 1104. Actually, the space occupied by the wavelength conversion layer 1104 is defined by the transparent sub-mount in the LED die, in which the transparent sub-mount, such as the sapphire sub-mount, is stripped away during fabrication, and leaves the cavity space for filling the wavelength conversion layer 1104.

Figure 72A:
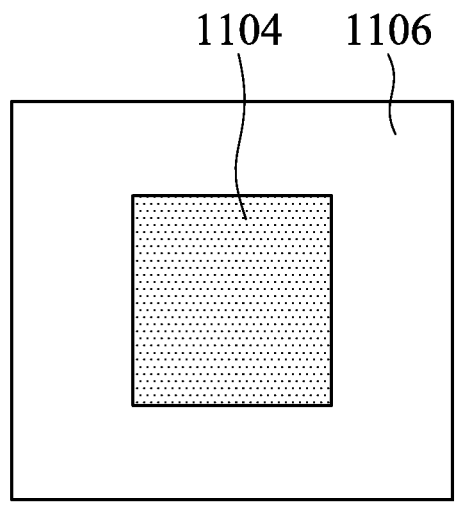
FIGS. 72A-72F are top views schematically illustrating several configurations of the LED dies attached on the carrier, according to embodiments.
Figure 72B:
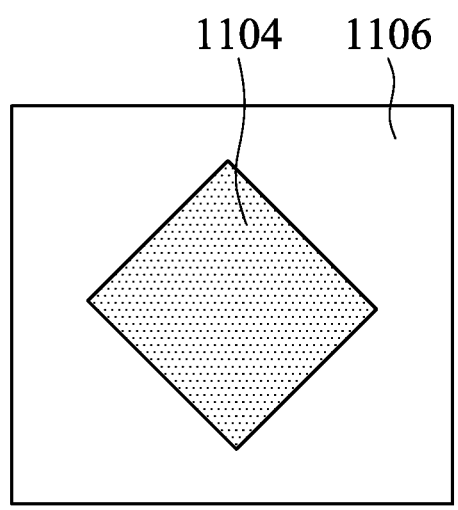
Figure 72C:
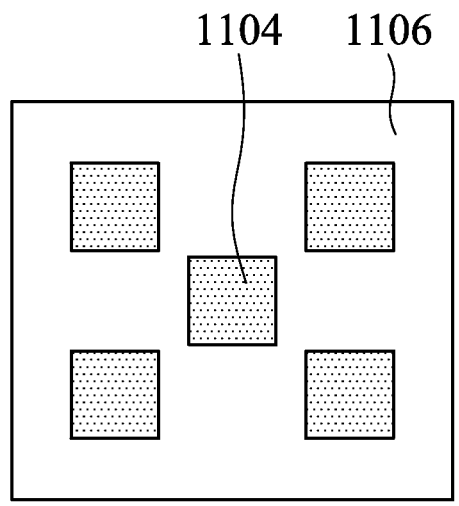
Figure 72D:
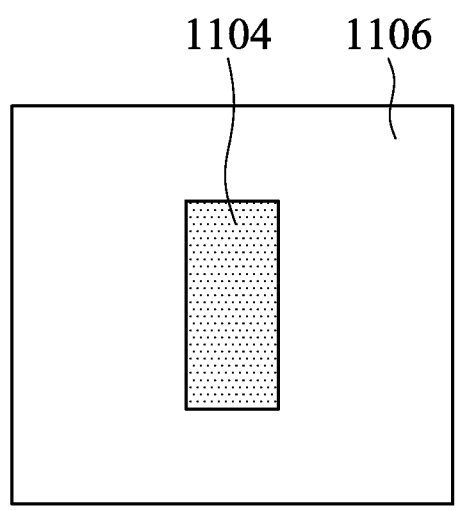
Figure 72E:
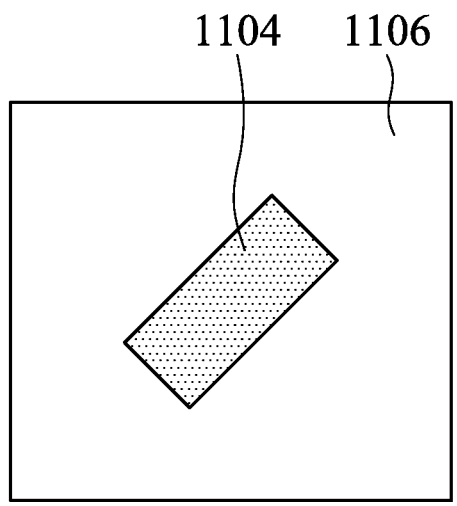
Figure 72F:
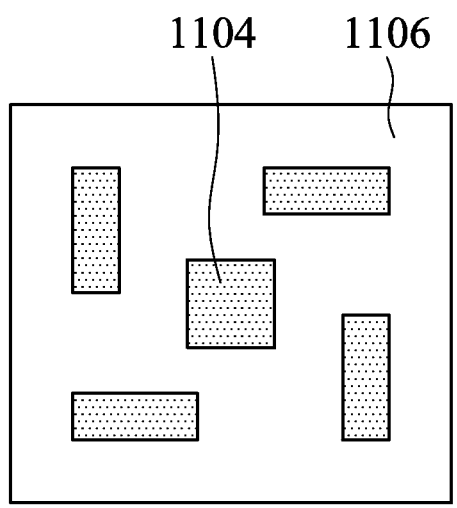

In the structure shown in FIG. 71, the surrounding layer 1106, such as the under fill layer, is surrounding the sidewall of the light-emitting semiconductor stacked layer 1102 by the self-alignment, the wavelength conversion layer 1104 can be formed on the light-emitting semiconductor stacked layer 1102 with uniform thickness and self-alignment. FIG. 72A is a top view, schematically illustrating several configurations of the LED dies attached on the carrier, according to embodiments. In FIG. 71, due to the self-alignment mechanism, the surrounding layer 1106 can be adapted for various configurations for the LED dies on the carrier. In FIG. 72A, the LED die with the wavelength conversion layer 1104 may be regularly disposed on the carrier. The surrounding layer 1106 can be surrounding the sidewall of the wavelength conversion layer 1104. Since the wavelength conversion layer 1104 is liquid phase before being cured, the wavelength conversion layer 1104 can be uniformly filled on the light-emitting semiconductor stacked layer 1102 without worrying the location and twist direction. In FIG. 72B, the LED die is twisted by an angle, which may be intended in design and just an alignment error of the LED die. Likewise, several other configuration in FIG. 72C-FIG. 72F can be packaged with the same mechanism. In FIG. 72C, for example, several LED dies are disposed the predetermined locations, according to the designed pattern. In FIG. 72D, the shape of the LED die may also be changed into a rectangle, for example. In FIG. 72E, the LED die is rotated by an angle, such as 45 degrees. In FIG. 72F, it is like the configuration in FIG. 72C but the size and shape of the LED dies are different. In other words, the embodiment can be applied to various LED configurations with self-alignment.

Figure 73A:
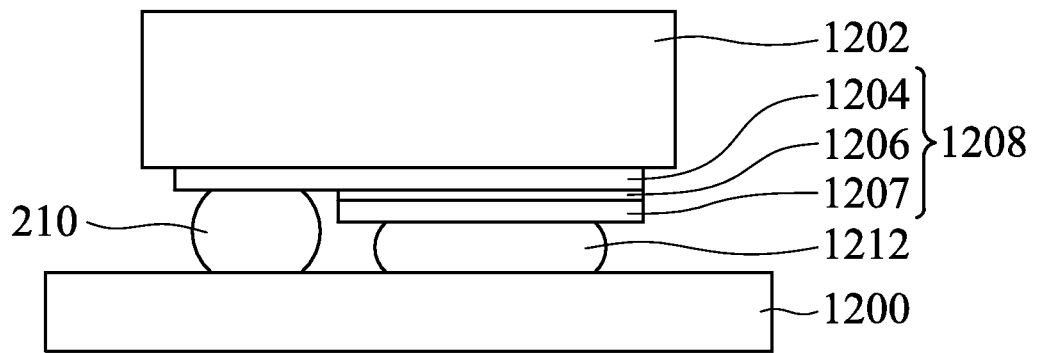
FIGS. 73A-73D are cross-sections schematically illustrating packaging processes to form the LED packaging unit, according to an embodiment.

For the fabrication process, in order to fabricate the structure of LED die, several manners can be performed. FIGS. 73A-73D are cross-sectional views, schematically illustrating packaging processes to form the LED packaging unit, according to an embodiment. In FIG. 73A, a carrier 1200 is provided as a substrate. The carrier 1200 has a circuit fabricated inside for connection to external terminal. A light-emitting device, such as LED die, has the light-emitting semiconductor stacking layers 1208 and the growth substrate 1202. The light-emitting semiconductor stacking layers 1208 is fabricated on the growth substrate 1202. The growth substrate 1202 can be, for example, sapphire. The light-emitting semiconductor stacking layers 1208 includes, for example, n-type semiconductor layer 204 and p-type semiconductor layer 1206 to form diode to emit light. The semiconductor stack layer can include several layers to achieve the mechanism for emitting light. Only the n-type semiconductor layer 1204 and p-type semiconductor layer 1206 are shown for generally indicating the LED. In addition, a metal reflection layer 207 can be also formed on the semiconductor layer 1206 in option. The LED is usually formed on the growth substrate 1202, as known by a person on ordinary skill in the art. The light-emitting semiconductor stacking layers 1208 on the growth substrate 1202 generally represents a LED die, as usually known. The light is emitted at a direction toward the growth substrate 1202. The LED die is then packaged onto the carrier 1200 by for example, flip-chip packaging process. The conductive bumps 210 and 1212 are respectively coupled to the electrode pads of the semiconductor layers 1204 and 1206 in different conductive type. By the conductive bumps 1210 and 1212, the LED die is electrically coupled to the carrier 1200. The structure in FIG. 73A can be formed by convention manners in known structure. The invention is not limited to the specific structure of LED die.

Figure 73B:
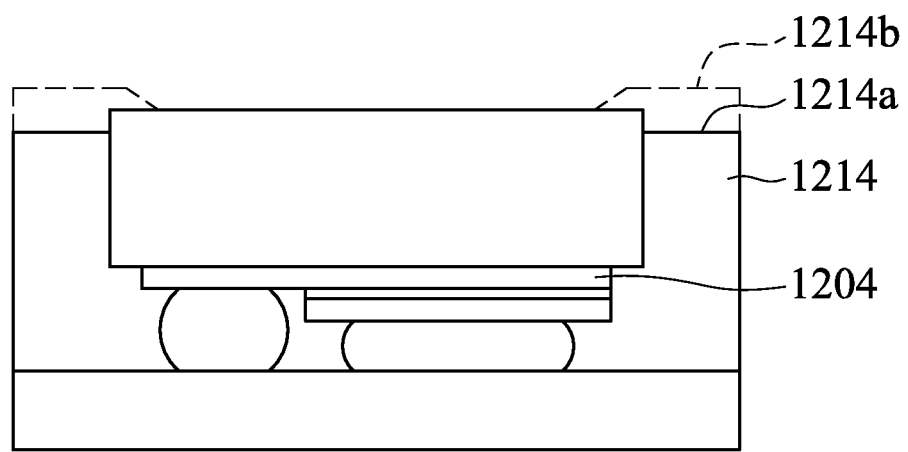

In FIG. 73B, an surrounding layer 1214, such as molding compound, can be formed to fill the gap between the LED die and the carrier 1200, and then surround the LED die. The surrounding layer 1214 can be the underfill layer in packing. In other word, the surrounding layer 1214 is generally referred as a surrounding layer, alternatively. The top surface 1214a of the surrounding layer 1214 may be lower than the surface of the growth substrate 1202, so that the growth substrate 1202 remains being exposed. However in option, the tip surface 214b of the surrounding layer 1214 may be slightly higher than the growth substrate 1202 and then also covers the peripheral of the growth substrate 1202. This situation is also acceptable because it does not cause difficult the growth substrate 1202 to lift off later by, for example, thermal effect from laser.

Figure 73C:
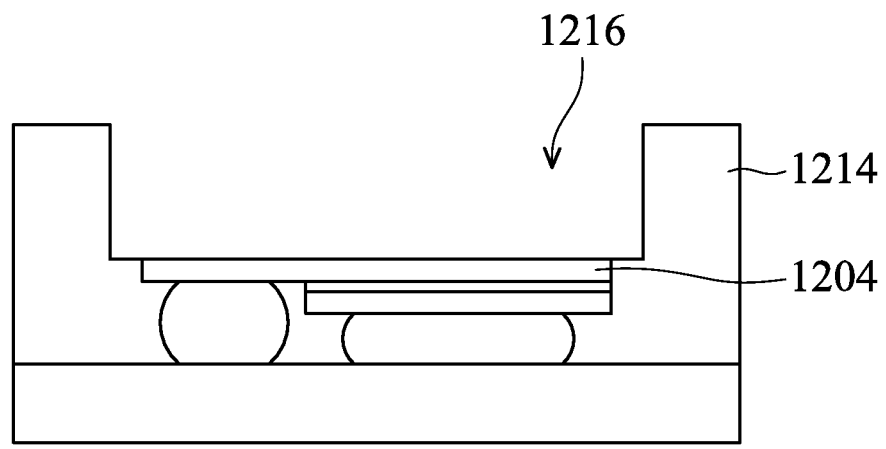

In FIG. 73C, the growth substrate 1202 is lifted off from the semiconductor layer 1204 by applying laser light on the growth substrate 1202, causing heat. Because there is a tension release at the interface between the growth substrate 1202 and the semiconductor layer 204 after the laser producing the heat, the growth substrate 1202 is easily lifted off and leaves a cavity 1216 in the surrounding layer 1214.

Figure 73D:
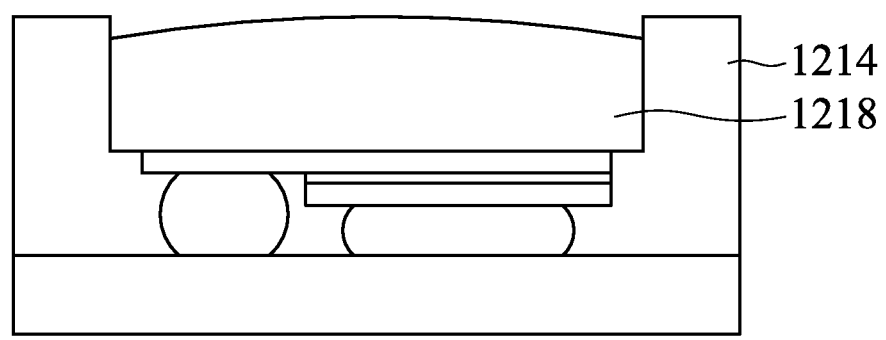

In FIG. 73D, the cavity 1216 is filled with the wavelength conversion layer 1218 in liquid and then is cured. Because the wavelength conversion layer 1218 is in liquid phase, the top surface can be uniform and is self-aligned to the light-emitting semiconductor stacking layers 1208. In addition, since the wavelength conversion layer 218 is in liquid phase, the height can be controlled to be lower than or equal to the top surface of the surrounding 1214, for example.

The LED die in FIGS. 73A-73D is a horizontal type, which means the two electrodes are distributed at the same side with respect to the light-emitting semiconductor stacking layers 1208. However, the LED die in FIG. 71 is the vertical type, which means the two electrodes in different conductive type are at opposite sides with respect to the light-emitting semiconductor stacking layers 1208.

Figure 74A:
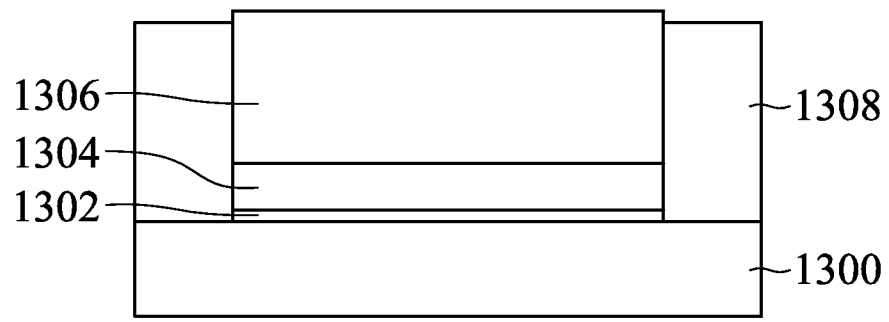
FIGS. 74A-74D are cross-sections schematically illustrating packaging processes to form the LED packaging unit, according to an embodiment.

FIGS. 74A-74D are cross-sectional views, schematically illustrating packaging processes to form the LED packaging unit, according to an embodiment. In FIG. 74A, the carrier 1300 is also provided as the structure base for electric connection. The semiconductor stack layer 1304 of a vertical LED die is bounded on the carrier 1300 by the bonding material 1302. The semiconductor stack layer 1304 includes several different conductive-type layers in stack for emitting light when in operation, and the two electrode layers are on both sides. Here, as can be understood, the electric connection of the semiconductor stack layer 1304 to the circuit in the carrier 1300 is not specifically shown but can be known by the one with ordinary skill in the art. The LED die with the semiconductor stack layer 1304 is accomplished in fabrication before packaging to the carrier 1300. The semiconductor stack layer 1304 generally represents the structure of LED for emitting light and is formed on the growth substrate 1306. Actually, the LED die can be fabricated by the process in state-of-the-art without specific limitation. The semiconductor stack layer 1304 is formed on the growth substrate 1306 during fabrication. In packaging process, the LED die is then attached to the carrier 1300, and a surrounding layer 308 is also formed to surround the sidewall of LED die including the growth substrate 1306 and the semiconductor stack layer 1304, but the growth substrate 1306 remains being exposed, as discussed in FIGS. 73A-73D.

Figure 74B:
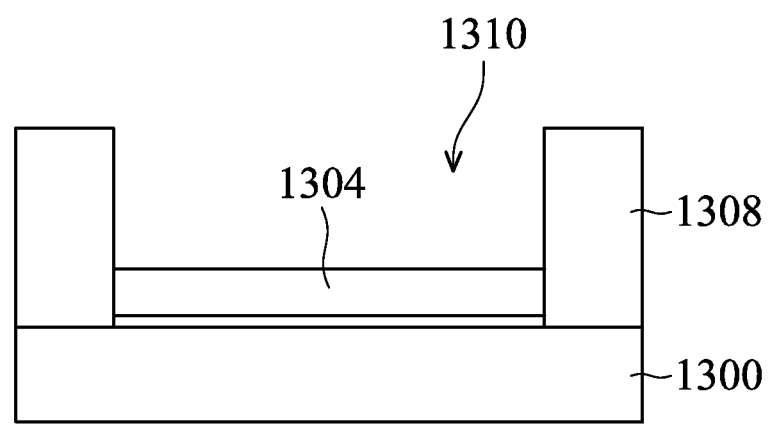

In FIG. 74B, by the same mechanism to lift-off the growth substrate 1306, the laser is applied on the growth substrate 1306, so that the growth substrate 1306 is lifted off, leaving the cavity 1310.

Figure 74C:
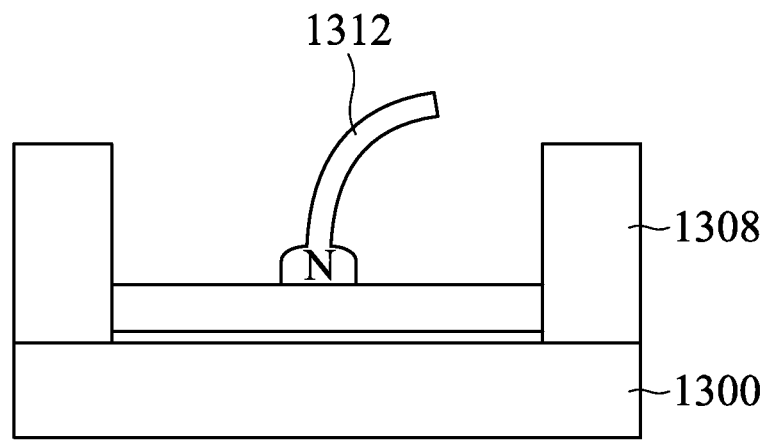

In FIG. 74C, usually, the n-type electrode of the LED die is in contact with the growth substrate 1306, for example. The connection electrode 1312, such as n-type electrode, is bounding to the semiconductor stack layer 1304. The connection electrode 1312 may be the bounding wire.

Figure 74D:
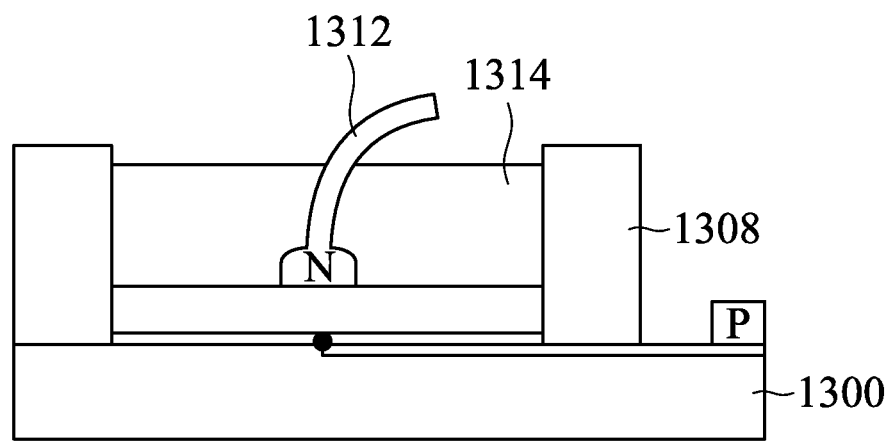

In FIG. 74D, after the connection electrode 1312 is bounded to the electrode of the semiconductor stack layer 1304, the wavelength conversion layer 1314 is filled into the cavity 1310 and cured. Here, as mentioned above, the carrier 1300 has the circuit for external connection. The p-type electrode can be connected to the bottom of the semiconductor stack layer 1304 by the circuit in the carrier 1300. This connection structure is also usually known.

In other words, for the general features in packaging, the disclosure uses the surrounding layer to surround the sub-mount of the LED die. After the sub-mount is lifted, the wavelength conversion layer is filled instead. The wavelength conversion layer is formed and aligned to the LED with self-aligning mechanism. It allows the LED die to be freely attached to the carrier without missing alignment between the LED die and the wavelength conversion layer.

Figure 75:
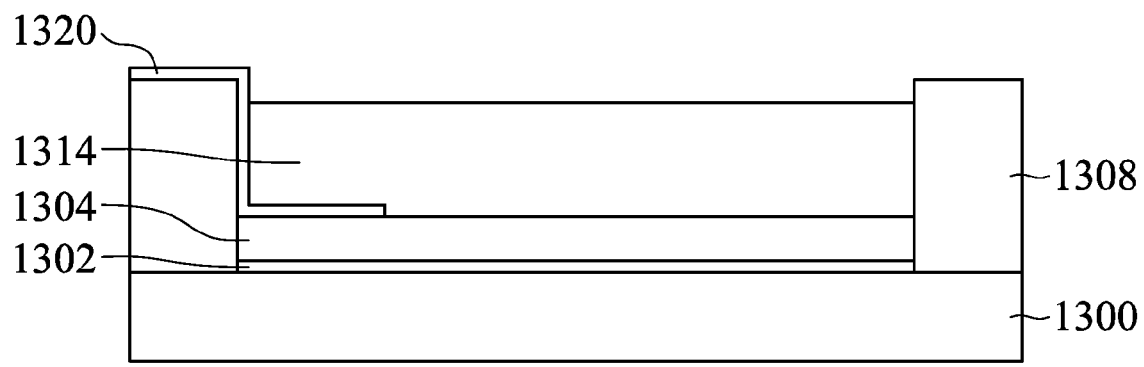
FIGS. 75-77 are cross-sections schematically illustrating the LED package structures, according to various embodiments.
Figure 76:
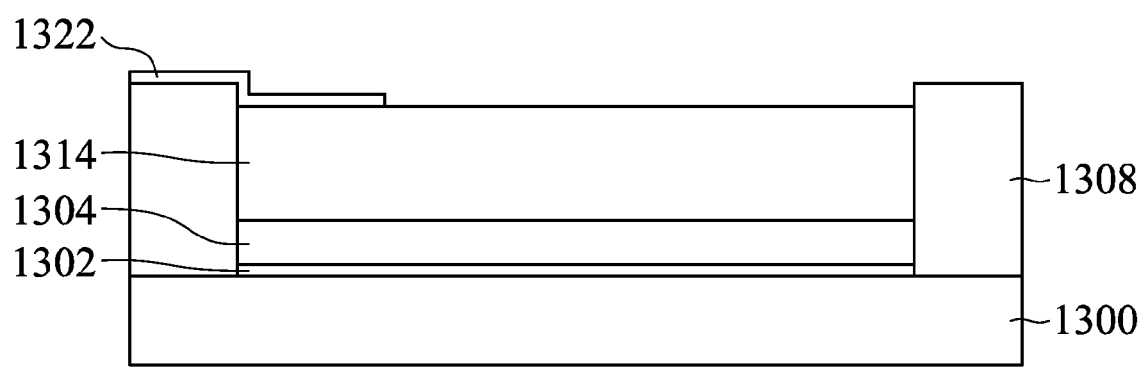
Figure 77:
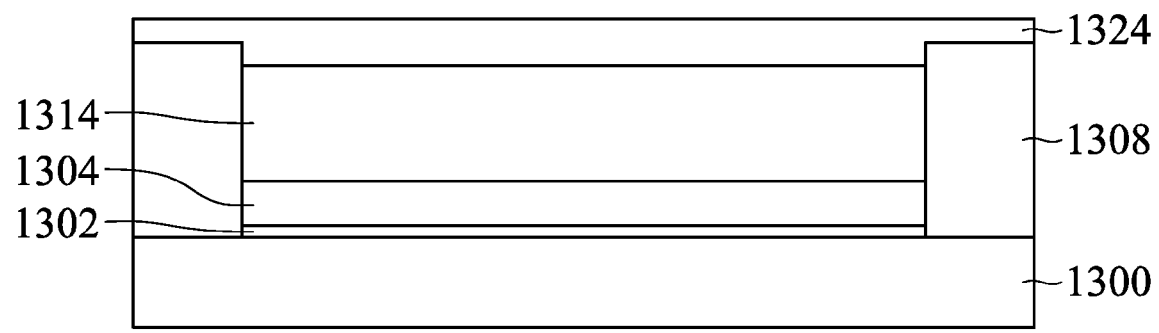

Based on the same mechanism, various modifications can be taken. With respect to the options for forming the connection electrode to the semiconductor stack layer 1304, the electrode can be fabricated in various manners. FIGS. 75-77 are cross-sectional views, schematically illustrating the LED package structures, according to various embodiments.

In FIG. 75, the structure is similar to the previous embodiments. However, the electrode layer 1320 is in different structure. Before the wavelength conversion layer 1314 is filled into the cavity, the electrode layer 1320 can be formed. The electrode 1320 can be a conductive layer in contact with the semiconductor stack layer 1304 and extend to the top surface of the surrounding layer 1308 through the inner sidewall of the surrounding layer 1308. In this manner, the wire bonding is replaced. After the electrode layer 1320 is formed, the wavelength conversion layer 314 can be filled and cured.

In FIG. 76, alternatively, the electrode layer 1320 in FIG. 75 is further modified. In this example, the electrode layer 1322 is similar to the electrode layer 1320 in FIG. 75 but is formed after the wavelength conversion layer 1314 is formed. However, the wavelength conversion layer 1314 is preferably conductive. However, the electric connection to the semiconductor stack layer 1304 can be formed by the usual fabrication process.

In FIG. 77, even further, the electrode layer can use the transparent conductive layer (TCL) as the electrode layer 1324. Material of the TCL is usually known, such as indium tin oxide or any other. Since the electrode layer 1324 is transparent, the transparent electrode layer 1324 can be formed over the whole light emitting area, so that the current can be more uniform. In this situation, the wavelength conversion layer 314 is preferably conductive. However, the transparent electrode layer 1324 can be formed on the semiconductor stack layer 1304 before the wavelength conversion layer 1314 is filled.

In general, the electrode can be formed in accordance with the design without specific limitation.

Figure 78A:
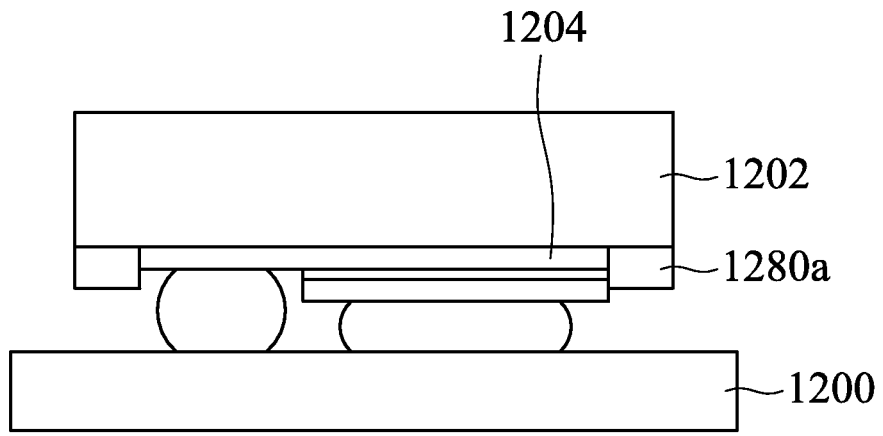
FIGS. 78A-78B are cross-sections schematically illustrating a fabrication process to form the LED package structure, according to another embodiment.
Figure 78B:
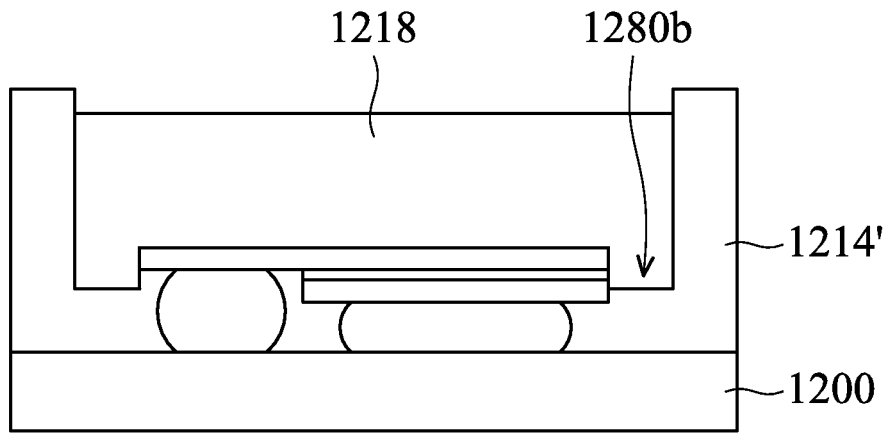

FIGS. 78A-78B are cross-sectional views, schematically illustrating a fabrication process to form the LED package structure, according to another embodiment. In FIG. 78A, the structure is similar to FIG. 73A but the difference is the protruding layer 1280a. When the LED die is fabricated, as the previously described, the growth substrate 1202 is a base for growing the semiconductor layer 1204 and the other layers thereon. The additional protruding layer 1280a is also formed beside the semiconductor layer 1204. The protruding layer 1280a can be, for example, surrounding the semiconductor layer 1204 with contact or not contact. The growth substrate 1202 and the protruding layer 1280a can be different pieces or a single piece as an option. The growth substrate 1202 and the protruding layer 1280a are sacrificial structure, and are to be lifted off later. In this example, the protruding layer 1280a contacts the side of the semiconductor layer 1204. Then, the LED die is bounded to the carrier 1200 by, for example, the flip-chip packaging process, as described in FIGS. 73B-73C.

In FIG. 78B, after the growth substrate 1202 with the protruding layer 1280a is lifted off. The protruding layer 1280a produces the additional indent 1280b. After the wavelength conversion layer 1218 is filled into the cavity above the semiconductor layer 1204 layer, the wavelength conversion layer 1218 also fill the indent 1280b. Since this additional structure, the periphery of the semiconductor stack layer 1304 is further surrounded by the wavelength conversion layer 1218. As a result, the emitted light at the side region can also be modified by the wavelength conversion layer 1218 at the indent 1280b. The light can be more uniform in view angle, particularly to the large viewing angle.

Figure 79:
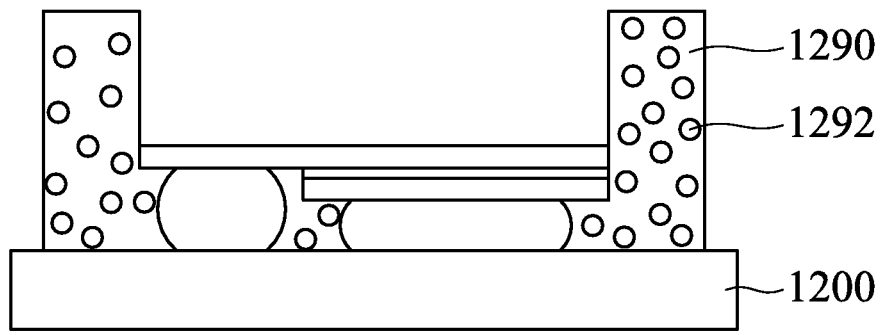
FIGS. 79 and 80 are cross-sections schematically illustrating LED package structures, according to embodiments.

Further, FIG. 79 is a cross-sectional structure, schematically illustrating another LED package structure, according to an embodiment. Depending on the use of the LED package, in FIG. 79, the surrounding layer 290 can be mixed with the fillers 1292, which can absorb light or not absorb light. The surrounding layer 1290 can also be low thermal expansion coefficient, for example. If the fillers 1292 are absorbing light, the emitted light is tended to be confined into a single direction. As a result, the emitted light is directional. However, the wavelength conversion layer can be optionally filled or not. Alternatively, the wavelength conversion layer can also be replaced by other protection material.

Figure 80:
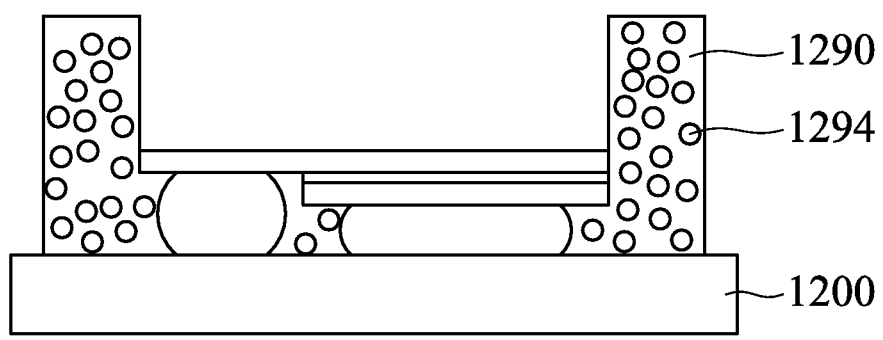

FIG. 80 is a cross-sectional structure, schematically illustrating another LED package structure, according to an embodiment. In FIG. 80, alternatively, the surrounding layer 1290 can be added with the fillers 1294, which are florescent powders. In this situation, the wavelength conversion layer may be omitted. However, the wavelength conversion layer may be still included as an option in design.

Figure 81A:
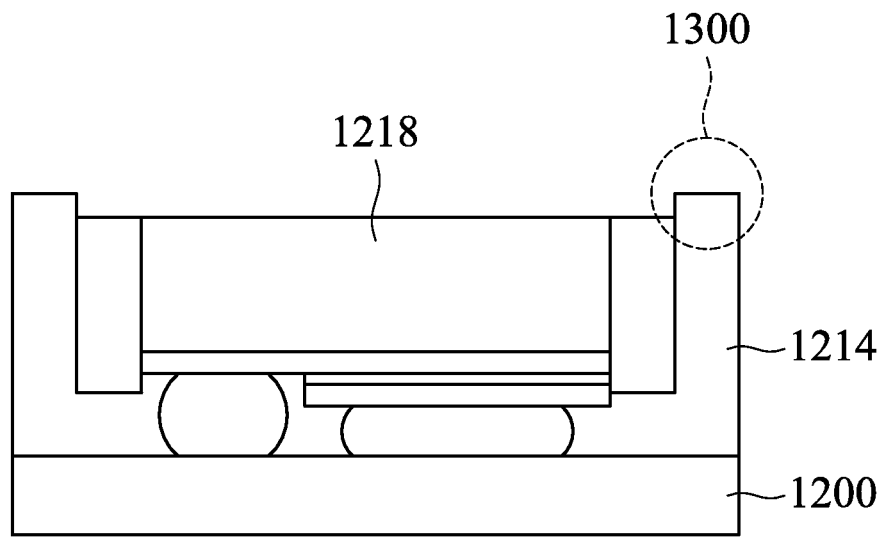
FIG. 81A is a cross-section schematically illustrating another LED package structure, according to an embodiment.
Figure 81B:
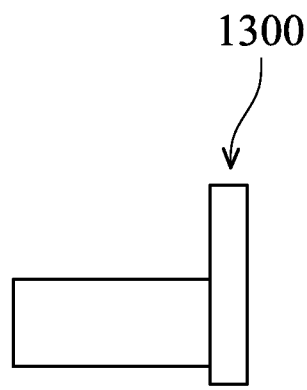
FIG. 81B is a drawing schematically illustrating phenomena at the peripheral portion 1300 in FIG. 81A.

FIG. 81 is a cross-sectional structure, schematically illustrating another LED package structure, according to an embodiment. In FIG. 81, when the wavelength conversion layer 1218 in liquid phase is filled into the cavity of the surrounding layer 1214, the peripheral portion 1300 of the wavelength conversion layer 1218 in contacting with the surrounding layer 1214 preferably has a surface to be ideally perpendicular to the inner sidewall of the surrounding layer 1214. By choosing the proper materials for the surrounding layer 1214 and the wavelength conversion layer 1218, so as to reduce the surface tension, the surface of the wavelength conversion layer at the peripheral portion 1300 can be tend to be perpendicular to the inner sidewall of the surrounding layer 1214.

Figure 82A:
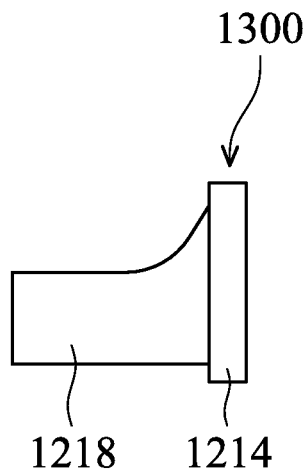
FIGS. 82A and 82B are drawings schematically illustrating phenomena at the peripheral portion 1300 in FIG. 81A.
Figure 82B:
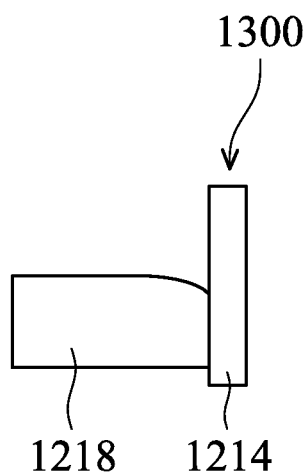

FIG. 82 is a drawing, schematically illustrating phenomena at the peripheral portion 300 in FIG. 81. If the materials between the surrounding layer 1214 and the wavelength conversion layer 1218 causing surface tension, the surface of the wavelength conversion layer 1218 in liquid phase at the contact region can be climbing up suppress down on the sidewall of the surrounding layer 1214, as known in physical phenomenon. If the situation exists, the wavelength conversion layer 1218 at the peripheral region would not be ideally perpendicular as shown in FIG. 81.

Figure 83:
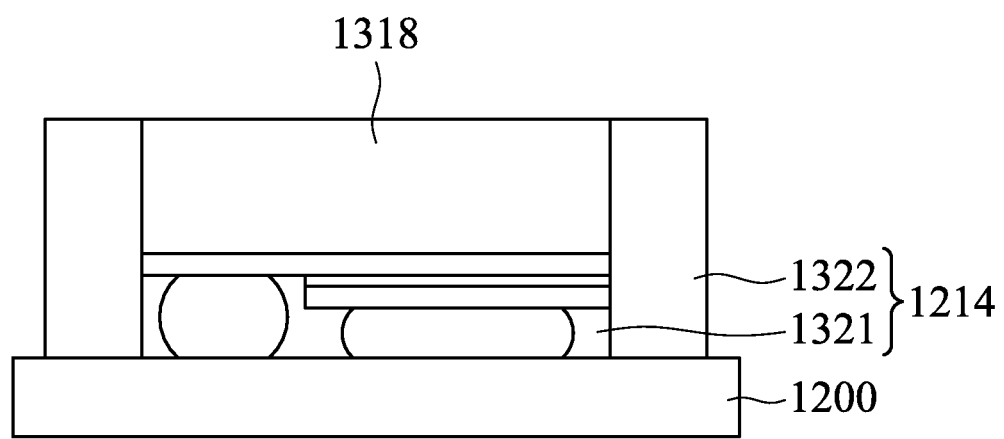
FIG. 83 is a cross-section layer schematically illustrating a structure of the LED package according to another embodiment.

FIG. 83 is a cross-section layer, schematically illustrating a structure of the LED package according to another embodiment. In FIG. 83, the surrounding layer 1214 can be alternatively formed by two parts 1321 and 1322. In other words, the part 1321, such as a material of underfill, can be filled to surround the bonding bumps. Then, another underfill material can be formed to surround the sidewall of the sub-mount (seen i.e. in FIG. 78A as indicated by 1202), as previously described. As a result, the surrounding layer 1214 is composed of two underfill material for more free choices.

Figure 84A:
FIGS. 84A-84H are cross-sections schematically illustrating a fabrication process.
Figure 84B:
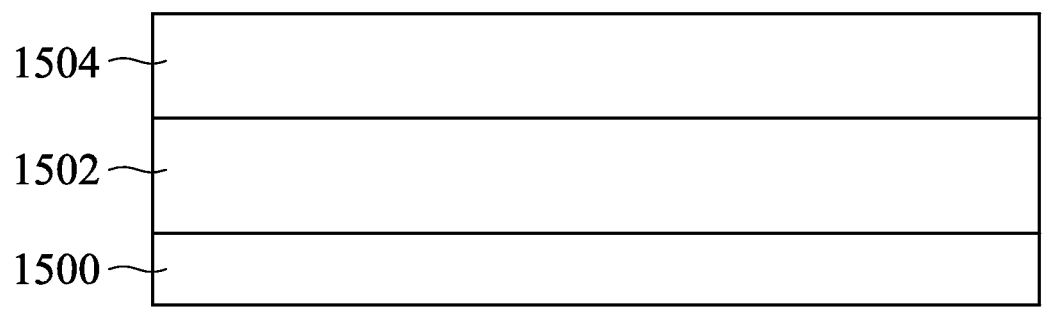
Figure 84C:
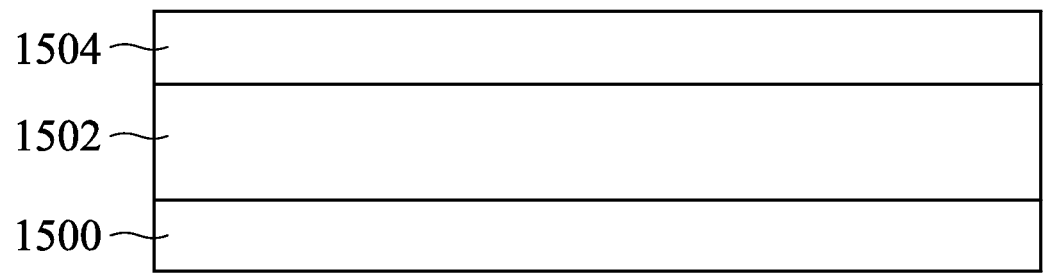
Figure 84D:
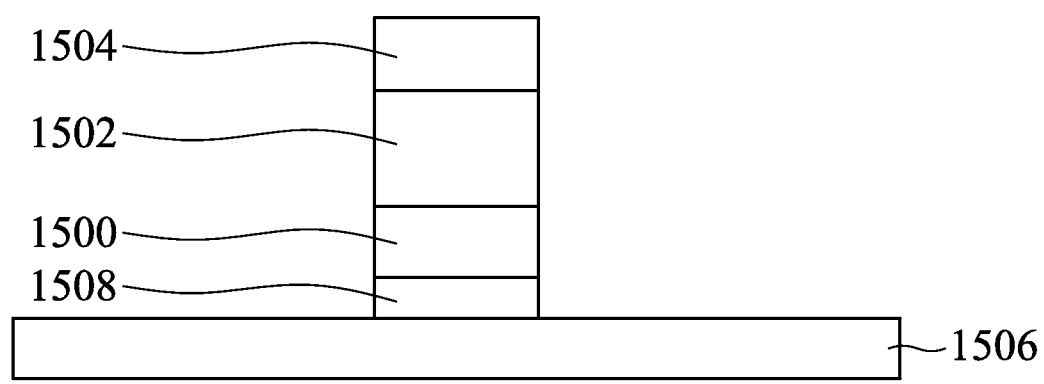
Figure 84E:
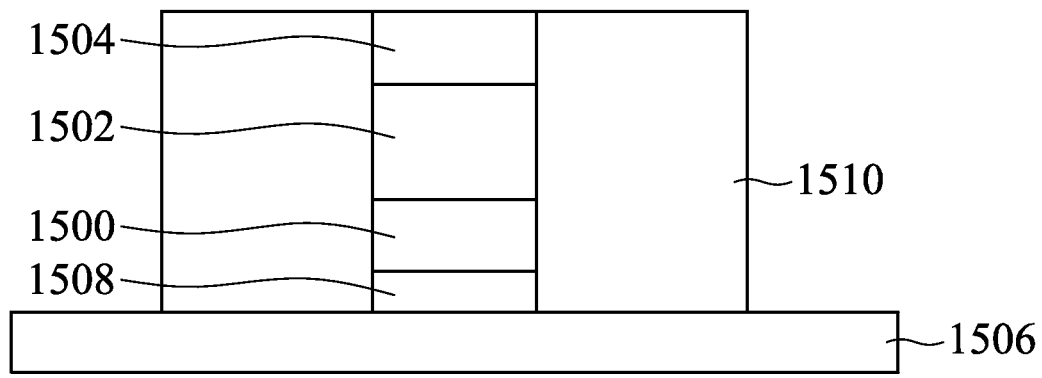
Figure 84F:
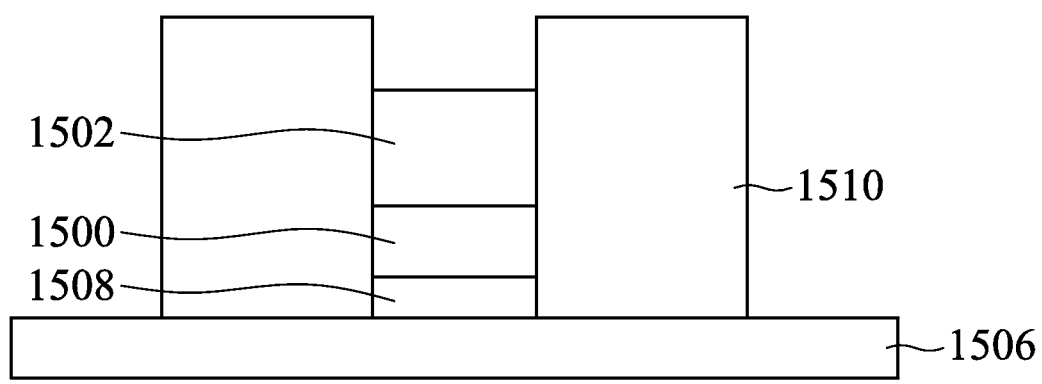
Figure 84G:
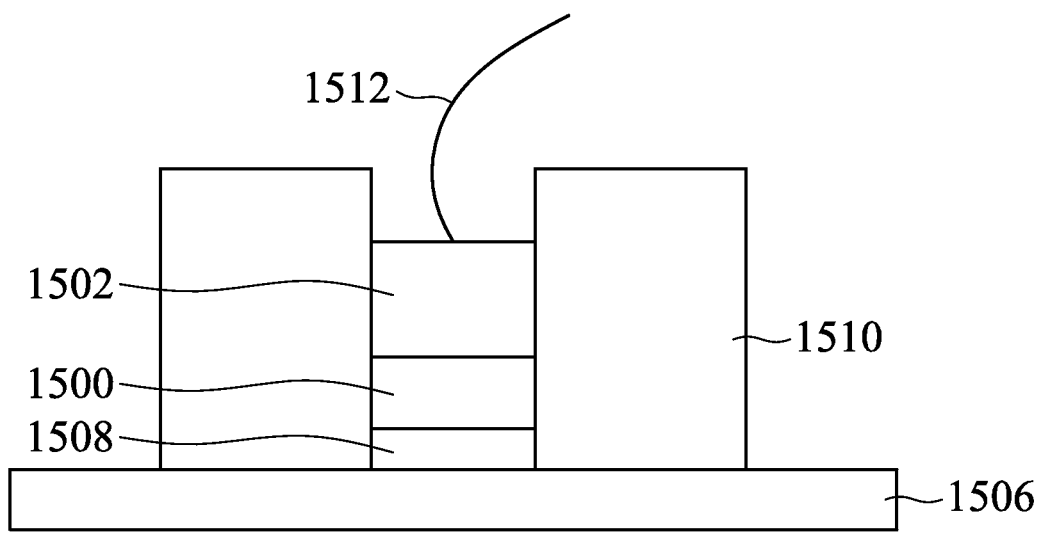
Figure 84H:
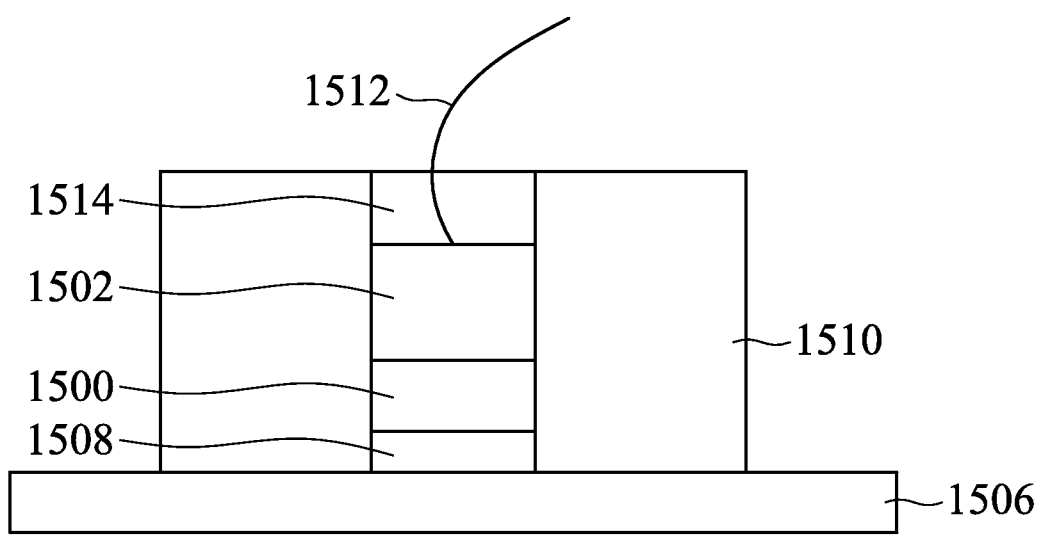

Alternatively with the same concept, FIGS. 84A-84C are cross-sectional views, schematically illustrating a fabrication process. In this embodiment, the sub-mount is not necessary to be lifted off. In FIG. 84A, the semiconductor stack layer 1502 is formed on the sub-mount 1500. The semiconductor stack layer 1502, as previously described, is also usually called epitaxial layer 1502 in short. In FIG. 84B, a removable material layer 1504 is coated on the semiconductor stack layer 1502 with a thickness of, for example, 10 microns or more. Before the LED structure on the sub-mount is sliced into LED die, some additional process may be performed as well. In FIG. 84C, for example, the removable material layer 1504 can be polished to a desired thickness in control. In FIG. 84D, after the LED die is sliced into LED die, the LED dies is bounded to the substrate 1506 by adhesive layer 1508. In FIG. 84E, similar to the previous process, the surrounding layer 1510, such as underfill, is formed to surround the LED die at the sidewall. In FIG. 84E, the removable material layer 1504 is removed, leaving a concave space and the semiconductor stack layer 1502 is exposed. In FIG. 84G, in a packaging process based on boding wire, the bonding wire 1512 can be bounded to the semiconductor stack layer 1502. In FIG. 84H, a wavelength conversion layer 1514 is filled into the cavity on the semiconductor stack layer 1502. In this manner, the sub-mount 1500 remains in the LED die.

Figure 85A:
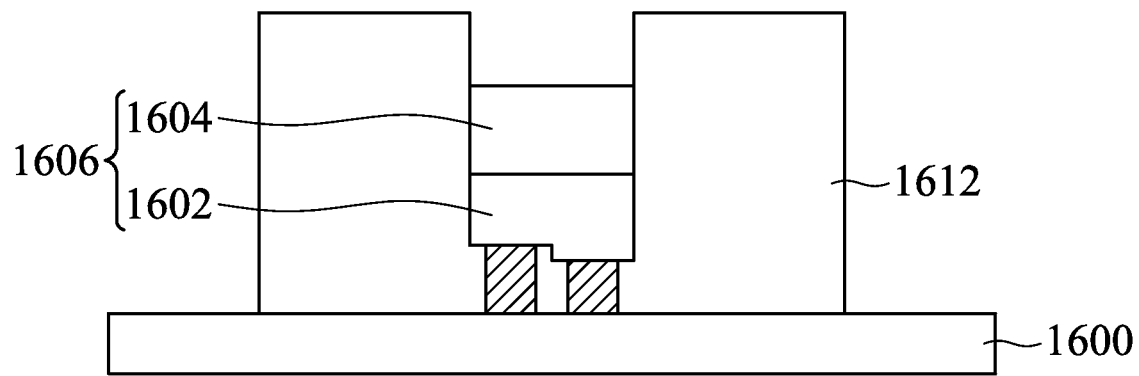
FIGS. 85A-85B are cross-sections schematically illustrating another packaging process based on flip-chip package, according to an embodiment.
Figure 85B:
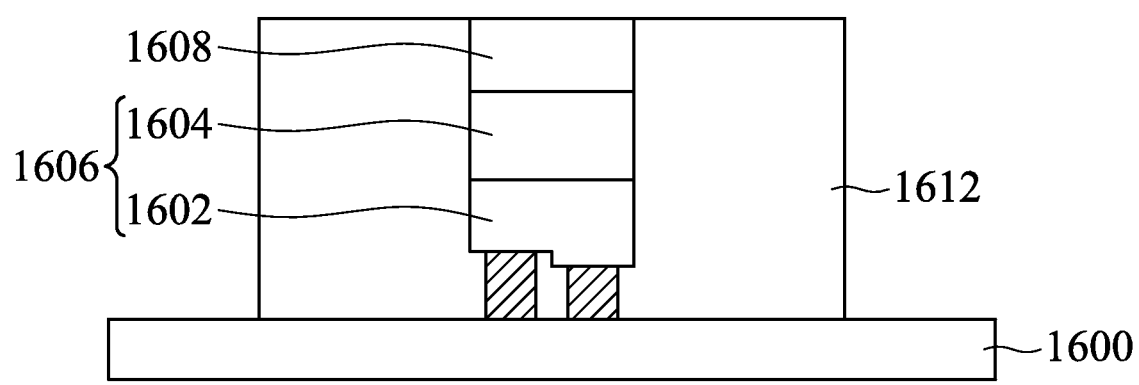

Further, FIGS. 85A-85B are cross-sectional view, schematically illustrating another packaging process based on flip-chip package, according to an embodiment. In FIG. 16A, based on using the removable material layer, the LED die 1606 with the sub-mount 1604 and the semiconductor stack layer 1602 is connected to the circuit substrate 1600 by bonding pads. The surrounding layer 1612 is formed to surround the sidewall of the LED die. After the removable material layer is removed, a cavity is left and the sub-mount 1604 remains. In FIG. 85B, the wavelength conversion layer 1608 is the filled into the cavity. In this manner, the sub-mount 1604 is not lifted off.

Figure 86A:
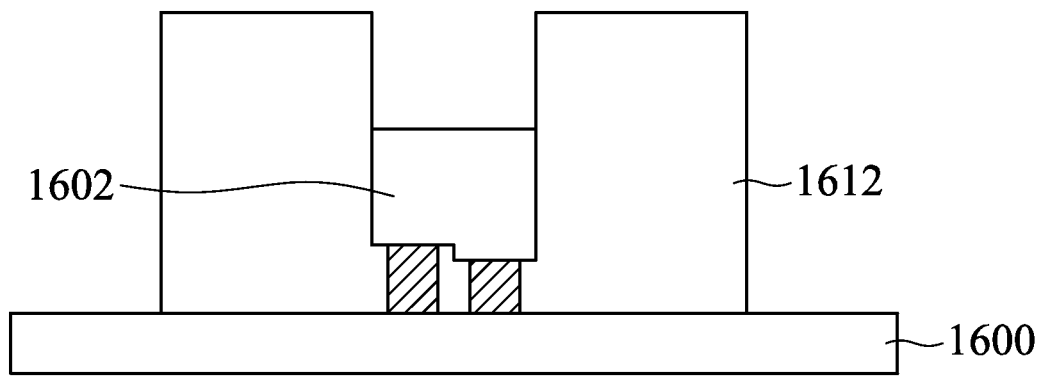
FIGS. 86A-86B are cross-sections schematically illustrating another packaging process based on flip-chip package, according to an embodiment.
Figure 86B:
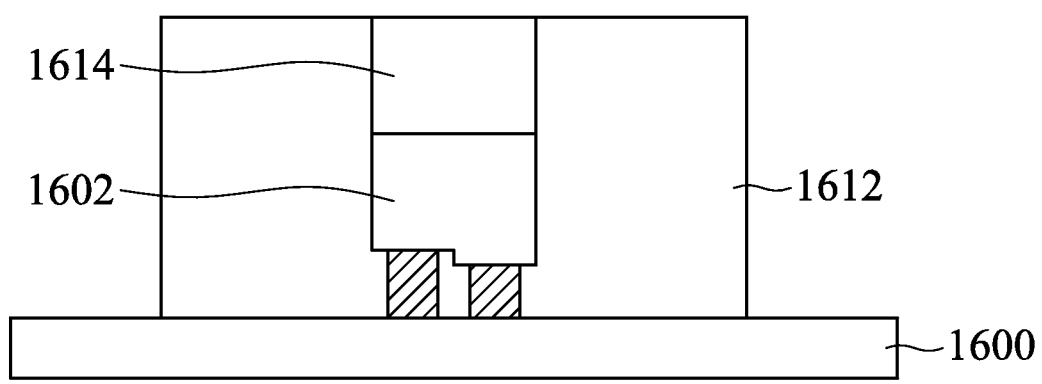

Further, FIGS. 86A-86B are cross-sectional view, schematically illustrating another packaging process based on flip-chip package, according to an embodiment. In FIG. 86A, if the thickness of the wavelength conversion layer needs to be large, then in continuing to FIG. 85A, the sub-mount 1604 is lifted as well. As a result, the deep cavity is formed. In FIG. 86B, the wavelength conversion layer 1614 is filled into the deep cavity.

Figure 87:
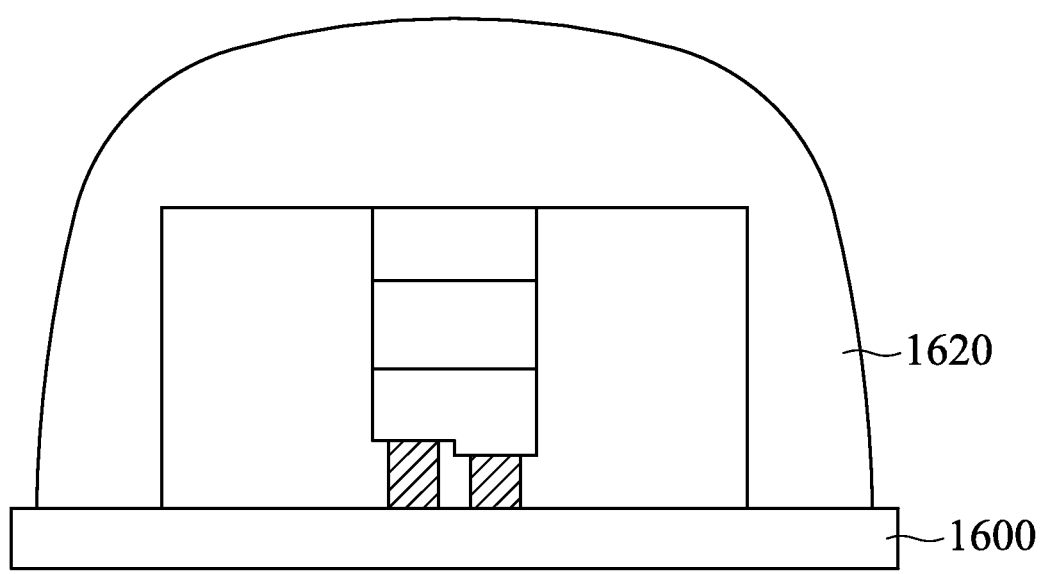
FIG. 87 is a cross-section schematically illustrating another embodiment of the LED package.

FIG. 87 is a cross-sectional view, schematically illustrating another embodiment of the LED package. In FIG. 87, based on the structure in FIG. 85B, another passivation layer, such as another molding compound 1620 can covers over the LED die for further protection.

Figure 88A:
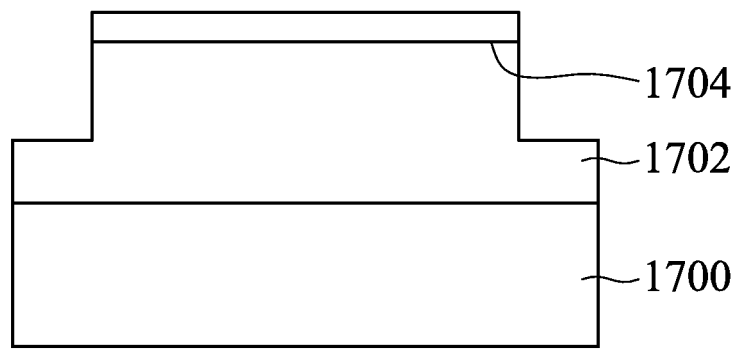
FIGS. 88A-88B are cross-sections schematically illustrating another packaging process based on flip-chip package, according to an embodiment.
Figure 88B:
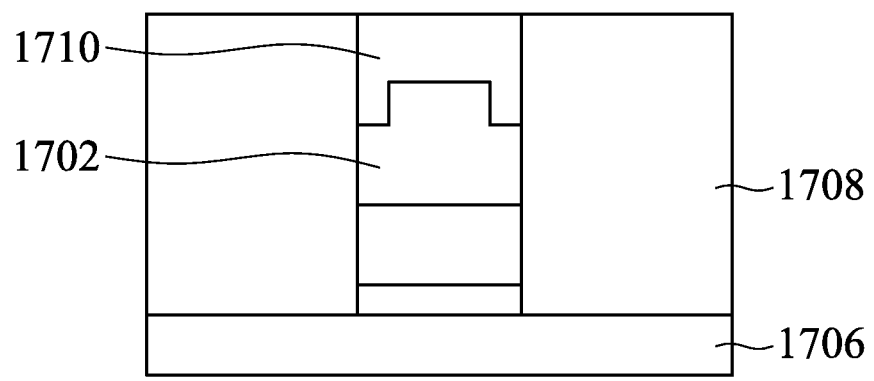

The wavelength conversion layer in previous embodiments is related to the top portion. However, if the side portion is further considered to produce wide angle effect. The wavelength conversion layer can extend to the side portion. FIGS. 88A-88B are cross-sectional views, schematically illustrating another packaging process based on flip-chip package, according to an embodiment. In FIG. 88A, the semiconductor stack layer 1702 on the sub-mount 1700 can be further patterned to have indent region at the side portion. The position of the active layer 1704 in the semiconductor stack layer 1702 can be formed at the upper portion above the indent level. The removable material layer is formed as previously described.

In FIG. 88B, following the same processes as previously described, the LED die with the sub-mount 1700 is adhered to the circuit substrate 1706. The surrounding layer 1708 surrounds the sidewall of the LED die. The wavelength conversion layer is removed, leaving a cavity space. Then, the wavelength conversion layer 1710 is filled into the cavity space. In this manner, the wavelength conversion layer 1710 can extend to the sidewall of the LED die to surround the active layer 1704.

Figure 89A:
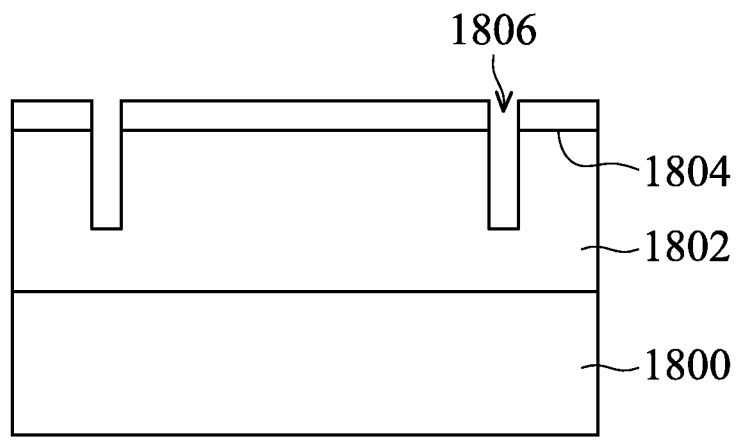
FIGS. 89A-89B are cross-sections schematically illustrating another packaging process based on flip-chip package, according to an embodiment.
Figure 89B:
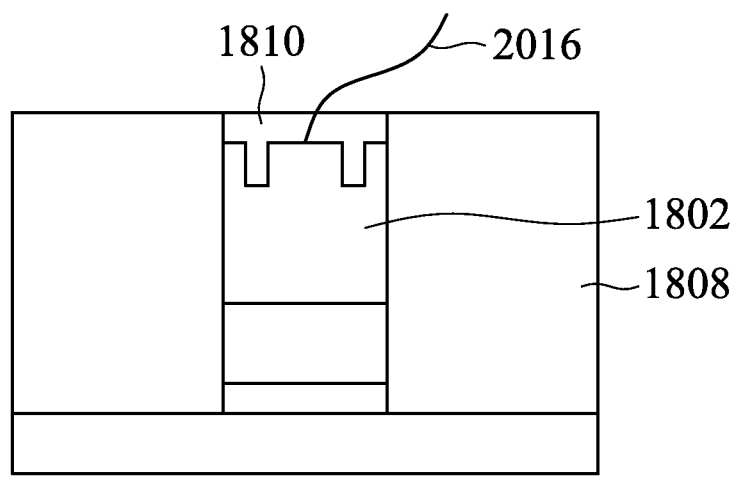

Alternatively, the side portion of the wavelength conversion can be modified. FIGS. 89A-89B are cross-sectional views, schematically illustrating another packaging process based on flip-chip package, according to an embodiment. In FIG. 89A, the semiconductor stack layer 1802 with the active later 1804 is formed on the sub-mount 1800. A trench 1806 can be formed in the semiconductor stack layer 1802 at the peripheral region, surrounding the central portion.

In FIG. 89B, as previously described, the surrounding layer 1808 is formed to surround the sidewall of the LED die. After the removable material layer is removed, a cavity space is left for filling the wavelength conversion layer 1810. Since the wavelength conversion layer 1810 has the side portion, lower than the active layer 1804, the emitted light to the side direction can be also converted by the wavelength conversion layer 1810.

Figure 90A:
FIGS. 90A-90J are cross-sections schematically illustrating a fabrication process for a structure, according to an embodiment.
Figure 90B:
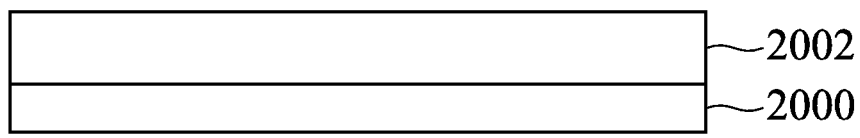
Figure 90C:
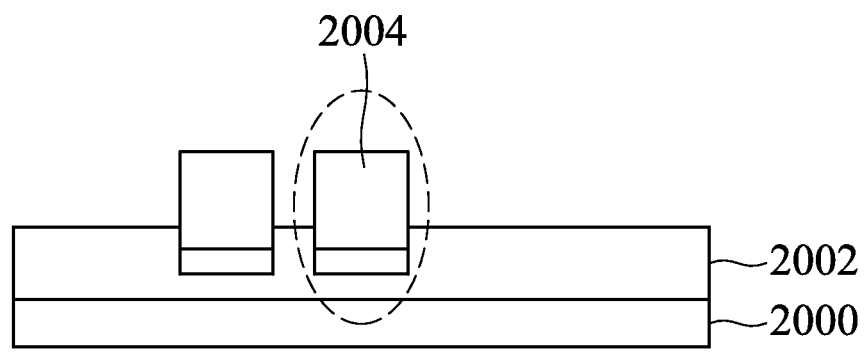
Figure 90D:
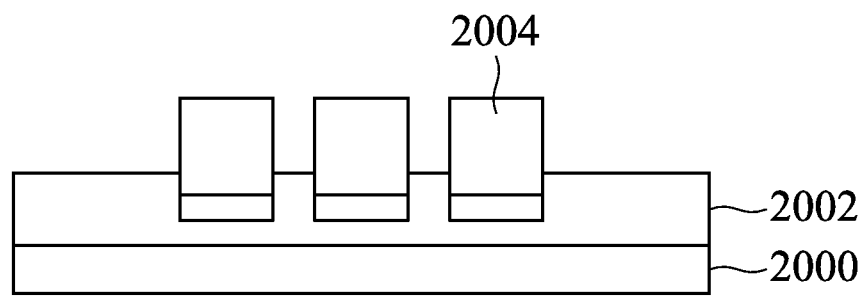
Figure 90E:
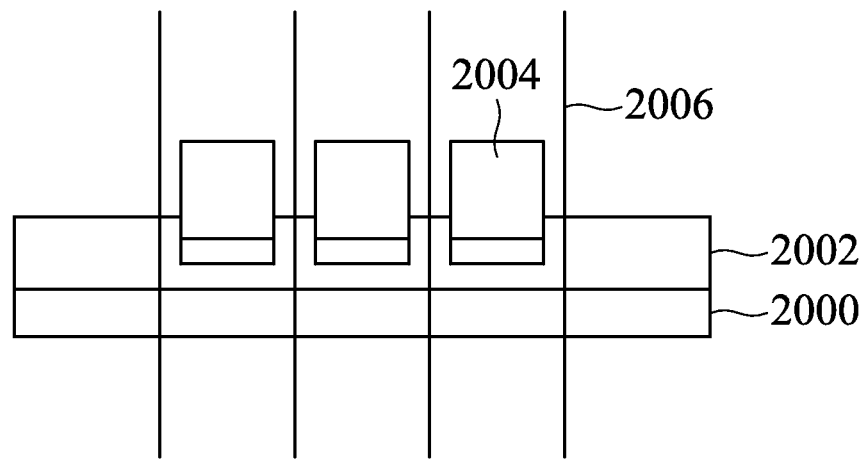
Figure 90F:
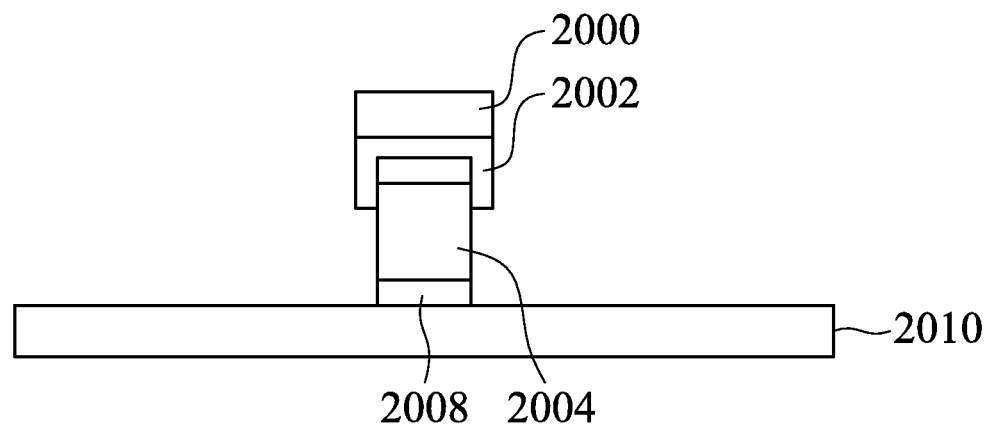
Figure 90G:
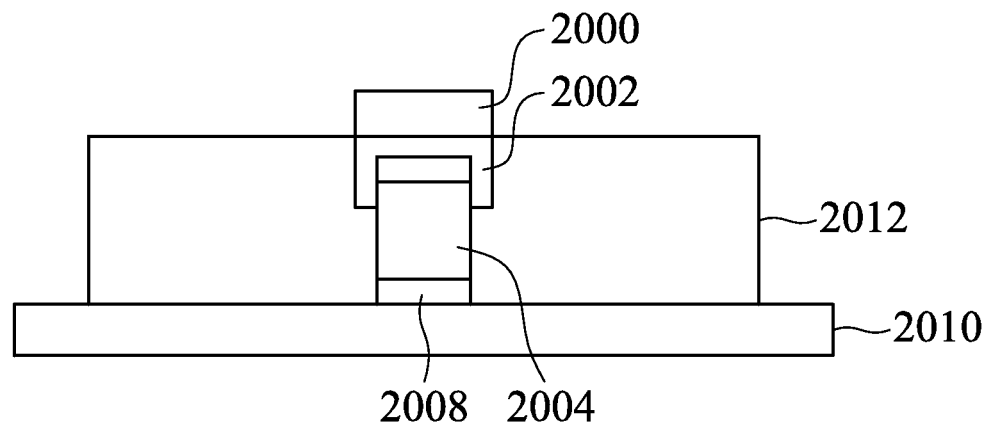
Figure 90H:
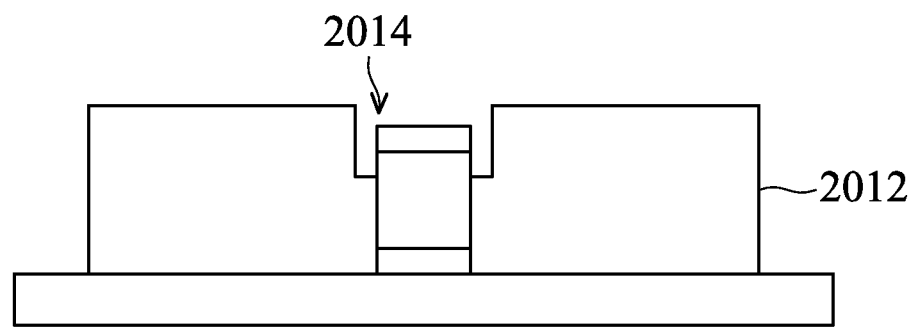
Figure 90I:
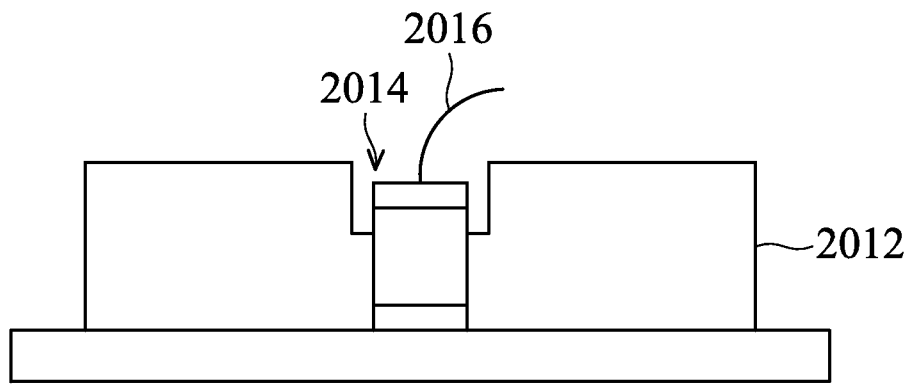
Figure 90J:
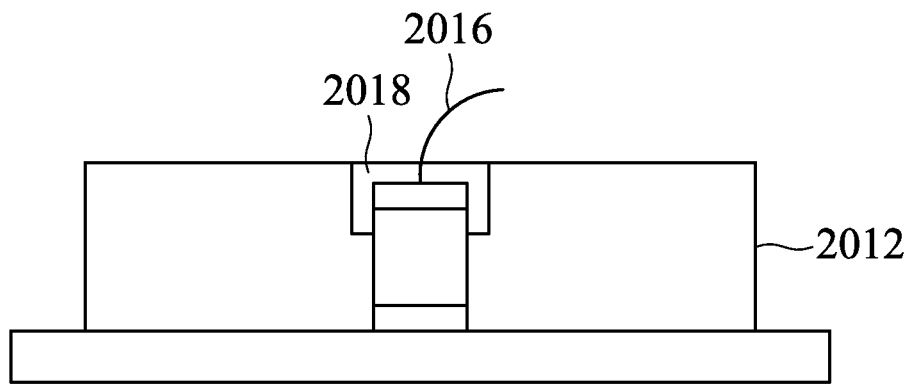

Further alternatively, FIGS. 90A-90J are cross-sectional views, schematically illustrating a fabrication process for a structure, according to an embodiment. In FIG. 90A, a sacrificial substrate 2000 is provided. In FIG. 90B, a sacrificial adhering layer 2002, such as photoresist, is formed on the sacrificial substrate 2000. The LED dies 2004 are disposed on the sacrificial adhering layer 2002. Here, the LED die may have the sub-mount, as previously described. In FIG. 90D, all the LED dies 2004 are disposed on the sacrificial adhering layer 2002 at the determined positions. In FIG. 90E, the slicing process 2006 is performed to cut into the LED dies 2004 into individual dies. Taking one cut LED die 2004 for descriptions, the LED die 2004 with the sacrificial substrate 2000 and sacrificial adhering layer 2002 is flip-chip adhered on to the substrate 2010 by the adhering layer 2008. The substrate 2010 usually has a circuit structure, as previously described. The proper electric connection for the packaging structure can be known by the one with ordinary skill in the art. In FIG. 90G, a surrounding layer 2012 is formed on the substrate 2010 but the sacrificial substrate 2000 remains exposed. In FIG. 90H, the sacrificial substrate 2000 and the sacrificial adhering layer 2002 are removed to form a concave space 2014, for exposing a top and at least a portion of the sidewall of the LED die 2004. In FIG. 90I, a wire bonding process is performed with bonding wire 2016 for electric connection to the LED die 2004. In FIG. 90J, a wavelength conversion layer 2018, such as fluorescent layer, is filled into the concave space 2014. Since the sacrificial adhering layer 2002 in FIG. 90F is also covering a portion of the sidewall of the LED die 2004, the wavelength conversion layer 2018 can also cover the same portion of the sidewall of the LED die 2004. The luminance at side angle can be improved being more uniform.

Figure 91A:
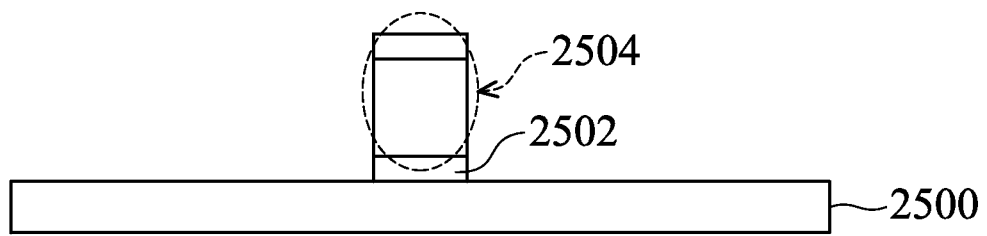
FIGS. 91A-91F are cross-sections schematically illustrating the same structure in FIGS. 90A-90J but in different fabrication process, according to an embodiment.
Figure 91B:
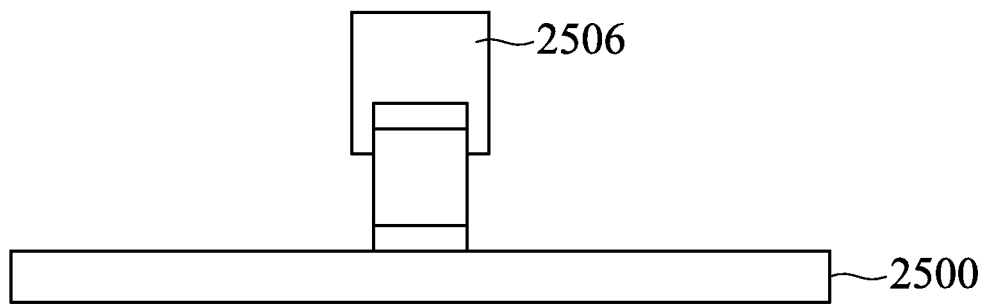
Figure 91C:
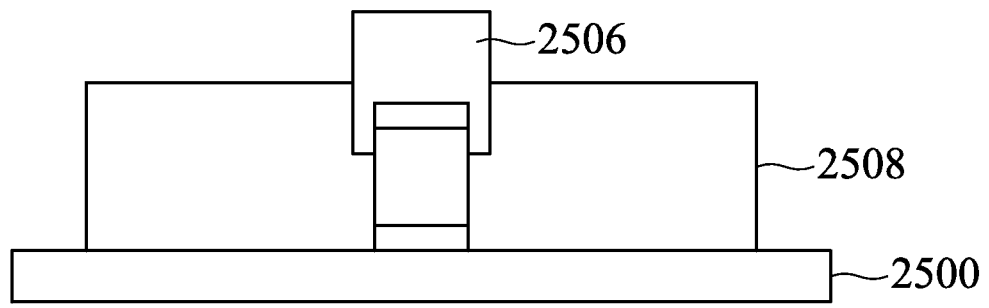
Figure 91D:
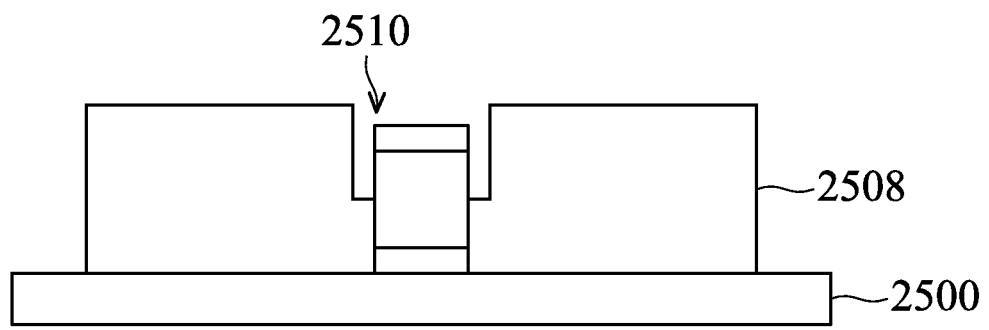
Figure 91E:
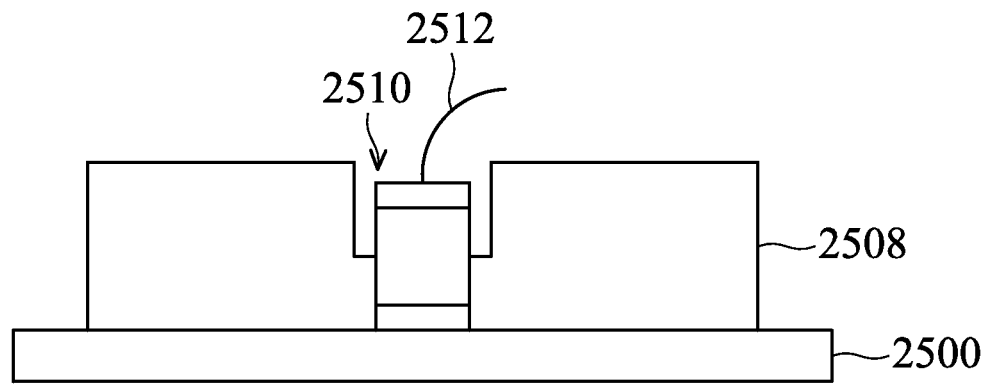
Figure 91F:
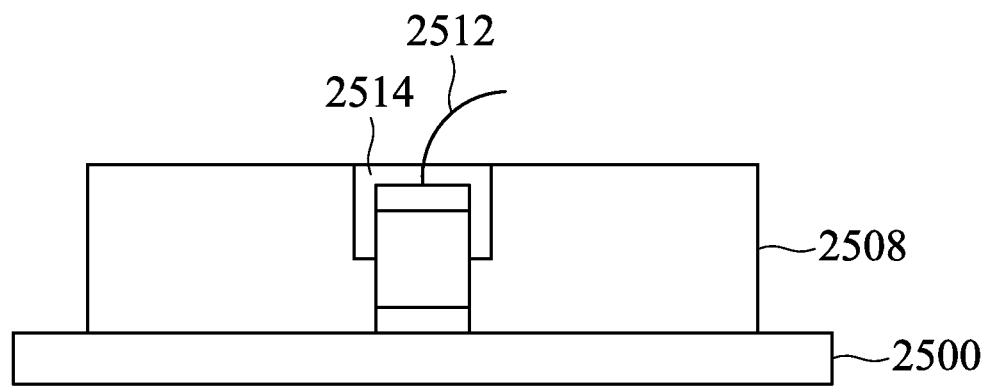

FIGS. 91A-91F are cross-sectional views, schematically illustrating the same structure in FIG. 122 but in different fabrication process, according to an embodiment. In FIG. 91A, an LED die 2504 is adhered to a substrate 2500 by an adhering layer 2502. In FIG. 91B, a removable cap 2506 is formed over the top portion of the LED die 2504. In FIG. 91C, a surrounding layer 2508 is formed on the substrate, surrounding the sidewall of the LED die 2504 and the removable cap 2506, in which at least a top of the removable cap 2506 is still exposed. Here, the LED die 2504 may include the sub-mount. In FIG. 91D, the removable cap 2506 is removed. As a result, a concave space 2510 is formed and the LED die 2504 is exposed by the concave space 2510. Also for example, the sub-mount may also be removed as well. However, in this example, the sub-mount remains in this example. In FIG. 91E, the bonding procedure, such as wire bonding, is performed. The bonding wire 2512 is connected to the LED die 2504. In FIG. 91F, the wavelength conversion layer 2514, such as fluorescent material, is filled into the concave space 2510. Since the wavelength conversion layer 2514 also covers at least a portion of sidewall of the LED die 2504, the light illumination is more uniform in wide angle range.

Actually, the above embodiments can be further properly combined to one another for another structure. The present disclosure forms the surrounding layer at least at the sidewall of the sub-mount in LED die in packaging process, wherein the LED die have bee formed accomplished. As result, the sub-mount of the LED die in one option can be easily removed and leave a cavity for filling the wavelength conversion layer. Alternatively, the surrounding layer can be also mixed with fillers, for further producing the intended effect for emitting light.

Further, if the sub-mount is intended to remain, the removable material layer can reserve the cavity space for filling the wavelength conversion layer, instead.

Figure 92A:
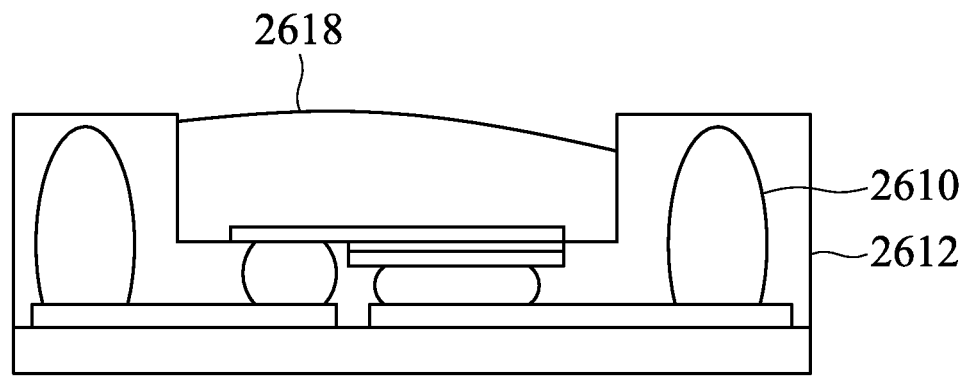
FIGS. 92A-92C are cross-sections schematically illustrating a fabrication process for a structure, according to an embodiment.
Figure 92B:
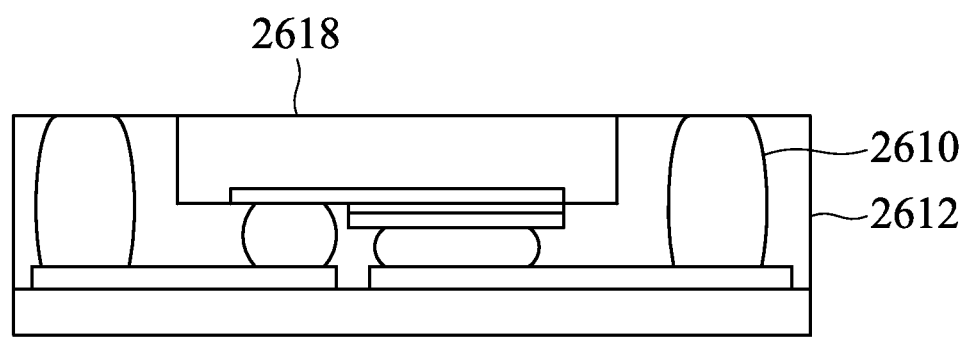
Figure 92C:
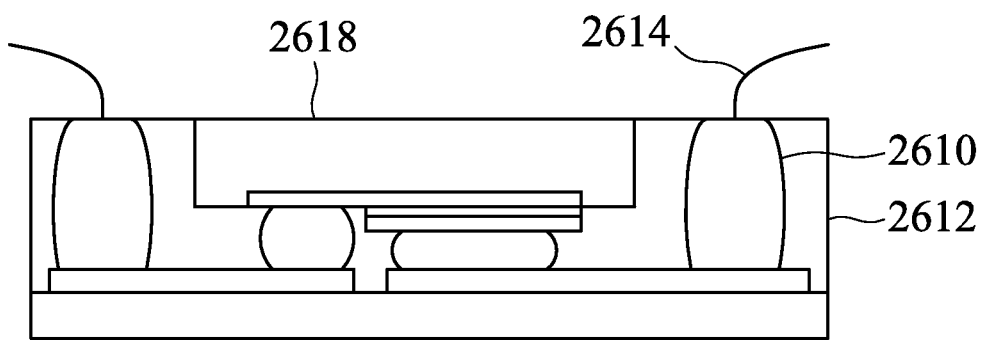
Figure 93A:
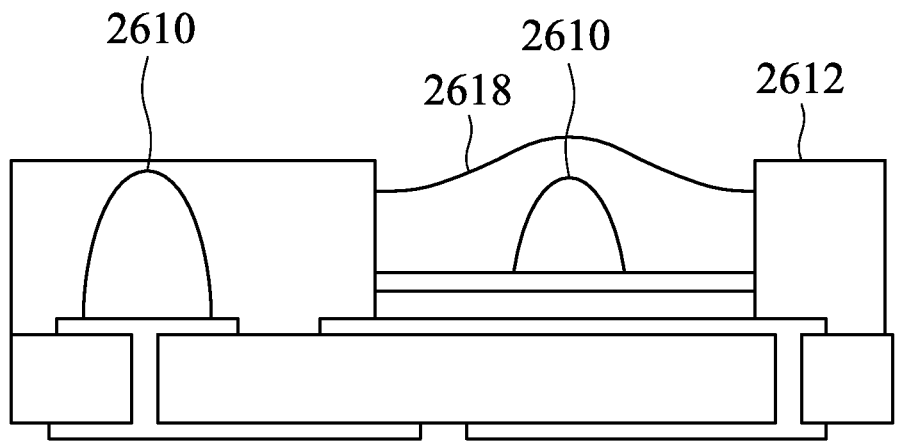
FIGS. 93A-93C are cross-sections schematically illustrating a fabrication process for a structure, according to an embodiment.
Figure 93B:
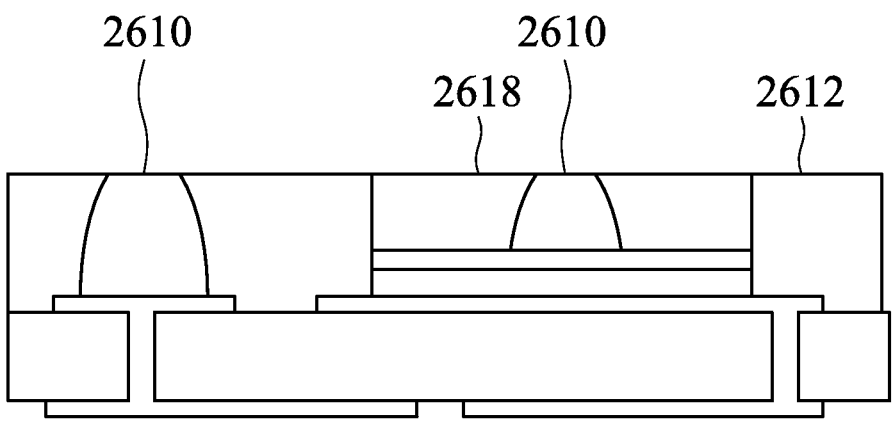
Figure 93C:
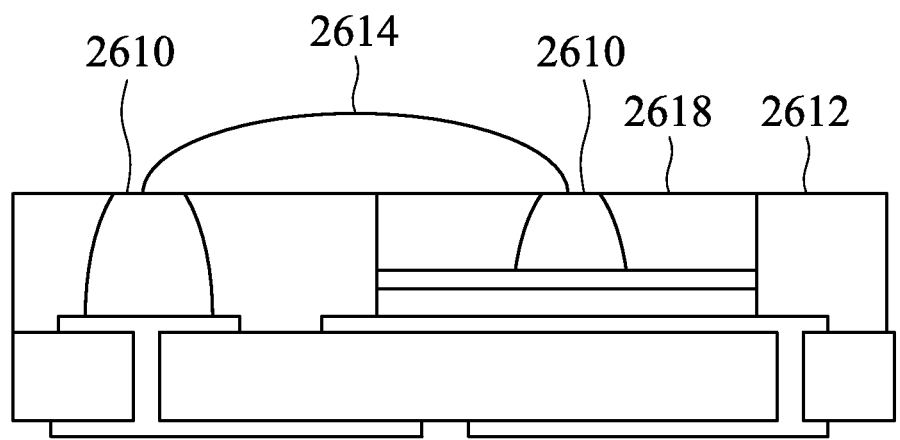
Figure 94A:
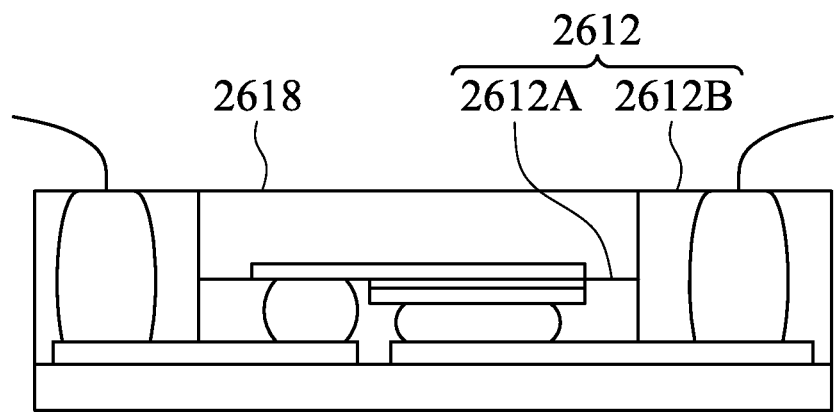
FIGS. 94A and 94B are cross-sections schematically illustrating a fabrication process for a structure, according to an embodiment.
Figure 94B:
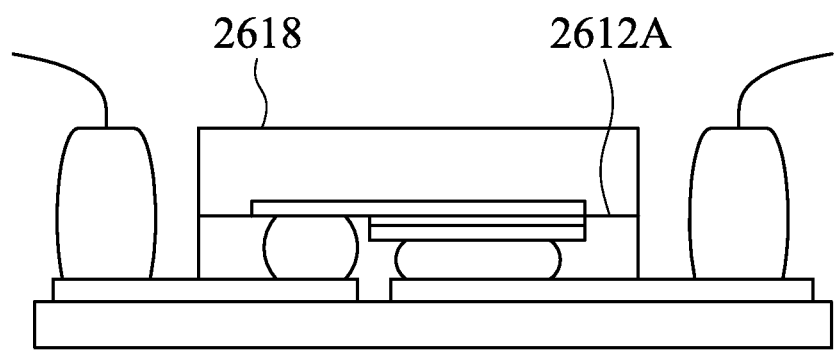

Further, in embodiments, when the filled wavelength conversion layer 2618 is uneven (referring to FIG. 92A and FIG. 93A), a planarization process (such as chemical mechanical planarization) can be subjected to the wavelength conversion layer 2618, the metal pads 2610, and the encapsulant 2612 to form an even top surface of the filled wavelength conversion layer 2618, referring to referring to FIG. 92B and FIG. 93B. After the planarization process, bonding wires 2614 can be bonded to the metal pads 2610 to achieve electrical connection, referring to FIG. 92C and FIG. 93C. Referring to FIG. 94A, the encapsulant 2612 can consist of two different material, such as a first resin layer 2612A and a second resin layer 2612B. The first resin layer 2612A can serve as a underfill layer to firm the light emitting diode chip bonding structure, and the second resin layer 2612B can be optionally removed after filling the wavelength conversion layer 2618, referring to FIG. 94B.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting diode chip, comprising:
a growth substrate having a first boundary; and
a stack structure depositing on the growth substrate, wherein the stack structure comprises a first semiconductor layer, a light emitting layer, and a second semiconductor layer formed sequentially thereon, and the stack structure further having a second boundary,
wherein the light emitting diode chip is characterized by a connecting layer disposed on a top surface of the second semiconductor layer, and an interface between the connecting layer and the second semiconductor layer occupies 20-99% of the top surface of the second semiconductor layer, and a minimum horizontal distance between the first boundary and the second boundary is more than about 3 μm to prevent cracking when stripping away the growth substrate from the stack structure.

2. The light emitting diode chip of claim 1, wherein the minimum horizontal distance is of more than about 10 μm.

3. The light emitting diode chip of claim 1, further comprising a passivation layer disposed on side walls of the light emitting layer and side walls of the first semiconductor layer.

4. The light emitting diode chip of claim 3, wherein the passivation layer is further disposed between the second semiconductor layer and the connecting layer, wherein a portion of the connecting layer still directly contacts the second semiconductor layer.

5. The light emitting diode chip of claim 1, wherein the light emitting diode chip has tapered side walls.

6. The light emitting diode chip of claim 5, wherein the tapered side walls of the light emitting diode chip are toward the growth substrate.

7. The light emitting diode chip as claimed in claim 3, wherein the passivation layer is further disposed side walls of the second semiconductor layer.

8. The light emitting diode chip as claimed in claim 1, further comprising:
a reflective layer disposed between the second semiconductor layer and the connecting layer.

9. A light emitting diode package structure, comprising:
a stack structure having a first semiconductor layer, a light emitting layer, and a second semiconductor layer, wherein the light emitting layer is sandwiched between the first semiconductor layer and the second semiconductor layer;
a connecting layer deposed directly on the second semiconductor layer, wherein a first surface of the connecting layer directly contacts to a second surface of the second semiconductor layer; and
a carrier substrate bonded with the stack structure via the connecting layer, wherein the area of the first surface of the connecting layer is smaller than the area of the second surface of the second semiconductor layer.

10. The light emitting diode package structure as claimed in claim 9, further comprising:
a reflective layer disposed between the connecting layer and the carrier substrate.

11. The light emitting diode package structure as claimed in claim 9, wherein the connecting layer comprises:
a first connecting layer, directly contacting the carrier substrate; and
a second connecting layer, directly contacting the second semiconductor layer, wherein at least one of the first connecting layer and the second connecting layer has an island structure.

12. The light emitting diode package structure as claimed in claim 9, wherein the connecting layer has a thickness which is equal to or less than 50 µm.

13. The light emitting diode package structure as claimed in claim 9, further comprising:
a passivation layer disposed on side walls of the first semiconductor layer, and side walls of the light emitting layer.

14. The light emitting diode package structure as claimed in claim 9, wherein the passivation layer is further disposed side walls of the second semiconductor layer.

15. The light emitting diode package structure as claimed in claim 9, wherein the carrier substrate has a plurality of recesses.

16. The light emitting diode package structure as claimed in claim 9, wherein the carrier substrate comprises a submount or a package substrate.

17. A light emitting diode structure, comprising:
a carrier substrate having a first surface and a second surface opposite the first surface;
a stack structure comprising a first semiconductor layer, an light emitting layer, and a second semiconductor layer disposed on the first surface;
a first electrode disposed apart from the stack structure on the first surface;
a passivation layer covering side walls of the light emitting layer; and
an electrically conductive thin film layer for connecting the first electrode to the stack structure, wherein the electrically conductive thin film layer covers the stacked structure.

18. The light emitting diode structure as claimed in claim 17, further comprising:
an electrostatic discharge protection element disposed under the first electrode and embedded in the carrier substrate.

19. The light emitting diode structure as claimed in claim 18, wherein the material of the electrostatic discharge protection element is p-type silicon.

20. The light emitting diode structure as claimed in claim 17, wherein the carrier substrate is made of a doped semiconductor with a thickness of less than 300 µm.

21. The light emitting diode structure as claimed in claim 17, further comprising a second electrode disposed on the second surface of the carrier substrate.

22. The light emitting diode structure as claimed in claim 17, wherein the electrically conductive thin film layer encircles the side walls of the stack structure, and is separated from the stack structure by the passivation layer.

23. The light emitting diode structure as claimed in claim 17, wherein the first electrode substantially surrounds the lateral sides of the stack structure leaving a notch disconnected.

24. The light emitting diode structure as claimed in claim 17, further comprising:
a connecting layer disposed between the stack structure and the carrier substrate, wherein a third surface of the connecting layer directly contacts to a forth surface of the second semiconductor layer, and wherein the area of the third surface of the connecting layer is smaller than the area of the forth surface of the second semiconductor layer.

25. The light emitting diode structure as claimed in claim 24, wherein the connecting layer further comprises a reflective layer being capable of reflecting the light generated by the light emitting layer.

26. The light emitting diode structure as claimed in claim 17, wherein the carrier substrate further comprises a cavity on the first surface for receiving the stack structure.

27. The light emitting diode structure as claimed in claim 17, wherein the stack structure comprises a plurality of light extracting features corresponding to the electrically conductive thin film.

28. The light emitting diode structure as claimed in claim 17, wherein the light transmittance of the electrically conductive thin film layer for a peak wavelength of the light generated by the light emitting layer is greater than 60%.

29. The light emitting diode structure as claimed in claim 27, wherein the electrically conductive thin film layer comprises a plurality of concaves corresponding to the plurality of light extracting features of the stack structure.

30. A method of forming a light emitting diode structure, comprising the steps of:
forming a first electrode on a carrier substrate having a first surface and a second surface;
providing a stack structure and bonding the stack structure on the first surface of the carrier substrate, wherein the stack structure is freestood from the first electrode;
forming a passivation layer on the first electrode, the stack structure and a space between the first electrode and the stack structure;
removing a part of the passivation layer over the first electrode and a part of the passivation layer over the stack structure to expose the first electrode and the stack structure;
forming an electrically conductive thin film layer on the first electrode and the stack structure for electrically connecting the first electrode and the stack structure; and
dicing the carrier substrate to form a light emitting diode structure.

31. The method as claimed in claim 30, wherein the carrier substrate is made of a doped semiconductor with a thickness of less than 300 µm.

32. The method as claimed in claim 30, wherein the step of providing the stack structure and bonding the stack structure on the first surface comprises:
- forming a first semiconductor layer on a growth substrate;
- forming a light emitting layer on the first semiconductor layer;
- forming a second semiconductor layer on the light emitting layer, wherein the first semiconductor layer, the light emitting layer and the second semiconductor layer form the stack structure on the growth substrate;
- forming a connecting layer on the second semiconductor layer;
- bonding the connecting layer to the first surface of the carrier substrate; and
- removing the growth substrate from the stack structure.

33. The method as claimed in claim 32, wherein the step of bonding the connecting layer to the first surface of the carrier substrate comprises the step of:
- applying ultrasonic energy or heat to the carrier substrate and the connecting layer.

34. The method as claimed in claim 32, wherein the step for removing the growth substrate from the stack structure comprises the step of:
- projecting a laser beam onto the growth substrate and the stack structure.

35. The method as claimed in claim 30, wherein the passivation layer is formed by spinning coating or plasma enhanced chemical vapor deposition (PECVD).

36. The method as claimed in claim 30, wherein the parts of the passivation layer are removed by etching.

37. A light emitting diode structure, comprising:
- a carrier substrate having a first electrical trace and a second electrical trace formed thereon,
- a stack structure bonded on the carrier substrate, wherein the stack structure, with a thickness of less than 20 μm, comprises a first semiconductor layer, a light emitting layer, and a second semiconductor layer, and the stack structure is further electrically connected with the first electrical trace and having a thickness that is less than 20 μm;
- a first stud bump having a thickness of more than 15 μm and being electrically connected to the second electrical trace;
- an encapsulant being deposed on the carrier substrate, wherein the encapsulant encircles the stack structure and the stud bump, leaving a first opening to expose a top surface of the stack structure and a second opening to expose a top surface of the stud bump; and
- a wavelength conversion layer filling in the first opening and covering the top surface of the stack,
- wherein a top surface of the wavelength conversion layer is substantially parallel to the top surface of the stack structure.

38. The light emitting diode structure as claimed in claim 37, wherein the stack structure is flip-chip bonded on the carrier substrate.

39. The light emitting diode structure as claimed in claim 37, further comprising a lens structure covering the light emitting diode structure, wherein the material of lens structure is the same as that of the encapsulant.

40. The light emitting diode structure as claimed in claim 37, wherein the carrier substrate having a first surface and a second surface, the electrical traces being formed on the first surface, the carrier substrate further comprising:
- two conductive pads formed on the second surface and respectively electrically connected to the first and second electrical traces.

41. The light emitting diode structure as claimed in claim 37 further comprises a second stud bump disposed on the top surface of the stack structure and electrically connected to the first stud bump.

42. The light emitting diode structure as claimed in claim 41, further comprises a lens structure covering the light emitting diode structure, wherein the material of lens structure is the same as that of the encapsulant.

43. A method for fabricating a light emitting diode structure, comprising:
- providing a light emitting diode chip, wherein the light emitting diode chip comprises a stack structure formed on a growth substrate, and a connecting layer formed on the stack structure;
- bonding the light emitting diode chip on a carrier substrate via the connecting layer;
- forming a surrounding layer to encircle the light emitting diode chip;
- removing the growth substrate; and
- removing the surrounding layer after the removing of the growth substrate.

44. The light emitting diode structure as claimed in claim 43, wherein the surrounding layer is made of photoresist, adhesion material, or a semi-fluid.

45. A method for fabricating a light emitting diode structure, comprising:
- providing a light emitting diode chip comprising a stack structure formed on a growth substrate
- bonding a light emitting diode chip on a carrier substrate;
- forming a layer to cover a top surface of the growth substrate;
- forming an encapsulant to encircle side walls of the stack structure and the growth substrate;
- removing the layer to form a cavity; and
- filling a wavelength conversion layer into the cavity.

* * * * *